United States Patent
Yamazaki et al.

(10) Patent No.: US 12,356,791 B2
(45) Date of Patent: Jul. 8, 2025

(54) LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Shunpei Yamazaki, Tokyo (JP); Takeyoshi Watabe, Kanagawa (JP); Tomohiro Kubota, Kanagawa (JP); Airi Ueda, Kanagawa (JP); Satoshi Seo, Kanagawa (JP); Nobuharu Ohsawa, Kanagawa (JP); Yuko Kubota, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 72 days.

(21) Appl. No.: 18/382,693

(22) Filed: Oct. 23, 2023

(65) Prior Publication Data
US 2024/0065014 A1 Feb. 22, 2024

Related U.S. Application Data

(63) Continuation of application No. 17/969,363, filed on Oct. 19, 2022, now Pat. No. 11,800,734, which is a
(Continued)

(30) Foreign Application Priority Data

Nov. 8, 2019 (JP) .................................. 2019-203031

(51) Int. Cl.
*H10K 50/115* (2023.01)
*H10K 50/16* (2023.01)
(Continued)

(52) U.S. Cl.
CPC ........... *H10K 50/115* (2023.02); *H10K 50/16* (2023.02); *H10K 50/17* (2023.02); *H10K 85/626* (2023.02)

(58) Field of Classification Search
None
See application file for complete search history.

(56) References Cited

U.S. PATENT DOCUMENTS 6,121,726 A    9/2000  Codama et al.
6,639,250 B1  10/2003  Shimoda et al.
(Continued)

FOREIGN PATENT DOCUMENTS

EP    2830112 A    1/2015
EP    3779529 A    2/2021
(Continued)

OTHER PUBLICATIONS

Lee.J et al., "Synergetic electrode architecture for efficient graphene-based flexible organic light-emitting diodes", Nature Communications, Jun. 2, 2016, vol. 7, pp. 11791-1-11791-9.

*Primary Examiner* — Anthony Ho
(74) *Attorney, Agent, or Firm* — Husch Blackwell LLP

(57) ABSTRACT

A light-emitting apparatus with low power consumption is provided. A light-emitting apparatus including a first light-emitting device and a first color conversion layer. The first light-emitting device includes an anode, a cathode, and an EL layer positioned between the anode and the cathode. The EL layer includes a layer including a material with a refractive index lower than or equal to 1.75 at 467 nm. The first color conversion layer includes a first substance capable of emission by absorbing light. Light emitted from the first light-emitting device enters the first color conversion layer.

20 Claims, 32 Drawing Sheets

Related U.S. Application Data continuation of application No. 17/091,206, filed on Nov. 6, 2020, now Pat. No. 11,482,687.

(51) Int. Cl.
*H10K 50/17* (2023.01)
*H10K 85/60* (2023.01)

(56) References Cited

U.S. PATENT DOCUMENTS

| | | |
|---|---|---|
| 6,739,931 B2 | 5/2004 | Yamazaki et al. |
| 6,762,553 B1 | 7/2004 | Yokogawa et al. |
| 6,995,511 B2 | 2/2006 | Yamazaki et al. |
| 7,057,339 B2 | 6/2006 | Boroson et al. |
| 7,399,991 B2 | 7/2008 | Seo et al. |
| 7,459,849 B2 | 12/2008 | Yamazaki et al. |
| 7,514,868 B2 | 4/2009 | Yamazaki et al. |
| 7,531,856 B2 | 5/2009 | Kobori |
| 7,564,182 B2 | 7/2009 | Boroson et al. |
| 7,612,500 B2 | 11/2009 | Sotoyama |
| 7,732,808 B2 | 6/2010 | Ikeda et al. |
| 7,745,989 B2 | 6/2010 | Yamazaki et al. |
| 7,919,783 B2 | 4/2011 | Ushikubo et al. |
| 7,956,349 B2 | 6/2011 | Tsutsui et al. |
| 8,044,588 B2 | 10/2011 | Yamazaki et al. |
| 8,076,671 B2 | 12/2011 | Yamazaki et al. |
| 8,178,217 B2 | 5/2012 | Nomura et al. |
| 8,420,227 B2 | 4/2013 | Iwaki et al. |
| 8,421,346 B2 | 4/2013 | Osaka et al. |
| 8,421,352 B2 | 4/2013 | Yamazaki et al. |
| 8,471,463 B2 | 6/2013 | Sumida et al. |
| 8,618,732 B2 | 12/2013 | Yamazaki et al. |
| 8,642,190 B2 | 2/2014 | Ogita et al. |
| 8,691,398 B2 | 4/2014 | Yamada et al. |
| 8,963,143 B2 | 2/2015 | Loebl et al. |
| 8,993,126 B2 | 3/2015 | Nowatari et al. |
| 9,006,755 B2 | 4/2015 | Seo et al. |
| 9,051,239 B2 | 6/2015 | Osaka et al. |
| 9,142,710 B2 | 9/2015 | Seo et al. |
| 9,178,158 B2 | 11/2015 | Kitano et al. |
| 9,263,503 B2 | 2/2016 | Yamazaki et al. |
| 9,269,920 B2 | 2/2016 | Yamazaki et al. |
| 9,362,517 B2 | 6/2016 | Ohsawa et al. |
| 9,368,742 B2 | 6/2016 | Kawata et al. |
| 9,385,328 B2 | 7/2016 | Ogita et al. |
| 9,412,962 B2 | 8/2016 | Hamada et al. |
| 9,419,239 B2 | 8/2016 | Seo et al. |
| 9,496,503 B2 | 11/2016 | Takeda et al. |
| 9,496,505 B2 | 11/2016 | Nowatari et al. |
| 9,515,279 B2 | 12/2016 | Ishisone et al. |
| 9,548,468 B2 | 1/2017 | Seo et al. |
| 9,559,324 B2 | 1/2017 | Seo et al. |
| 9,577,222 B2 | 2/2017 | Seo et al. |
| 9,577,224 B2 | 2/2017 | Lee et al. |
| 9,634,263 B2 | 4/2017 | Ogita et al. |
| 9,634,279 B2 | 4/2017 | Seo et al. |
| 9,653,517 B2 | 5/2017 | Uesaka et al. |
| 9,653,705 B2 | 5/2017 | Uesaka et al. |
| 9,666,645 B2 | 5/2017 | Yata et al. |
| 9,741,937 B2 | 8/2017 | Osaka et al. |
| 9,818,984 B2 | 11/2017 | Mizuno |
| 9,935,292 B2 | 4/2018 | Seo et al. |
| 10,510,806 B2 | 12/2019 | Yamaoka et al. |
| 10,556,864 B2 | 2/2020 | Nomura et al. |
| 11,063,225 B2 | 7/2021 | Watabe et al. |
| 2006/0240277 A1 | 10/2006 | Hatwar et al. |
| 2007/0103056 A1 | 5/2007 | Cok |
| 2007/0109571 A1 | 5/2007 | Kawamura |
| 2007/0138947 A1 | 6/2007 | Popovic et al. |
| 2007/0145350 A1 | 6/2007 | Kobori |
| 2007/0200492 A1 | 8/2007 | Cok et al. |
| 2007/0205423 A1 | 9/2007 | Yamazaki et al. |
| 2008/0129195 A1 | 6/2008 | Ishizaki et al. |
| 2008/0272690 A1 | 11/2008 | Kuma et al. |
| 2009/0091241 A1 | 4/2009 | Tsou et al. |
| 2009/0160323 A1 | 6/2009 | Nomura et al. |
| 2009/0167156 A1 | 7/2009 | Kawamura. et al. |
| 2010/0104969 A1 | 4/2010 | Mochizuki et al. |
| 2010/0171417 A1 | 7/2010 | Kitamura et al. |
| 2010/0292399 A1 | 11/2010 | Brown et al. |
| 2010/0301744 A1 | 12/2010 | Osaka et al. |
| 2012/0080667 A1 | 4/2012 | Nowatari et al. |
| 2012/0187394 A1 | 7/2012 | Hatano et al. |
| 2012/0205632 A1 | 8/2012 | Shitagaki et al. |
| 2012/0228648 A1 | 9/2012 | Mitsuya |
| 2012/0235197 A1 | 9/2012 | Okuyama |
| 2013/0146903 A1 | 6/2013 | Ichikawa et al. |
| 2013/0214249 A1 | 8/2013 | Pan et al. |
| 2014/0014960 A1 | 1/2014 | Yamazaki et al. |
| 2014/0034932 A1 | 2/2014 | Seo et al. |
| 2014/0084274 A1 | 3/2014 | Yamazaki et al. |
| 2014/0319492 A1 | 10/2014 | Seo et al. |
| 2015/0214281 A1 | 7/2015 | Hack et al. |
| 2015/0333283 A1 | 11/2015 | Ishisone et al. |
| 2015/0349285 A1 | 12/2015 | Seo et al. |
| 2016/0028022 A1 | 1/2016 | Seo et al. |
| 2016/0093678 A1 | 3/2016 | Seo et al. |
| 2016/0093823 A1 | 3/2016 | Seo et al. |
| 2016/0248031 A1 | 8/2016 | Seo |
| 2016/0268536 A1 | 9/2016 | Ohsawa et al. |
| 2016/0301011 A1 | 10/2016 | Nakaie et al. |
| 2016/0308156 A1 | 10/2016 | Kawata et al. |
| 2016/0343942 A1 | 11/2016 | Hamada et al. |
| 2016/0343949 A1 | 11/2016 | Seo et al. |
| 2016/0343954 A1 | 11/2016 | Seo et al. |
| 2016/0372688 A1 | 12/2016 | Seo et al. |
| 2017/0025615 A1 | 1/2017 | Seo et al. |
| 2017/0025630 A1 | 1/2017 | Seo et al. |
| 2017/0053970 A1 | 2/2017 | Ishisone et al. |
| 2017/0054088 A1 | 2/2017 | Nowatari et al. |
| 2017/0062749 A1 | 3/2017 | Seo et al. |
| 2017/0092889 A1 | 3/2017 | Seo et al. |
| 2017/0117497 A1 | 4/2017 | Seo et al. |
| 2017/0141339 A1 | 5/2017 | Seo et al. |
| 2017/0213991 A1 | 7/2017 | Uesaka et al. |
| 2017/0330919 A1 | 11/2017 | Lee et al. |
| 2017/0365782 A1 | 12/2017 | Osaka et al. |
| 2018/0009751 A1 | 1/2018 | Nomura et al. |
| 2018/0108858 A1 | 4/2018 | Ito |
| 2019/0027689 A1 | 1/2019 | Funyuu et al. |
| 2020/0176692 A1 | 6/2020 | Watabe et al. |
| 2021/0005818 A1 | 1/2021 | Kawahara et al. |

FOREIGN PATENT DOCUMENTS

| | | |
|---|---|---|
| JP | 2007-141736 A | 6/2007 |
| JP | 2008-034701 A | 2/2008 |
| JP | 5268247 | 8/2013 |
| JP | 2013-179248 A | 9/2013 |
| JP | 2014-502041 | 1/2014 |
| JP | 2014-032851 A | 2/2014 |
| JP | 2014-207356 A | 10/2014 |
| JP | 2015-514293 | 5/2015 |
| JP | 2016-091953 A | 5/2016 |
| JP | 2018-092932 A | 6/2018 |
| JP | 2018-107451 A | 7/2018 |
| WO | WO-2007/072952 | 6/2007 |
| WO | WO-2012/063171 | 5/2012 |
| WO | WO-2018/100476 | 6/2018 |
| WO | WO-2018/122677 | 7/2018 |
| WO | WO-2019/188019 | 10/2019 |

LIGHT-EMITTING DEVICE, ELECTRONIC DEVICE, AND LIGHTING DEVICE

This application is a continuation of copending U.S. application Ser. No. 17/969,363, filed on Oct. 19, 2022 which is a continuation of U.S. application Ser. No. 17/091,206, filed on Nov. 6, 2020 (now U.S. Pat. No. 11,482,687 issued Oct. 25, 2022), which are all incorporated herein by reference.

BACKGROUND OF THE INVENTION

1. Field of the Invention

Embodiments of the present invention relate to an organic compound, a light-emitting element, a light-emitting device, a display module, a lighting module, a display device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

2. Description of the Related Art

Light-emitting devices (organic EL devices) including organic compounds and utilizing electroluminescence (EL) have been put to more practical use. In the basic structure of such light-emitting devices, an organic compound layer including a light-emitting material (an EL layer) is interposed between a pair of electrodes. Carriers are injected by application of voltage to the device, and recombination energy of the carriers is used, whereby light emission can be obtained from the light-emitting material.

Such light-emitting devices are of self-light-emitting type and thus have advantages over liquid crystal displays, such as high visibility and no need for backlight when used as pixels of a display, and are suitable as flat panel display devices. Displays including such light-emitting devices are also highly advantageous in that they can be thin and lightweight. Moreover, such light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps, thus, the light-emitting devices also have great potential as planar light sources, which can be applied to lighting devices and the like.

Displays or lighting devices including light-emitting devices are suitably used for a variety of electronic devices as described above, and research and development of light-emitting devices have progressed for more favorable characteristics.

Low outcoupling efficiency is often a problem in an organic EL device. In particular, the attenuation due to reflection which is caused by a difference in refractive index between adjacent layers is a main cause of a reduction in device efficiency. In order to reduce this effect, a structure including a layer formed using a low refractive index material in an EL layer (see Patent Document 1 and Non-Patent Document 1, for example) has been proposed.

A light-emitting device having this structure can have higher outcoupling efficiency and higher external quantum efficiency than a light-emitting device having a conventional structure, however, it is not easy to form such a layer with a low refractive index in an EL layer without adversely affecting other critical characteristics of the light-emitting device. This is because a low refractive index is in a trade-off relationship with a high carrier-transport property or high reliability of a light-emitting device including a layer with a low refractive index. This problem is caused because the carrier-transport property and reliability of an organic compound largely depend on an unsaturated bond, and an organic compound having many unsaturated bonds tends to have a high refractive index.

A color conversion method has been employed for practical use of displays. A color conversion method is a method in which a photoluminescent substance is irradiated with light from light-emitting devices to convert the light into light of desired colors. Depending on the photoluminescence efficiency, the energy loss and the power consumption of displays using a color conversion method are likely to be lower than those of displays using a color filter method in which light from light-emitting devices is simply reduced.

REFERENCES

Patent Document 1

Japanese Published Patent Application No. 2014-207356

Non-Patent Document 1

Jaeho Lee et al., "Synergetic electrode architecture for efficient graphene-based flexible organic light-emitting diodes", nature COMMUNICATIONS, Jun. 2, 2016, DOI: 10.1038/ncomms11791.

SUMMARY OF THE INVENTION

An object of one embodiment of the present invention is to provide a novel light-emitting apparatus. Another object of one embodiment of the present invention is to provide a light-emitting apparatus with high emission efficiency. Another object of one embodiment of the present invention is to provide a light-emitting apparatus having a long lifetime. Another object of one embodiment of the present invention is to provide a light-emitting apparatus having low driving voltage.

Another object of one embodiment of the present invention is to provide an electronic device or a display device having high reliability. Another object of one embodiment of the present invention is to provide an electronic device or a display device with low power consumption.

It is only necessary that at least one of the above-described objects be achieved in the present invention.

One embodiment of the present invention is a light-emitting apparatus including a first light-emitting device and a first color conversion layer. The first light-emitting device includes an anode, a cathode, and an EL layer positioned between the anode and the cathode. The EL layer includes a layer including a material with a refractive index lower than or equal to 1.75 for 467-nm wavelength light. The first color conversion layer includes a first substance that absorbs light and emits light. Light emitted from the first light-emitting device enters the first color conversion layer.

Another embodiment of the present invention is a light-emitting apparatus including a first light-emitting device and a first color conversion layer. The first light-emitting device includes an anode, a cathode, and an EL layer positioned between the anode and the cathode. The EL layer includes a layer with a refractive index lower than or equal to 1.75 for 467-nm wavelength light. The first color conversion layer includes a first substance that absorbs light and emits light. Light emitted from the first light-emitting device enters the first color conversion layer.

Another embodiment of the present invention is a light-emitting apparatus including a first light-emitting device, and a first color conversion layer. The first light-emitting device includes an anode, a cathode, and an EL layer positioned between the anode and the cathode. The EL layer includes a light-emitting layer and a hole-injection layer. The hole-injection layer is in contact with the anode. The hole-injection layer includes an organic compound with a refractive index lower than or equal to 1.75 for 467-nm wavelength light. The first color conversion layer includes a first substance that absorbs light and emits light. Light emitted from the first light-emitting device enters the first color conversion layer.

Another embodiment of the present invention is a light-emitting apparatus with the above structure, in which the organic compound with a refractive index lower than or equal to 1.75 for 467-nm wavelength light is a monoamine compound including a first aromatic ring, a second aromatic ring, and a third aromatic ring. The first aromatic ring, the second aromatic ring, and the third aromatic ring are bonded to a nitrogen atom of the monoamine compound. Carbon atoms forming a bond by sp³ hybrid orbitals account for higher than or equal to 23% and lower than or equal to 55% of total carbon atoms in a molecule.

Another embodiment of the present invention is a light-emitting apparatus with the above structure, in which the organic compound with a refractive index lower than or equal to 1.75 for 467-nm wavelength light is an organic compound represented by General Formula (G1)

[Chemical Formula 1]

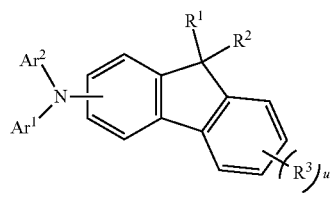

(G1)

Note that in the general formula (G1), $Ar^1$ and $Ar^2$ each independently represent a substituent with a benzene ring or a substituent in which two or three benzene rings are bonded to each other. One or both of $Ar^1$ and $Ar^2$ have one or more hydrocarbon groups each having 1 to 12 carbon atoms each forming a bond only by sp³ hybrid orbitals. The total number of the carbon atoms included in the hydrocarbon group(s) bonded to $Ar^1$ and $Ar^2$ is greater than or equal to 8, and the total number of the carbon atoms included in the hydrocarbon group(s) bonded to at least one of $Ar^1$ and $Ar^2$ is greater than or equal to 6. In the case where a plurality of straight-chain alkyl groups each having one or two carbon atoms are bonded to $Ar^1$ or $Ar^2$ as the hydrocarbon groups, the alkyl groups may be bonded to each other to form a ring. In the general formula (G1), $R^1$ and $R^2$ each independently represent an alkyl group having 1 to 4 carbon atoms. $R^1$ and $R^2$ may be bonded to each other to form a ring. $R^3$ represents an alkyl group having 1 to 4 carbon atoms, and u is an integer greater than or equal to 0 and less than or equal to 4.

Another embodiment of the present invention is a light-emitting apparatus including a first light-emitting device, and a first color conversion layer. The first light-emitting device includes an anode, a cathode, and an EL layer positioned between the anode and the cathode. The EL layer includes a light-emitting layer and an electron-transport layer. The electron-transport layer is between the light-emitting layer and the cathode. The electron-transport layer includes a material with a refractive index lower than or equal to 1.75 for 467-nm wavelength light. The first color conversion layer includes a first substance that absorbs light and emits light. Light emitted from the first light-emitting device enters the first color conversion layer.

Another embodiment of the present invention is a light-emitting apparatus with the above structure, in which the material with a refractive index lower than or equal to 1.75 is a mixed material of an organic compound having an electron-transport property and an inorganic compound. The inorganic compound is a fluoride of an alkali metal or a fluoride of an alkaline earth metal.

Another embodiment of the present invention is a light-emitting apparatus with the above structure, in which the inorganic compound is an alkali metal and the concentration of the inorganic compound in the electron-transport layer is higher than or equal to 50 vol %.

Another embodiment of the present invention is a light-emitting apparatus with the above structure, in which the inorganic compound is an alkali metal and the concentration of the inorganic compound in the electron-transport layer is higher than or equal to 50 vol % and lower than 95 vol %.

Another embodiment of the present invention is a light-emitting apparatus with the above structure, in which the concentration of the inorganic compound in the electron-transport layer is higher than or equal to 20 vol %.

Another embodiment of the present invention is a light-emitting apparatus with the above structure, including a first light-emitting device, and a first color conversion layer. The first light-emitting device includes an anode, a cathode, and an EL layer positioned between the anode and the cathode. The EL layer includes a hole-injection layer, a light-emitting layer, and an electron-transport layer. The hole-injection layer is between the anode and the light-emitting layer. The electron-transport layer is between the light-emitting layer and the cathode. The hole-injection layer includes an organic compound with a refractive index lower than or equal to 1.75 for 467-nm wavelength light. The electron-transport layer includes a material with a refractive index lower than or equal to 1.75 for 467-nm wavelength light. The first color conversion layer includes a first substance that absorbs light and emits light. Light emitted from the first light-emitting device enters the first color conversion layer.

Another embodiment of the present invention is a light-emitting apparatus with the above structure, in which a peak wavelength of an emission spectrum of the first light-emitting device is higher than or equal to 440 nm and lower than or equal to 520 nm.

Another embodiment of the present invention is a light-emitting apparatus including a first light-emitting device, and a first color conversion layer. The first light-emitting device includes an anode, a cathode, and an EL layer positioned between the anode and the cathode. The EL layer includes a hole-injection layer, a light-emitting layer, and an electron-transport layer. The hole-injection layer is between the anode and the light-emitting layer. The electron-transport layer is between the light-emitting layer and the cathode. The hole-injection layer includes an organic compound with a refractive index lower than or equal to 1.75 for 467-nm wavelength light. The electron-transport layer includes a material with a refractive index lower than or equal to 1.75 for 467-nm wavelength light. The first color conversion layer includes a first substance that absorbs light and emits light. Light emitted from the first light-emitting device enters the first color conversion layer.

Another embodiment of the present invention is a light-emitting apparatus with the above structure, in which the first substance is a quantum dot.

Another embodiment of the present invention is a light-emitting apparatus with any of the above structures, in which the first light-emitting device has a microcavity structure.

Another embodiment of the present invention is a light-emitting apparatus with the above structure, further including a second light-emitting device, a third light-emitting device, and a second color conversion layer. The second light-emitting device and the third light-emitting device each include the same structure as the first light-emitting device. The second color conversion layer includes a second substance that absorbs light and emits light. A peak wavelength of an emission spectrum of the second substance is different from a peak wavelength of an emission spectrum of the first substance. Light emitted from the second light-emitting device enters the second color conversion layer.

Another embodiment of the present invention is a light-emitting apparatus with the above structure, in which the second substance is a quantum dot.

Another embodiment of the present invention is a light-emitting apparatus with the above structure, in which the peak wavelength of the emission spectrum of the first substance is higher than or equal to 500 nm and lower than or equal to 600 nm. The peak wavelength of the emission spectrum of the second substance is higher than or equal to 600 nm and lower than or equal to 750 nm.

Another embodiment of the present invention is a light-emitting apparatus with the above structure, further including a fourth light-emitting device, and a third color conversion layer. The fourth light-emitting device has the same structure as the first light-emitting device. The third color conversion layer includes a third substance that absorbs light and emits light. A peak wavelength of an emission spectrum of the third substance is higher than or equal to 560 nm and lower than or equal to 610 nm. Light emitted from the fourth light-emitting device enters the third color conversion layer.

Another embodiment of the present invention is a light-emitting apparatus with the above structure, in which the third substance includes a rare earth element.

Another embodiment of the present invention is a light-emitting apparatus with the above structure, in which the rare earth element is at least one of europium, cerium, and yttrium.

Another embodiment of the present invention is a light-emitting apparatus with the above structure, in which the third substance is a quantum dot.

Another embodiment of the present invention is a light-emitting apparatus with the above structure, in which an emission spectrum of the third color conversion layer includes two peaks.

Another embodiment of the present invention is a light-emitting apparatus with the above structure, in which light emitted from the third color conversion layer is white light.

Another embodiment of the present invention is a light-emitting apparatus with the above structure, in which each of the light-emitting devices includes a plurality of light-emitting layers.

Another embodiment of the present invention is a light-emitting apparatus with the above structure, further including a charge-generation layer between the plurality of light-emitting layers.

Another embodiment of the present invention is a light-emitting apparatus with the above structure, in which the first light-emitting device exhibits blue light emission.

Another embodiment of the present invention is a light-emitting apparatus with the above structure, further including a color filter. The first color conversion layer is between the first light-emitting device and the color filter.

Another embodiment of the present invention is an electronic device including any of the above light-emitting devices, and at least one of a sensor, an operation button, a speaker, and a microphone.

Another embodiment of the present invention is a light-emitting apparatus including any of the above light-emitting devices, and at least one of a transistor and a substrate.

Another embodiment of the present invention is a lighting device including any of the above light-emitting devices and a housing.

Note that the light-emitting apparatus in this specification includes, in its category, an image display device that uses a light-emitting device. The light-emitting apparatus may include a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

One embodiment of the present invention can provide a novel light-emitting apparatus. Another embodiment of the present invention can provide a light-emitting apparatus with high emission efficiency. Another embodiment of the present invention can provide a light-emitting apparatus having a long lifetime. Another embodiment of the present invention can provide a light-emitting apparatus with low driving voltage.

Another embodiment of the present invention can provide an electronic device or a display device each having high reliability. Another embodiment of the present invention can provide an electronic device or a display device each with low power consumption.

Note that the descriptions of these effects do not preclude the existence of other effects. One embodiment of the present invention does not necessarily achieve all the effects listed above. Other effects will be apparent from and can be derived from the descriptions of the specification, the drawings, the claims, and the like.

BRIEF DESCRIPTION OF THE DRAWINGS

FIGS. 10A, 10B1, 10B2, and 10C illustrate electronic devices.

DETAILED DESCRIPTION OF THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

In recent years, color conversion technology using quantum dots (QDs) has been put into practical use in a field of liquid crystal displays and the like. A QD is a semiconductor nanocrystal with a size of several nanometers and contains approximately $1 \times 10^3$ to $1 \times 10^6$ atoms. A QD confines an electron, a hole, or an exciton, which results in discrete energy states and an energy shift depending on the size of a QD. This means that quantum dots made of the same substance emit light with different emission wavelengths depending on their sizes; thus, emission wavelengths can be easily adjusted by changing the sizes of QDs.

A QD has an emission spectrum with a narrow peak width because its discreteness limits the phase relaxation, leading to light emission with high color purity. Thus, use of QDs in a color conversion layer can provide light emission with high color purity and also can provide light emission that covers Rec.2020, which is the color gamut defined by the BT.2020 standard or the BT.2100 standard.

The color conversion layer using a QD converts light emitted from a light-emitting device to light with a longer wavelength through photoluminescence in which light emitted from the light-emitting device is absorbed and then re-emitted, like the color conversion layer using an organic compound as a light-emitting substance. Therefore, when a color conversion layer is used for a display, a structure is employed in which blue light, the wavelength of which is the shortest among the three primary colors needed for a full-color display, is obtained from a light-emitting device first, and then green light and red light are obtained by color conversion.

That is, in a display employing a color conversion method, the characteristics of the blue light-emitting devices are dominant in the device characteristics; as a result, blue light-emitting devices with better characteristics are required.

Figure 1A:
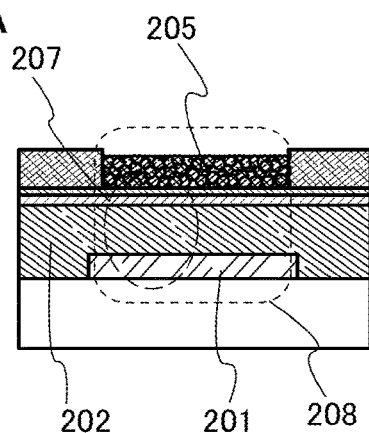
FIGS. 1A to 1C are conceptual diagrams of light-emitting apparatuses.

A light-emitting apparatus of one embodiment of the present invention includes a pixel 208 including a light-emitting device 207 and a color conversion layer 205, as illustrated in FIG. 1A. Light emitted from the light-emitting device 207 enters the color conversion layer 205. The light-emitting device 207 includes an EL layer 202 between a first electrode 201 and a second electrode 203. The color conversion layer 205 preferably contains a quantum dot, and has functions of absorbing incident light and emitting light with a predetermined wavelength. In the case where the color conversion layer 205 contains a quantum dot, light emission with high color purity and an emission spectrum having a narrow peak width can be obtained.

The color conversion layer 205 includes a substance having functions of absorbing incident light and emitting light with a desired wavelength. As the substance having a function of emitting light with a desired wavelength, various light-emitting substances, such as an inorganic or organic material which emits photoluminescence, can be used. In particular, a quantum dot (QD) which is an inorganic material can produce highly pure light emission having an emission spectrum with a narrow peak width, as described above. The use of a QD is preferred also because it is an inorganic substance and has high inherent stability and the theoretical internal quantum efficiency is approximately 100%, for example.

The color conversion layer 205 containing quantum dots can be formed in such a manner that a solvent in which quantum dots are dispersed is applied and drying and baking are performed. In addition, a sheet in which quantum dots are dispersed in advance has also been developed. Separate coloring is performed by a droplet discharge method such as ink-jet, a printing method, or etching using photolithography or the like after application on a formation surface and solidification (e.g., drying, baking, or fixation), for example.

Examples of the quantum dot include nano-sized particles of a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, semiconductor clusters, metal halide perovskites, and the like.

Specific examples include, but are not limited to, cadmium selenide (CdSe), cadmium sulfide (CdS), cadmium telluride (CdTe), zinc selenide (ZnSe), zinc oxide (ZnO), zinc sulfide (ZnS), zinc telluride (ZnTe), mercury sulfide (HgS), mercury selenide (HgSe), mercury telluride (HgTe), indium arsenide (InAs), indium phosphide (InP), gallium arsenide (GaAs), gallium phosphide (GaP), indium nitride (InN), gallium nitride (GaN), indium antimonide (InSb), gallium antimonide (GaSb), aluminum phosphide (AlP), aluminum arsenide (AlAs), aluminum antimonide (AlSb), lead(II) selenide (PbSe), lead(II) telluride (PbTe), lead(II) sulfide (PbS), indium selenide ($In_2Se_3$), indium telluride ($In_2Te_3$), indium sulfide ($In_2S_3$), gallium selenide ($Ga_2Se_3$), arsenic(III) sulfide ($As_2S_3$), arsenic(III) selenide ($As_2Se_3$), arsenic(III) telluride ($As_2Te_3$), antimony(III) sulfide ($Sb_2S_3$), antimony(III) selenide ($Sb_2Se_3$), antimony(III) telluride ($Sb_2Te_3$), bismuth(III) sulfide ($Bi_2S_3$), bismuth(III) selenide ($Bi_2Se_3$), bismuth(III) telluride ($Bi_2Te_3$), silicon (Si), silicon carbide (SiC), germanium (Ge), tin (Sn), selenium (Se), tellurium (Te), boronB, carbonC, phosphorus (P), boron nitride (BN), boron phosphide (BP), boron arsenide (BAs), aluminum nitride (AlN), aluminum sulfide ($Al_2S_3$), barium sulfide (BaS), barium selenide (BaSe), barium telluride (BaTe), calcium sulfide (CaS), calcium selenide (CaSe), calcium telluride (CaTe), beryllium sulfide (BeS), beryllium selenide (BeSe), beryllium telluride (BeTe), magnesium sulfide (MgS), magnesium selenide (MgSe), germanium sulfide (GeS), germanium selenide (GeSe), germanium telluride (GeTe), tin(IV) sulfide ($SnS_2$), tin(II) sulfide (SnS), tin(II) selenide (SnSe), tin(II) telluride (SnTe), lead (II) oxide (PbO), copper(I) fluoride (CuF), copper(I) chloride (CuCl), copper(I) bromide (CuBr), copper(I) iodide (CuI), copper(I) oxide ($Cu_2O$), copper(I) selenide ($Cu_2Se$), nickel(II) oxide (NiO), cobalt(II) oxide (CoO), cobalt(II) sulfide (CoS), triiron tetraoxide ($Fe_3O_4$), iron(II) sulfide (FeS), manganese(II) oxide (MnO), molybdenum(IV) sulfide ($MoS_2$), vanadium(II) oxide (VO), vanadium(IV) oxide ($VO_2$), tungsten(IV) oxide ($WO_2$), tantalum(V) oxide ($Ta_2O_5$), titanium oxide (e.g., $TiO_2$, $Ti_2O_5$, $Ti_2O_3$, and $Ti_5O_9$), zirconium oxide ($ZrO_2$), silicon nitride ($Si_3N_4$), germanium nitride ($Ge_3N_4$), aluminum oxide ($Al_2O_3$), barium titanate ($BaTiO_3$), a compound of selenium, zinc, and cadmium (CdZnSe), a compound of indium, arsenic, phosphorus (InAsP), a compound of cadmium, selenium, and sulfur (CdSeS), a compound of cadmium, selenium, and tellurium (CdSeTe), a compound of indium, gallium, and arsenic (InGaAs), a compound of indium, gallium, and selenium (InGaSe), a compound of indium, selenium, and sulfur (InSeS), a compound of copper, indium, and sulfur (e.g., $CuInS_2$), and combinations thereof. What is called an alloyed quantum dot, whose composition is represented by a given ratio, may be used. For example, an alloyed quantum dot represented by $CdS_xSe_{(1-x)}$ (x is a given number between 0 and 1 inclusive) is an effective means for obtaining blue light emission because the emission wavelength can be changed by changing x.

As the quantum dot, a core-type QD, a core-shell QD, a core-multishell QD, or the like may be used. When a core is covered with a shell formed of another inorganic material having a wider band gap, the influence of a defect or a dangling bond existing at the surface of a nanocrystal can be reduced. Since such a structure can significantly improve the quantum efficiency of light emission, it is preferable to use a core-shell or core-multishell QD quantum dot Examples of the material of a shell include zinc sulfide (ZnS) and zinc oxide (ZnO).

Quantum dots have a high proportion of surface atoms and thus have high reactivity and easily cohere together. For this reason, it is preferable that a protective agent be attached to or a protective group be provided on the surfaces of the quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

In the case where the substance contained in the color conversion layer 205 is a QD, the QD has a continuous absorption spectrum, in which absorption intensity becomes higher as the wavelength of light becomes shorter, from the vicinity of the emission wavelength of the QD toward the shorter wavelength side. Therefore, in the case of a display that needs a plurality of light emission colors, light-emitting devices in pixels of the respective colors may contain the same substance as an emission center substance, in which case separate formation of light-emitting devices for the pixels of the respective colors as illustrated in FIG. 1B is not necessary; thus, the light-emitting apparatus can be manufactured at relatively low cost.

Figure 1B:
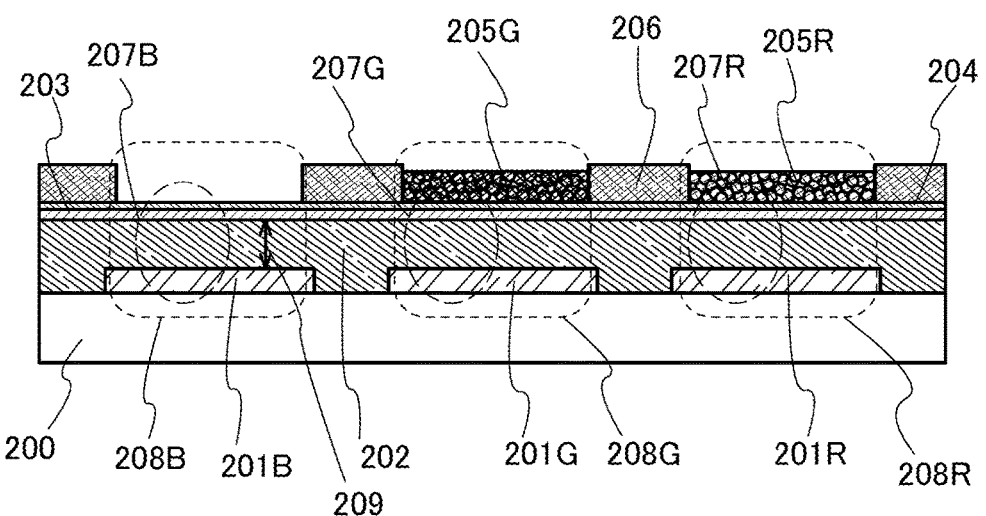

FIG. 1B illustrates, as an example, three pixels, a pixel emitting blue light, a pixel emitting green light, and a pixel emitting red light. A first pixel 208B emits blue light. The first pixel 208B includes a first electrode 201B and the second electrode 203, and one of them is an anode and the other is a cathode. Furthermore, one of them may be a reflective electrode and the other may be a transflective electrode. Similarly, a second pixel 208G that emits green light and a third pixel 208R that emits red light are illustrated. The second pixel 208G includes a first electrode 201G and the second electrode 203. The third pixel 208R includes a first electrode 201R and the second electrode 203. In FIG. 1B, the first electrodes 201B, 201G, and 201R are reflective electrodes and serve as anodes, and the second electrode 203 is a transflective electrode. The first electrodes 201B, 201G, and 201R are formed over an insulator 200. A black matrix 206 is preferably provided between adjacent pixels to prevent mixing of light. The black matrix 206 may also serve as a bank for forming a color conversion layer by an ink-jet method or the like.

Figure 1C:
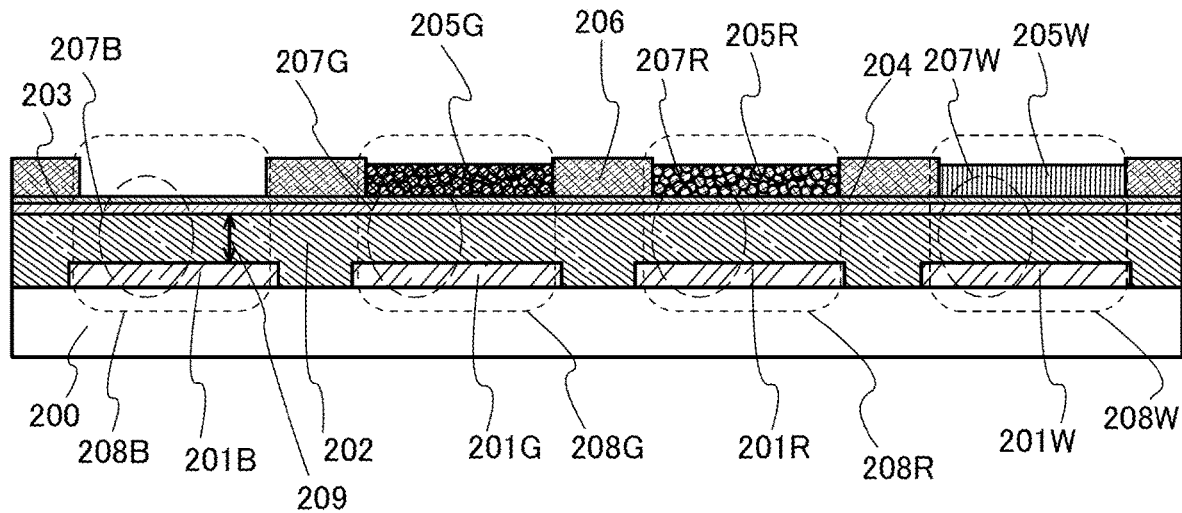

FIG. 1C illustrates four pixels, a pixel emitting blue light, a pixel emitting green light, a pixel emitting red light, and a pixel emitting white light. A fourth pixel 208W emits white light. The fourth pixel 208W includes a first electrode 201W and the second electrode 203, and one of them is an anode and the other is a cathode. Furthermore, one of them may be a reflective electrode and the other may be a transflective electrode. The first electrode 201W is formed over the insulator 200. The black matrix 206 is preferably provided between adjacent pixels to prevent mixing of light. The black matrix 206 may also serve as a bank for forming a color conversion layer by an ink-jet method or the like.

In the first pixel 208B, the second pixel 208G, the third pixel 208R, and the fourth pixel 208W, the EL layer 202 is interposed between the second electrode 203 and the first electrodes 201B, 201G, 201R, and 201W. The EL layer 202 may be either one or separated in the first pixel 208B, the second pixel 208G, the third pixel 208R, and the fourth pixel 208W; however, a structure in which one EL layer 202 is used in common between a plurality of pixels can be manufactured more easily and is advantageous in cost. Although the EL layer 202 generally consists of a plurality of layers having different functions, some of them may be used in common and the others of them may be independent between a plurality of pixels.

The first pixel 208B, the second pixel 208G, the third pixel 208R, and the fourth pixel 208W include a first light-emitting device 207B, a second light-emitting device 207G, a third light-emitting device 207R, and a fourth light-emitting device 207W, respectively. Each of the light-emitting devices includes the first electrode, the second electrode, and the EL layer. Note that FIGS. 1B and 1C illustrate the structure in which the first pixel 208B, the second pixel 208G, the third pixel 208R, and the fourth pixel 208W include the EL layer 202 in common.

The first light-emitting device 207B, the second light-emitting device 207G, the third light-emitting device 207R, and the fourth light-emitting device 207W can have a microcavity structure in which one of the first electrode and the second electrode is a reflective electrode and the other is a transflective electrode. A wavelength which can be resonated is determined by an optical path length 209 between a surface of the reflective electrode and a surface of the transflective electrode. When the wavelength which is desired to be resonated is set to $\lambda$ and the optical path length 209 is set to the integral multiple of $\lambda/2$, light with the wavelength $\lambda$ can be amplified. The optical path length 209 can be adjusted by a hole-injection layer or a hole-transport layer which is included in the EL layer, a transparent electrode layer which is formed over the reflective electrode as part of the electrode, or the like. The light-emitting apparatus illustrated in FIGS. 1B and 1C can be formed easily because the EL layer is used in common between the first light-emitting device 207B, the second light-emitting device 207G, the third light-emitting device 207R, and the fourth light-emitting device 207W, and the emission center substance is also the same, so that the optical path length 209 of the light-emitting device is the same between the first pixel 208B, the second pixel 208G, the third pixel 208R, and the fourth pixel 208W. Note that in the case where the EL layers 202 are separately formed for the respective pixels, the optical path length 209 is set in accordance with light from the EL layer.

A protection layer 204 is provided over the second electrode 203. The protection layer 204 may be provided so as to protect the first light-emitting device 207B, the second light-emitting device 207G, the third light-emitting device 207R, and the fourth light-emitting device 207W from substances or environments which bring about adverse effects. For the protection layer 204, an oxide, a nitride, a fluoride, a sulfide, a ternary compound, a metal, a polymer, or the like can be used. For example, a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like; a material containing aluminum nitride, hafnium nitride, silicon nitride, tantalum nitride, titanium nitride, niobium nitride, molybdenum nitride, zirconium nitride, gallium nitride, or the like; or a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be used.

The color conversion layer and the light-emitting devices are bonded with a resin having an appropriate refractive index, whereby a larger amount of light emitted from the light-emitting layers can reach the color conversion layer. This enhances light emission of the color conversion layer, so that the light-emitting apparatus can have high efficiency. The resin having an appropriate refractive index may also serve as the protective layer 204 or may be provided between the protective layer 204 and the color conversion layer. Note that the refractive index of the resin is preferably 1.4 to 2.0, more preferably 1.7 to 1.9. A layer having a high refractive index between the transparent electrode and the color conversion layer can reduce loss of light due to a thin film mode, so that the light-emitting apparatus can have higher efficiency.

The first pixel 208B emits light without through a color conversion layer, and thus is preferably a pixel that emits blue light, which has the highest energy among three primary colors of light. For the same reason, in the case where the first light-emitting device 207B, the second light-emitting device 207G, the third light-emitting device 207R, and the fourth light-emitting device 207W emit light of the same color, the emission color is preferably blue. In that case, use of the same substance as the emission center substances included in the light-emitting devices is advantageous in cost; however, different emission center substances may be used.

In the case where the light-emitting devices are not separately formed for the respective colors of pixels, light emission of the emission center substance included in the light-emitting devices is preferably blue light emission (with a peak wavelength of the emission spectrum of approximately 440 nm to 520 nm, more preferably approximately 420 nm to 480 nm). The peak wavelength of the emission spectrum of the emission center substance is calculated from a PL spectrum in a solution state. Since the relative dielectric constant of the organic compound included in the EL layer of the light-emitting device is approximately 3, in order to prevent inconsistency with the emission spectrum of the light-emitting device, the relative dielectric constant of the solvent for the emission center substance is preferably greater than or equal to 1 and less than or equal to 10, more preferably greater than or equal to 2 and less than or equal to 5 at room temperature. Specific examples include hexane, benzene, toluene, diethyl ether, ethyl acetate, chloroform, chlorobenzene, and dichloromethane. It is more preferable that the solvent have a relative dielectric constant greater than or equal to 2 and less than or equal to 5 at room temperature, have high solubility, and be versatile. For example, the solvent is preferably toluene or chloroform.

A color conversion layer 205G includes a substance that emits light by absorbing light from the second light-emitting device 207G. Light emitted from the second light-emitting device 207G enters the color conversion layer 205G and is converted to green light with a longer wavelength (with a peak wavelength of the emission spectrum of approximately 500 nm to 600 nm, preferably approximately 500 nm to 560 nm) to exist. Similarly, a color conversion layer 205R includes a substance that emits light by absorbing light from the light-emitting device 207R. Light emitted from the light-emitting device 207R enters the color conversion layer 205R and is converted to red light with a longer wavelength (with a peak wavelength of the emission spectrum of approximately 600 nm to 750 nm, preferably approximately 610 nm to 700 nm) to exist. The color conversion layer 205G and the color conversion layer 205R preferably include a substance which performs color conversion, such as a QD, at a concentration such that light from the light-emitting devices can be sufficiently absorbed and transmission of the light can be avoided as much as possible.

Similarly, a color conversion layer 205W includes a substance that emits light by absorbing light from the fourth light-emitting device 207W. Light emitted from the light-emitting device 207W enters the color conversion layer 205W and is converted to yellow light with a longer wavelength (with a peak wavelength of the emission spectrum of approximately 560 nm to 610 nm, preferably 580 nm to 595 nm) to exist. The color conversion layer 205W includes at least one or more rare earth elements such as europium, cerium, and yttrium, and is capable of converting blue light emission into yellow light emission efficiently. The color conversion layer 205W includes a substance which performs color conversion such that light from the light-emitting devices is adequately transmitted. Light converted in the color conversion layer 205W and light from the light-emitting devices that is transmitted through the color conversion layer 205W are mixed to produce white light emission.

Note that these pixels may each further include a color filter.

In the light-emitting apparatus having the above-described structure, part of light does not reach the color conversion layers because of optical losses due to absorption by the electrode or the like, an evanescent mode, and optical confinement caused by the difference in refractive index between the resin and each light-emitting device that are bonded to each other. Therefore, reducing such losses is required.

Figure 2A:
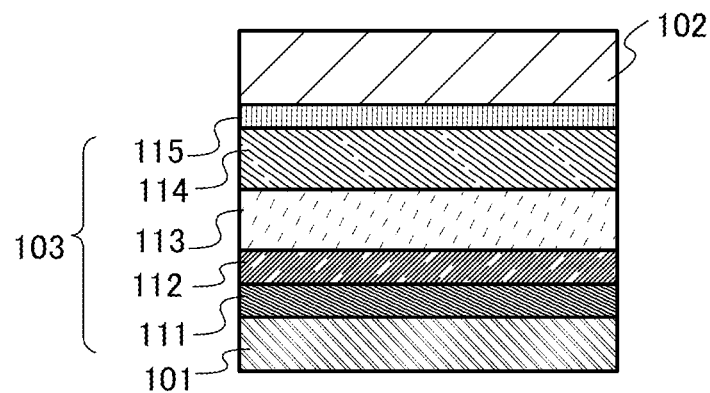
FIGS. 2A to 2C are schematic views of light-emitting devices.
Figure 2B:
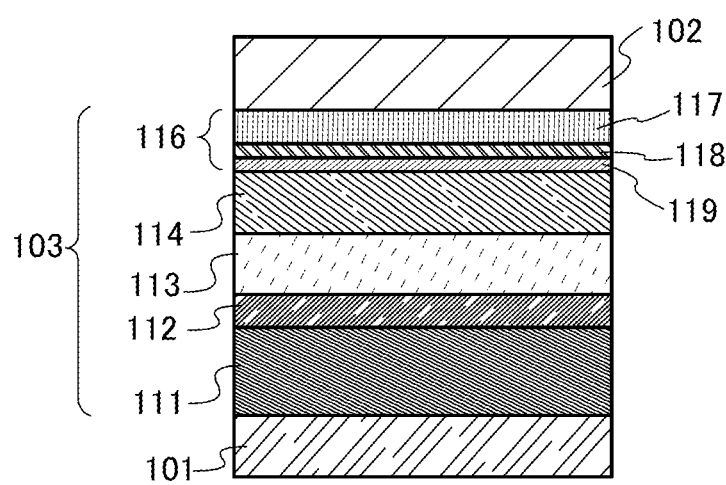
Figure 2C:
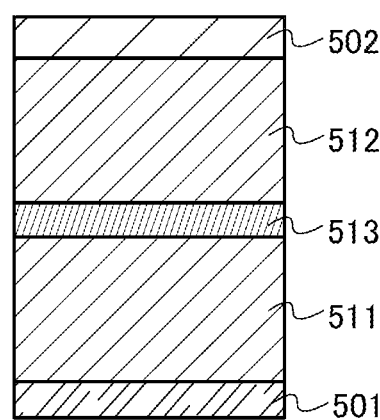

In view of the above, the light-emitting device 207 is a light-emitting device having the structure illustrated in FIGS. 2A to 2C. The light-emitting device used in the light-emitting apparatus of one embodiment of the present invention is described below.

The light-emitting device illustrated in FIG. 2A includes a first electrode 101, a second electrode 102, and an EL layer 103. The EL layer 103 at least includes a layer including a material with a low refractive index. The material of the layer has a refractive index of 1.75 or lower for blue light emission exhibited by the emission center substance (with a peak wavelength of the emission spectrum of approximately 440 nm to 520 nm, preferably approximately 420 nm to 480 nm), for example, for 467-nm wavelength light.

The EL layer 103 includes a light-emitting layer 113 and may also include a hole-injection layer 111 and/or a hole-transport layer 112, an electron-transport layer 114 and/or an electron-injection layer 115, and other various functional layers. The light-emitting layer 113 includes a light-emitting material, and the light-emitting device 207 exhibits light emission from the light-emitting material. The light-emitting layer 113 may include a host material and other materials. A layer including a material with a refractive index of 1.75 or lower for 467-nm wavelength light, which may be any layer other than the light-emitting layer 113, is preferably any one or more of the hole-injection layer 111, the hole-transport layer 112, and the electron-transport layer 114. A layer with a low refractive index included in the EL layer increases light extraction efficiency by inhibiting the evanescent mode and the thin film mode which causes light quenching as an optical loss inside the device. This improves the external quantum efficiency of the light-emitting device. Note that the layer with a low refractive index is preferably provided closer to the electrode through which light is extracted than to the light-emitting layer.

Next, examples of structures and materials of the aforementioned light-emitting device will be described in detail. As described above, the light-emitting device of one embodiment of the present invention includes the EL layer 103 between the pair of electrodes, the first electrode 101 and the second electrode 102, and the EL layer 103 includes a plurality of layers. Any of the layers in the EL layer 103 has a refractive index of 1.75 or lower, preferably 1.65 or lower for 467-nm wavelength light, or is formed of a material with a refractive index of 1.75 or lower, preferably 1.65 or lower for 467-nm wavelength light. When the refractive index is low, an optical loss is reduced to improve the light extraction efficiency of the light-emitting device. For this reason, the refractive index is preferably 1.74 or lower, more preferably 1.73 or lower, more preferably 1.72 or lower, more preferably 1.71 or lower, more preferably 1.70 or lower, more preferably 1.69 or lower, more preferably 1.68 or lower, more preferably 1.67 or lower, more preferably 1.66 or lower, more preferably 1.65 or lower. Note that the refractive index is an ordinary ray refractive index or the average of an ordinary ray refractive index and an extraordinary ray refractive index.

The first electrode 101 is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that when a composite material described later is used for a layer that is in contact with the first electrode 101 in the EL layer 103, an electrode material can be selected regardless of its work function.

Although the EL layer 103 preferably has a stacked-layer structure, there is no particular limitation on the stacked-layer structure, and various layers such as a hole-injection layer, a hole-transport layer, an electron-transport layer, an electron-injection layer, a carrier-blocking layer, an exciton-blocking layer, and a charge-generation layer can be employed as described above. Two kinds of stacked-layer structure of the EL layer 103 are described in this embodiment: the structure illustrated in FIG. 2A, which includes the electron-transport layer 114 and the electron-injection layer 115 in addition to the hole-injection layer 111, the hole-transport layer 112, and the light-emitting layer 113; and the structure illustrated in FIG. 2B, which includes the electron-transport layer 114, the electron-injection layer 115, and a charge-generation layer 116 in addition to the hole-injection layer 111, the hole-transport layer 112, and the light-emitting layer 113. Materials for forming each layer will be specifically described below.

The hole-injection layer 111 includes a substance having an acceptor property. Either an organic compound or an inorganic compound can be used as the substance having an acceptor property.

As the substance having an acceptor property, it is possible to use a compound having an electron-withdrawing group (a halogen group or a cyano group); for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene) malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, an inorganic compound such as molybdenum oxide, vanadium oxide, ruthenium oxide, tungsten oxide, or manganese oxide can also be used, other than the above-described organic compounds. Alternatively, the hole-injection layer 111 can be formed using a phthalocyanine-based complex compound such as phthalocyanine (abbreviation: $H_2Pc$) and copper phthalocyanine (CuPc), an aromatic amine compound such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD), or a high molecular compound such as poly(3,4-ethylenedioxythiophene)/poly(styrenesulfonic acid) (PEDOT/PSS). The substance having an acceptor property can extract electrons from an adjacent hole-transport layer (or hole-transport material) by the application of an electric field.

Alternatively, a composite material in which a material having a hole-transport property contains any of the aforementioned substances having an acceptor property can be used for the hole-injection layer 111. By using a composite material in which a material having a hole-transport property contains an acceptor substance, a material used to form an electrode can be selected regardless of its work function. In other words, besides a material having a high work function, a material having a low work function can be used for the first electrode 101.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1 \times 10^{-6}$ cm$^2$/Vs or higher. Organic compounds which can be used as the material having a hole-transport property in the composite material are specifically given below.

Examples of the aromatic amine compounds that can be used for the composite material include N,N-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenylanthracen-9-yl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4- methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl) perylene. Other examples include pentacene and coronene. The aromatic hydrocarbon may have a vinyl skeleton. Examples of the aromatic hydrocarbon having a vinyl group include 4,4'-bis(2,2-diphenylvinyl) biphenyl (abbreviation: DPVBi) and 9,10-bis[4-(2,2-diphenylvinyl)phenyl]anthracene (abbreviation: DPVPA). Note that the organic compound of one embodiment of the present invention can also be used.

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl)methacrylamide] (abbreviation: PTPDMA), and poly[N,N'-bis(4-butylphenyl)-N,N'-bis (phenyl)benzidine] (abbreviation: poly-TPD).

The material having a hole-transport property that is used in the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to the nitrogen atom of amine through an arylene group may be used. Note that the second organic compound having an N,N'-bis(4-biphenyl)amino group is preferable because a light-emitting device having a long lifetime can be fabricated. Specific examples of the second organic compound include N-(4-biphenyl)-6,N-diphenylbenzo[b]naphtho[1,2-d]furan-8-amine (abbreviation: BnfABP), N,N'-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N'-bis(4-biphenyl)benzo[b]naphtho[1,2-d]furan-6-amine (abbreviation: BBABnf(6)), N,N'-bis(4-biphenyl)benzo[b]naphtho[1,2-d]furan-8-amine (abbreviation: BBABnf(8)), N,N'-bis(4-biphenyl)benzo[b]naphtho[2,3-d]furan-4-amine (abbreviation: BBABnf(II) (4)), N,N'-bis [4-(dibenzofuran-4-yl)phenyl]-4-amino-p-terphenyl (abbreviation: DBfBB1TP), N-[4-(dibenzothiophen-4-yl) phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4-(2;1'-binaphthyl-6-yl)-4',4"-diphenyltriphenylamine (abbreviation: BBAαNβNB), 4,4'-diphenyl-4"-(7;1'-binaphthyl-2-yl) triphenylamine (abbreviation: BBAαNβNB-03), 4,4'-diphenyl-4"-(7-phenyl)naphthyl-2-yltriphenylamine (abbreviation: BBAPβNB-03), 4-(6;2'-binaphthyl-2-yl)-4',4"-diphenyltriphenylamine (abbreviation: BBA(βN2)B), 4,4'-diphenyl-4"-(7;2'-binaphthyl-2-yl)triphenylamine (abbreviation: BBA(βN2)B-03), 4-(1;2'-binaphthyl-4-yl)-4',4"-diphenyltriphenylamine (abbreviation: BBAβNαNB), 4-(1;2'-binaphthyl-5-yl)-4',4"-diphenyltriphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"'-phenyltriphenylamine (abbreviation: TPBiAβNBi), 4-(1-naphthyl)-4'-phenyltriphenylamine (abbreviation: αNBA1BP), 4,4'-bis (1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N'-bis([1,1'-biphenyl]-4-yl)-9,9'-spirobi[9H-fluoren]-2-amine (abbreviation: BBASF), N,N'-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl] triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(1,1'-biphenyl-4-yl)-9,9-dimethyl-N-[4-(9-phenyl-9H-carbazol-3-yl)phenyl]-9H-fluoren-2-amine (abbreviation: PCBBiF), N,N'-bis(9,9-dimethyl-9H-fluoren-2-yl)-9,9'-spirobi-9H-fluoren-4-amine, N,N'-bis(9,9-dimethyl-9H-fluoren-2-yl)-9,9'-spirobi-9H-fluoren-3-amine, N,N'-bis(9,9-dimethyl-9H-fluoren-2-yl)9,9'-spirobi-9H-fluoren-2-amine, and N,N'-bis(9,9-dimehtyl-9H-fluoren-2-yl)-9,9'-spirobi-9H-fluoren-1-amine.

Note that it is further preferable that the material having a hole-transport property to be used in the composite material have a relatively deep HOMO level higher than or equal to −5.7 eV and lower than or equal to −5.4 eV. Using the material having a hole-transport property which has a relatively deep HOMO level in the composite material makes it easy to inject holes into the hole-transport layer 112 and to obtain a light-emitting device having a long lifetime.

When any one or more of a fluoride of an alkali metal, a fluoride of an alkaline earth metal, and alkyl fluoride is mixed into the above-described composite material so that the proportion of fluorine atoms in a layer including the mixed material is preferably 20% or higher, the refractive index of the layer can be reduced. A layer with a low refractive index can also thus be formed in the EL layer 103, leading to higher external quantum efficiency of the light-emitting device. Since the spin density of the composite material mixed with the fluoride decreases with increasing the amount of fluoride, the spin density of the composite material measured by ESR spectroscopy is preferably $1.0 \times 10^{18}$ spins/cm$^3$ or higher. When the fluoride is mixed into the hole-injection layer, an inorganic compound, particularly molybdenum oxide is preferably used as the acceptor substance.

The refractive index of the hole-injection layer 111 can also be lowered by the use of a material with a low refractive index, such as 1,1-bis-(4-bis(4-methyl-phenyl)-amino-phenyl)-cyclohexane (abbreviation: TAPC), as the material having a hole-transport property.

The formation of the hole-injection layer 111 can improve the hole-injection property, which allows the light-emitting device to be driven at a low voltage. In addition, the organic compound having an acceptor property is easy to use because it is easily deposited by vapor deposition.

A material having a hole-transport property is used to form the hole-transport layer 112. The material having a hole-transport material preferably has a hole mobility higher than or equal to $1 \times 10^{-6}$ cm$^2$/Vs.

Examples of the material having a hole-transport property include compounds having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferred because these compounds are highly reliable and have high hole-transport properties to contribute to a reduction in driving voltage. Note that any of the substances given as examples of the material having a hole-transport property which is used in the composite material for the hole-injection layer 111 can also be suitably used as the material included in the hole-transport layer 112.

The light-emitting layer 113 includes a light-emitting substance and a host material. The light-emitting layer 113 may additionally include other materials. Alternatively, the light-emitting layer 113 may be a stack of two layers with different compositions.

As the light-emitting substance, fluorescent substances, phosphorescent substances, substances exhibiting thermally activated delayed fluorescence (TADF), or other light-emitting substances may be used. Note that one embodiment of the present invention is more suitably used in the case where the light-emitting layer 113 emits fluorescence, specifically, blue fluorescence.

Examples of the material that can be used as a fluorescent substance in the light-emitting layer 113 are as follows. Other fluorescent substances can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']

bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

Examples of the material that can be used when a phosphorescent substance is used as the light-emitting substance in the light-emitting layer 113 are as follows.

The examples are as follows: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato) iridium(III) (abbreviation: [Ir(Mptz)$_3$]), and tris[4-(3-biphenyl)-5-isopropyl-3-phenyl-4H-1,2,4-triazolato]iridium (III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris (1-methyl-5-phenyl-3-propyl-1H-1,2,4-triazolato)iridium (III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole] iridium(III) (abbreviation: [Ir(iPrpmi)$_3$]) and tris[3-(2,6-dimethylphenyl)-7-methylimidazo[1,2-f]phenanthridinato] iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$]iridium (III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl) phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)). These compounds emit blue phosphorescence and have an emission peak at 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium (III) (abbreviation: [Ir(tBuppm)$_3$]), (acetylacetonato)bis(6-methyl-4-phenylpyrimidinato)iridium(III) (abbreviation: [Ir (mppm)$_2$(acac)]), (acetylacetonato)bis(6-tert-butyl-4-phenylpyrimidinato)iridium(III) (abbreviation: [Ir (tBuppm)$_2$ (acac)]), (acetylacetonato)bis[6-(2-norbornyl)-4-phenylpyrimidinato]iridium(III) (abbreviation: [Ir(nbppm)$_2$ (acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato) bis(4,6-diphenylpyrimidinato)iridium(III) (abbreviation: [Ir (dppm)$_2$(acac)]); organometallic iridium complexes having a pyrazine skeleton, such as (acetylacetonato)bis(3,5-dimethyl-2-phenylpyrazinato)iridium(III) (abbreviation: [Ir (mppr-Me)$_2$(acac)]) and (acetylacetonato)bis(5-isopropyl-3-methyl-2-phenylpyrazinato)iridium(III) (abbreviation: [Ir (mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo [h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); and a rare earth metal complex such as tris(acetylacetonato) (monophenanthroline)terbium(III) (abbreviation: [Tb(acac)$_3$ (Phen)]). These are mainly compounds that emit green phosphorescence and have an emission peak at 500 nm to 600 nm. Note that organometallic iridium complexes having a pyrimidine skeleton have distinctively high reliability and emission efficiency and thus are particularly preferable.

Other examples include organometallic iridium complexes having a pyrimidine skeleton, such as (diisobutyrylmethanato)bis[4,6-bis(3-methylphenyl)pyrimidinato] iridium(III) (abbreviation: [Ir(5mdppm)$_2$(dibm)]), bis[4,6-bis(3-methylphenyl)pyrimidinato](dipivaloylmethanato) iridium(III) (abbreviation: [Ir(5mdppm)$_2$(dpm)]), and bis[4,6-di(naphthalen-1-yl)pyrimidinato(dipivaloylmethanato) iridium(III) (abbreviation: [Ir(d1npm)$_2$(dpm)]); organometallic iridium complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum (II) (abbreviation: [PtOEP]); and rare earth metal complexes such as tris(1,3-diphenyl-1,3-propanedionato) (monophenanthroline)europium(III) (abbreviation: [Eu(DBM)$_3$ (Phen)]) and tris[1-(2-thenoyl)-3,3,3-trifluoroacetonato (monophenanthroline)europium(III) (abbreviation: [Eu (TTA)$_3$(Phen)]). These compounds emit red phosphorescence having an emission peak at 600 nm to 700 nm. Furthermore, the organometallic iridium complexes having a pyrazine skeleton can provide red light emission with favorable chromaticity.

Besides the above phosphorescent compounds, known phosphorescent substances may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formulae 2]
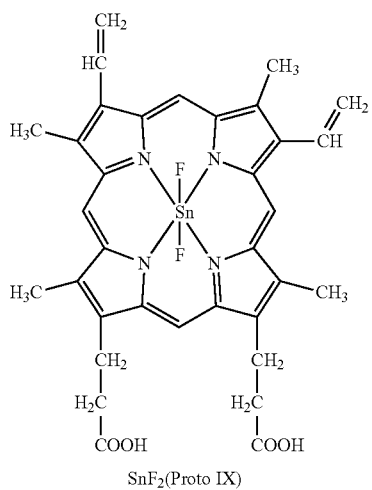
SnF$_2$(Proto IX)
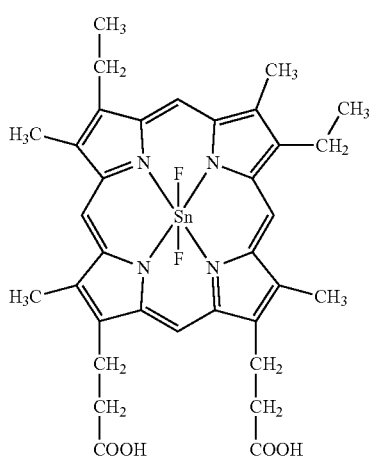
SnF$_2$(Meso IX)
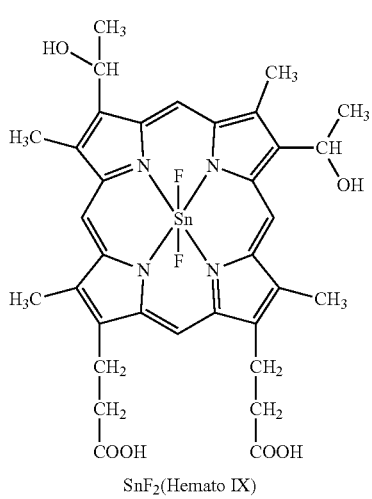
SnF$_2$(Hemato IX)
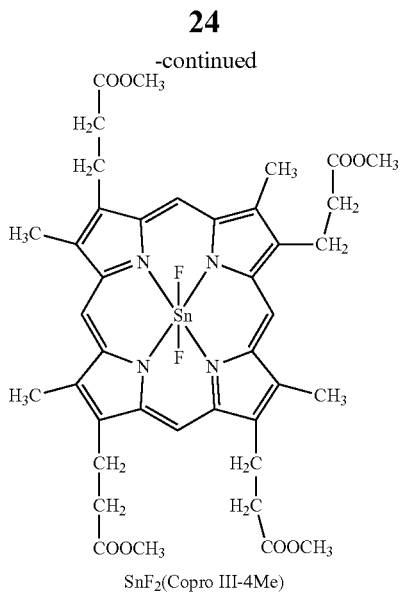
SnF$_2$(Copro III-4Me)
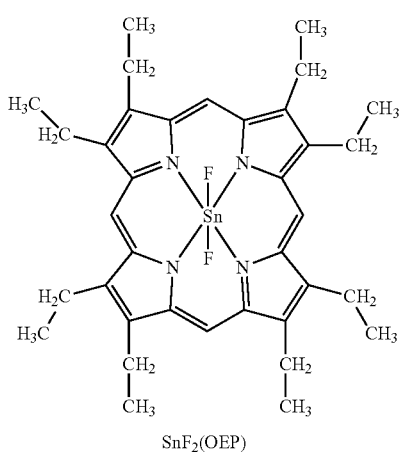
SnF$_2$(OEP)
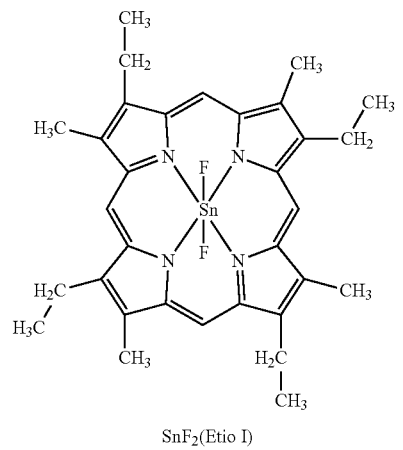
SnF$_2$(Etio I)

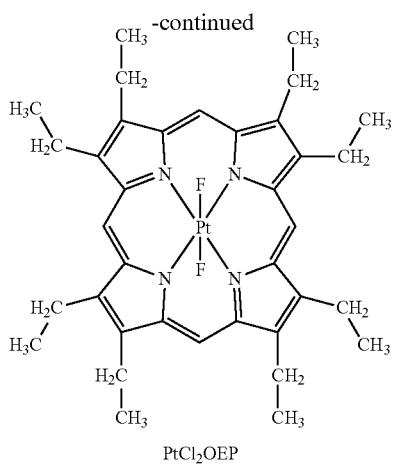

PtCl₂OEP

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high accepting properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formulae 3]

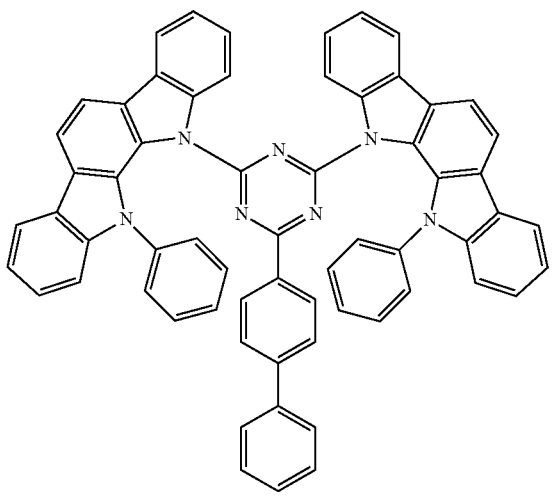

PIC-TRZ

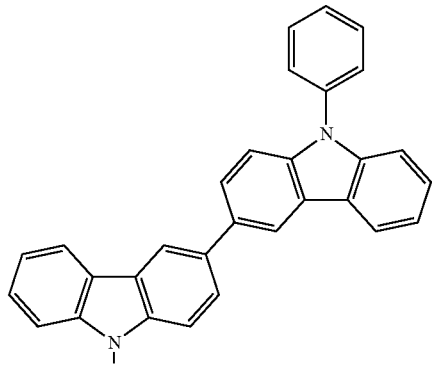

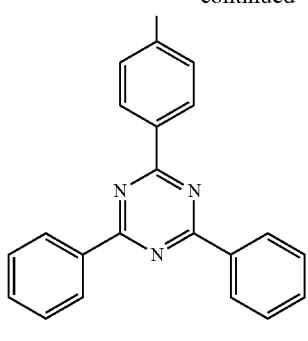

PCCzPTzn

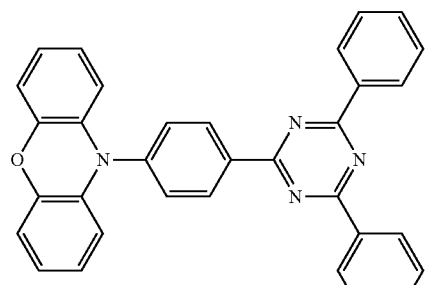

PXZ-TRZ

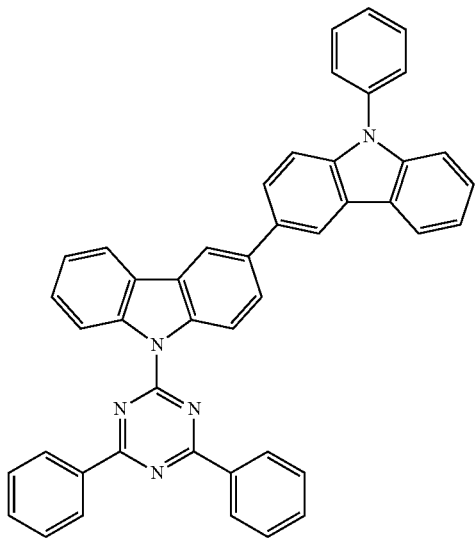

PCCzTzn

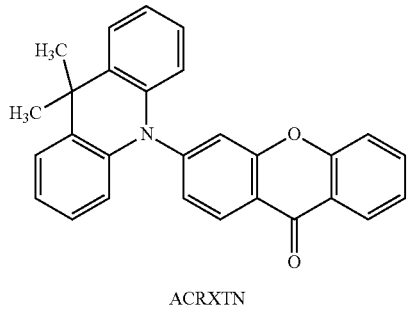

ACRXTN

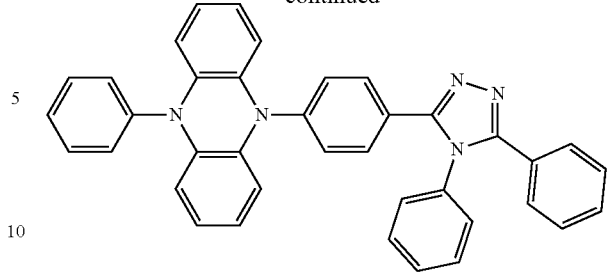

PPZ-3TPT

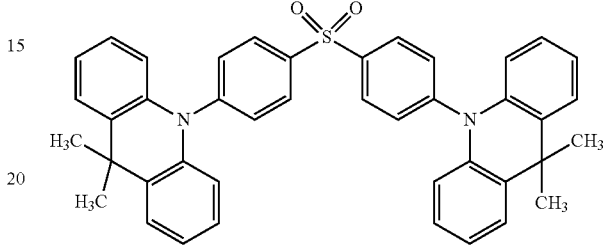

DMAC-DPS

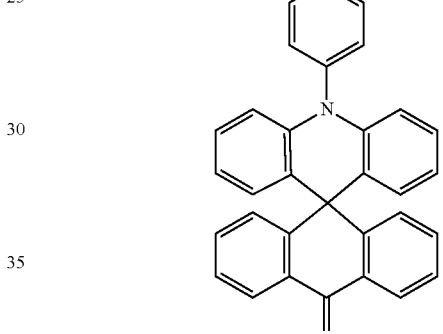

ACRSA

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the $S_1$ level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the host material in the light-emitting layer, various carrier-transport materials such as materials having an electron-transport property, materials having a hole-transport property, and the TADF materials can be used.

The material having a hole-transport property is preferably an organic compound having an aromatic amine skeleton or a π-electron rich heteroaromatic ring skeleton. Examples of the substance include compounds having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine9H (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the first substance can also be used.

As the material having an electron-transport property, metal complexes such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); or an organic compound having a π-electron deficient heteroaromatic ring skeleton is preferable. Examples of the organic compound having a π-electron deficient heteroaromatic ring skeleton include 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compound having a diazine skeleton and the heterocyclic compound having a pyridine skeleton have high reliability and thus are preferable. In particular, the heterocyclic compound having a diazine (pyrimidine or pyrazine) skeleton has a high electron-transport property to contribute to a reduction in driving voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups.

The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is favorably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzo fluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). Note that CzPA, cgDBCzPA, 2mBnfPPA, and PCzPA have excellent characteristics and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. When these mixed materials are selected so as to form an exciplex that exhibits light emission whose wavelength overlaps with the wavelength on a lowest-energy-side absorption band of the light-emitting substance, energy can be transferred smoothly and light emission can be obtained efficiently, which is preferable. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient PL lifetime of the mixed film has more long lifetime components or has a larger proportion of delayed components than that of each of the materials, observed by comparison of transient photoluminescence (PL) of the material having a hole-transport property, the material having an electron-transport property, and the mixed film of the materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of the materials.

In one embodiment of the present invention, the color conversion of light emitted from the light-emitting devices is performed through photoluminescence. When light of the three primary colors is obtained without separate formation of light-emitting devices, light emitted from the light-emitting devices is preferably blue light with the highest energy. When blue light is also obtained by the conversion, light emitted from the light-emitting devices is preferably purple light to light in the ultraviolet region.

The electron-transport layer 114 includes a substance having an electron-transport property. As the substance having an electron-transport property, it is possible to use any of the above-listed substances having electron-transport properties that can be used as the host material.

Note that the electron-transport layer preferably includes a material having an electron-transport property and an alkali metal, an alkaline earth metal, a compound thereof, or a complex thereof. The electron mobility of the material included in the electron-transport layer 114 in the case where the square root of the electric field strength [V/cm] is 600 is preferably higher than or equal to $1 \times 10^{-7}$ cm$^2$/Vs and lower than or equal to $5 \times 10^{-5}$ cm$^2$/Vs. The amount of electrons injected into the light-emitting layer can be controlled by the reduction in the electron-transport property of the electron-transport layer 114, whereby the light-emitting layer can be prevented from having excess electrons. It is particularly preferable that this structure be employed when the hole-injection layer is formed using a composite material that includes a material having a hole-transport property with a relatively deep HOMO level of −5.7 eV or higher and −5.4 eV or lower, in which case the light-emitting device can have a long lifetime. In this case, the material having an electron-transport property preferably has a HOMO level of −6.0 eV or higher. The material having an electron-transport property is preferably an organic compound having an anthracene skeleton and further preferably an organic compound having both an anthracene skeleton and a heterocyclic skeleton. The heterocyclic skeleton is preferably a nitrogen-containing five-membered ring skeleton or a nitrogen-containing six-membered ring skeleton, and particularly preferably a nitrogen-containing five-membered ring skeleton or a nitrogen-containing six-membered ring skeleton including two heteroatoms in the ring, such as a pyrazole ring, an imidazole ring, an oxazole ring, a thiazole ring, a pyrazine ring, a pyrimidine ring, or a pyridazine ring. In addition, it is preferable that the alkali metal, the alkaline earth metal, the compound thereof, or the complex thereof have a 8-hydroxyquinolinato structure. Specific examples include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product or a 5-methyl-substituted product) of the alkali metal, the alkaline earth metal, the compound, or the complex can also be used. There is preferably a difference in the concentration (including 0) of the alkali metal, the alkaline earth metal, the compound thereof, or the complex thereof in the electron-transport layer in the thickness direction.

A layer including an alkali metal, an alkaline earth metal, or a compound thereof such as lithium fluoride (LiF), cesium fluoride (CsF), calcium fluoride (CaF$_2$), or 8-hydroxyquinolinatolithium (Liq) may be provided as the electron-injection layer 115 between the electron-transport layer 114 and the second electrode 102. For example, an electride or a layer that is formed using a substance having an electron-transport property and that includes an alkali metal, an alkaline earth metal, or a compound thereof can be used as the electron-injection layer 115. Examples of the electride include a substance in which electrons are added at high concentration to calcium oxide-aluminum oxide.

Note that as the electron-injection layer 115, it is possible to use a layer including a substance that has an electron-transport property (preferably an organic compound having a bipyridine skeleton) and includes a fluoride of the alkali metal or the alkaline earth metal at a concentration higher than that at which the electron-injection layer 115 becomes in a microcrystalline state (50 wt % or higher). Since the layer has a low refractive index, a light-emitting device including the layer can have high external quantum efficiency.

The effect of a layer with a low refractive index is larger when it is provided between the cathode and the light-emitting layer than when it is provided between the anode and the light-emitting layer, and an electron-transport layer with a low refractive index is more effective than a hole-injection layer or a hole-transport layer with a low refractive index. Furthermore, this effect is much larger when a layer with a low refractive index is provided between the cathode and the light-emitting layer and another layer with a low refractive index is provided between the anode and the light-emitting layer. This effect improves device characteristics when the color conversion is performed, so that a color conversion light-emitting device with high efficiency can be obtained.

Instead of the electron-injection layer 115, the charge-generation layer 116 may be provided (FIG. 2B). The charge-generation layer 116 refers to a layer capable of injecting holes into a layer in contact with the cathode side of the charge-generation layer and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film including the above-described acceptor material as a material included in the composite material and a film including a hole-transport material. When a potential is applied to the p-type layer 117, electrons are injected into the electron-transport layer 114 and holes are injected into the second electrode 102 serving as a cathode; thus, the light-emitting device operates. Since the organic compound of one embodiment of the present invention has a low refractive index, using the organic compound for the p-type layer 117 enables the light-emitting device to have high external quantum efficiency.

Note that the charge-generation layer 116 preferably includes an electron-relay layer 118 and/or an electron-injection buffer layer 119 in addition to the p-type layer 117.

The electron-relay layer 118 includes at least the substance having an electron-transport property and has a function of preventing an interaction between the electron-injection buffer layer 119 and the p-type layer 117 and smoothly transferring electrons. The LUMO level of the substance having an electron-transport property included in the electron-relay layer 118 is preferably between the LUMO level of the acceptor substance in the p-type layer 117 and the LUMO level of a substance included in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, more preferably higher than or equal to −5.0 eV and lower than or equal to −3.0 eV Note that as the substance having an electron-transport property in the electron-relay layer 118, a phthalocyanine-based material or a metal complex having a metal-oxygen bond and an aromatic ligand is preferably used.

A substance having a high electron-injection property can be used for the electron-injection buffer layer 119. For example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for the electron-transport layer 114 can be used.

For the second electrode 102, a metal, an alloy, an electrically conductive compound, or a mixture thereof each having a low work function (specifically, lower than or equal to 3.8 eV) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the second electrode 102 and the electron-transport layer, for the second electrode 102, a variety of conductive materials such as Al, Ag, ITO, or indium oxide-tin oxide containing silicon or silicon oxide can be used regardless of the work function. Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Furthermore, any of a variety of methods can be used for forming the EL layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the first electrode 101 and the second electrode 102 is not limited to the above-described structure. Preferably, a light-emitting region where holes and electrons recombine is positioned away from the first electrode 101 and the second electrode 102 so as to prevent quenching due to the proximity of the light-emitting region and a metal used for electrodes and carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material included in the light-emitting layer.

Next, an embodiment of a light-emitting device with a structure in which a plurality of light-emitting units are stacked (this type of light-emitting device is also referred to as a stacked or tandem light-emitting device) is described with reference to FIG. 2C. This light-emitting device includes a plurality of light-emitting units between an anode and a cathode. One light-emitting unit has substantially the same structure as the EL layer 103 illustrated in FIG. 2A. In other words, the light-emitting device illustrated in FIG. 2A or FIG. 2B includes a single light-emitting unit, and the light-emitting device illustrated in FIG. 2C includes a plurality of light-emitting units.

In FIG. 2C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the first electrode 101 and the second electrode 102 illustrated in FIG. 2A, and the materials given in the description for FIG. 2A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied between the anode 501 and the cathode 502. That is, in FIG. 2C, the charge-generation layer 513 injects electrons into the first light-emitting unit 511 and holes into the second light-emitting unit 512 when a voltage is applied so that the potential of the anode becomes higher than the potential of the cathode.

The charge-generation layer 513 preferably has a structure similar to that of the charge-generation layer 116 described with reference to FIG. 2B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as the electron-injection layer in the light-emitting unit on the anode side and thus, an electron-injection layer is not necessarily formed in the light-emitting unit on the anode side.

The light-emitting device having two light-emitting units is described with reference to FIG. 2C; however, one embodiment of the present invention can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life light-emitting apparatus which can emit light with high luminance at a low current density. A light-emitting apparatus which can be driven at a low voltage and has low power consumption can be provided.

Figure 3:
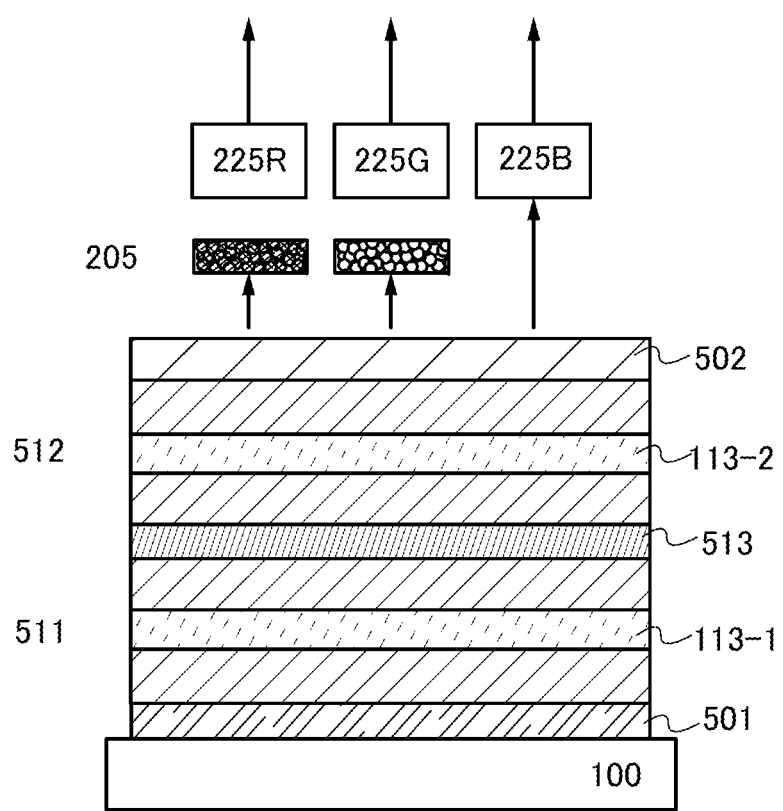
FIG. 3 is a schematic view of a light-emitting device.

Like FIG. 2C, FIG. 3 is a schematic view of a light-emitting apparatus in which a light-emitting device including a plurality of light-emitting units is applied to one embodiment of the present invention. In FIG. 3, the anode 501 is formed over the substrate 100, and the first light-emitting unit 511 including a first light-emitting layer 113-1 and the second light-emitting unit 512 including a second light-emitting layer 113-2 are stacked with the charge-generation layer 513 provided therebetween. Light is emitted from the light-emitting device directly or through the color conversion layer 205. Note that the color purity may be improved through color filters 225R, 225G, and 225B. Note that FIG. 3 illustrates the structure where the color filter 225B is provided; however, one embodiment of the present invention is not limited to this. For example, in FIG. 3, an overcoat layer may be provided instead of the color filter 225B. For the overcoat layer, an organic resin material, typically an acrylic-based resin or a polyimide-based resin may be used. In this specification and the like, the color filter layer may be referred to as a coloring layer and the overcoat layer may be referred to as a resin layer. Thus, the color filter 225R may be referred to as a first coloring layer and the color filter 225G may be referred to as a second coloring layer.

The above-described layers and electrodes such as the EL layer 103, the first light-emitting unit 511, the second light-emitting unit 512, and the charge generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

Here, in consideration of color reproducibility of a full color display, in order to express a wider color gamut, it is essential to obtain light with high color purity. Light emitted from an organic compound has a broader spectrum than light emitted from an inorganic compound in many cases, and the spectrum is preferably narrowed with a microcavity structure in order to obtain light emission with sufficiently high color purity.

Actually, a light-emitting device appropriately using a suitable dopant and a microcavity structure can provide blue light emission that corresponds to the color gamut of Rec.2020, which is defined by the BT.2020 standard and the BT.2100 standard. When the microcavity structure of the light-emitting device is configured to enhance blue light, a light-emitting apparatus with high color purity and high efficiency can be obtained.

The light-emitting device having a microcavity structure includes a reflective electrode and a transflective electrode as a pair of electrodes of the light-emitting device. The reflective electrode and the transflective electrode correspond to the first electrode 101 and the second electrode 102 which are described above. One of the first electrode 101 and the second electrode 102 may be the reflective electrode and the other may be the transflective electrode.

In the light-emitting device having a microcavity structure, light emitted in all directions from a light-emitting layer in the EL layer is reflected and resonated by the reflective electrode and the transflective electrode, so that a certain wavelength of light is amplified and the light has directivity.

The reflective electrode has a visible light reflectivity of 40% to 100%, preferably 70% to 100% and a resistivity of $1 \times 10^{-2}$ Ωcm or lower. Examples of the material include for the reflective electrode include aluminum (Al) and an alloy containing Al. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, use of aluminum can reduce costs for manufacturing a light-emitting device with aluminum. Alternatively, silver (Ag), an alloy of Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), and gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, and an alloy containing silver and ytterbium. Besides, a transition metal such as tungsten, chromium (Cr), molybdenum (Mo), copper, or titanium can be used.

Note that between the reflective electrode and the EL layer 103, a transparent electrode layer can be formed as an optical distance adjustment layer with use of a conductive material having a light-transmitting property, and the first electrode 101 can consist of the reflective electrode and the transparent electrode. With the transparent electrode layer, the optical distance (cavity length) of the microcavity structure can be also adjusted. Examples of the conductive material having a light-transmitting property include metal oxides such as indium tin oxide (hereinafter referred to as ITO), indium tin oxide containing silicon or silicon oxide (abbreviation: ITSO), indium oxide-zinc oxide (indium zinc oxide), indium oxide-tin oxide containing titanium, indium titanium oxide, and indium oxide containing tungsten oxide and zinc oxide.

The transflective electrode has a visible light reflectivity of 20% to 80%, preferably 40% to 70%, and a resistivity of $1 \times 10^{-2}$ Ωcm or lower. The semi-transmissive semi-reflective electrode can be formed using one or more kinds of conductive metals and alloys, conductive compounds, and the like. Specifically, a metal oxide, such as indium tin oxide (hereinafter referred to as ITO), indium tin oxide containing silicon or silicon oxide (ITSO), indium oxide-zinc oxide (indium zinc oxide), indium oxide-tin oxide containing titanium, indium-titanium oxide, or indium oxide containing tungsten oxide and zinc oxide, can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

The reflective electrode can be either one of the first electrode 101 and the second electrode 102 and the transflective electrode can be the other. Furthermore, the reflective electrode can be either one of an anode and a cathode and the transflective electrode can be the other.

Note that when the light-emitting device has a top emission structure, the light extraction efficiency can be improved by providing an organic cap layer over a surface of the second electrode 102 which is opposite to a surface of the second electrode 102 in contact with the EL layer 103. The organic cap layer can reduce a difference in a refractive index at an interface between the electrode and the air; thus, the light extraction efficiency can be improved. The thickness of the organic cap layer is preferably greater than or equal to 5 nm and less than or equal to 120 nm, further preferably greater than or equal to 30 nm and less than or equal to 90 nm. An organic compound layer including a substance with a molecular weight of greater than or equal to 300 and less than or equal to 1200 is preferably used as the organic cap layer. Furthermore, the organic cap layer is preferably formed using a conductive organic material. Although the transflective electrode needs to be thinned to have a certain light-transmitting property, its conductivity might be decreased when the transflective electrode is thin. With use of a conductive material for the organic cap layer, the light extraction efficiency can be improved, the conductivity can be secured, and the manufacturing yield of the light-emitting device can be improved. Note that an organic compound that is less likely to absorb light in the visible region can be preferably used. For the organic cap layer, the organic compound used for the EL layer 103 can also be used. In that case, the organic cap layer can be formed with a deposition apparatus or a deposition chamber for forming the EL layer 103, so that the organic cap layer can be easily formed.

In the light-emitting device, by changing the thickness of the transparent electrode provided in contact with the above-described reflective electrode and the thicknesses of carrier-transport layers, such as a hole-injection layer and a hole-transport layer, the optical path length (cavity length) between the reflective electrode and the transflective electrode can be changed. Thus, light with a wavelength that is resonated between the reflective electrode and the transflective electrode can be intensified while light with a wavelength that is not resonated therebetween can be attenuated.

Note that in the microcavity structure, the optical path length (the optical distance) between an interface of the reflective electrode with the EL layer and an interface of the transflective electrode with the EL layer is preferably integral multiple of $\lambda/2$ when a wavelength desired to be amplified is $\lambda$ nm.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of light desired to be amplified). By adjusting the optical path length, the phases of the first reflected light and the first incident light can be aligned with each other and the light emitted from the light-emitting layer can be further amplified.

With the microcavity structure, the emission intensity of light with a specific wavelength in the front direction can be increased, whereby power consumption can be reduced. Furthermore, the amount of light incident to the color conversion layer can be increased.

Light whose spectrum is narrowed with a microcavity structure is known to have high directivity to a direction perpendicular to a screen. On the other hand, light emitted through the color conversion layer using a QD hardly has directivity because light from a QD or a light-emitting organic compound is emitted in all directions. A color conversion layer causes some loss of light emitted from a light-emitting device, and thus in a display using a color conversion layer, blue light, which has the shortest wavelength, is obtained directly from a light-emitting device and green light and red light are obtained through color conversion layers. Therefore, differences in light distribution characteristics are generated between a blue pixel and a green and a red pixel, and. Such large differences in light distribution characteristics cause viewing angle dependence, which is directly linked to deterioration in display quality. In particular, the adverse influence is large in the case where a large number of people view a large-sized screen, such as a TV.

In view of the above, in the light-emitting apparatus of one embodiment of the present invention, a pixel without a color conversion layer may be provided with a structure having a function of scattering light or a pixel with a color conversion layer may be provided with a structure for imparting directivity.

The structure having a function of scattering light may be provided on an optical path of light emitted from the light-emitting device to the outside of the light-emitting apparatus. Although light emitted from the light-emitting device having a microcavity structure has high directivity, when light is scattered by the structure having a function of scattering a light, its directivity can be reduced or the scattered light can have directivity; as a result, light passing through a color conversion layer and light without through a color conversion layer can have similar light distribution characteristics. Accordingly, the viewing angle dependence can be reduced.

Figure 4A:
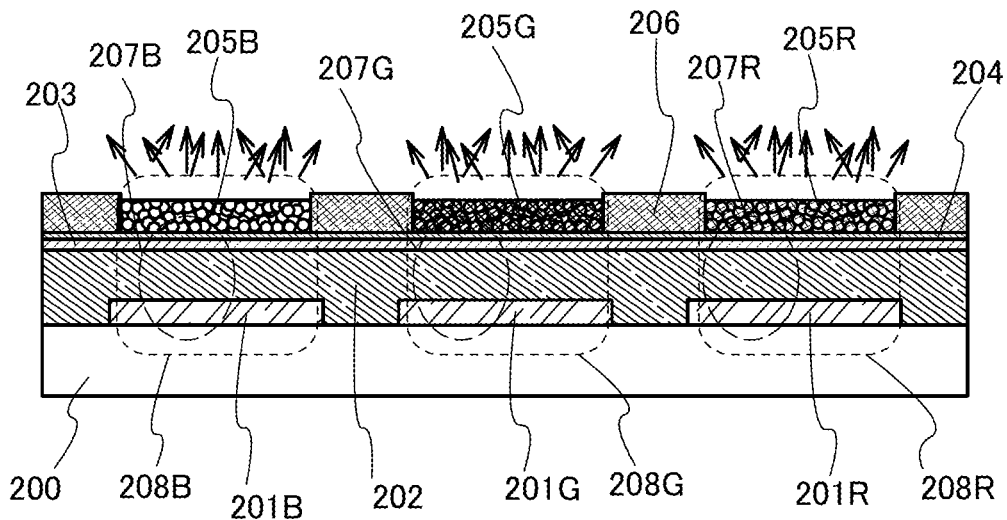
FIGS. 4A to 4C are conceptual diagrams of light-emitting apparatuses.
Figure 4B:
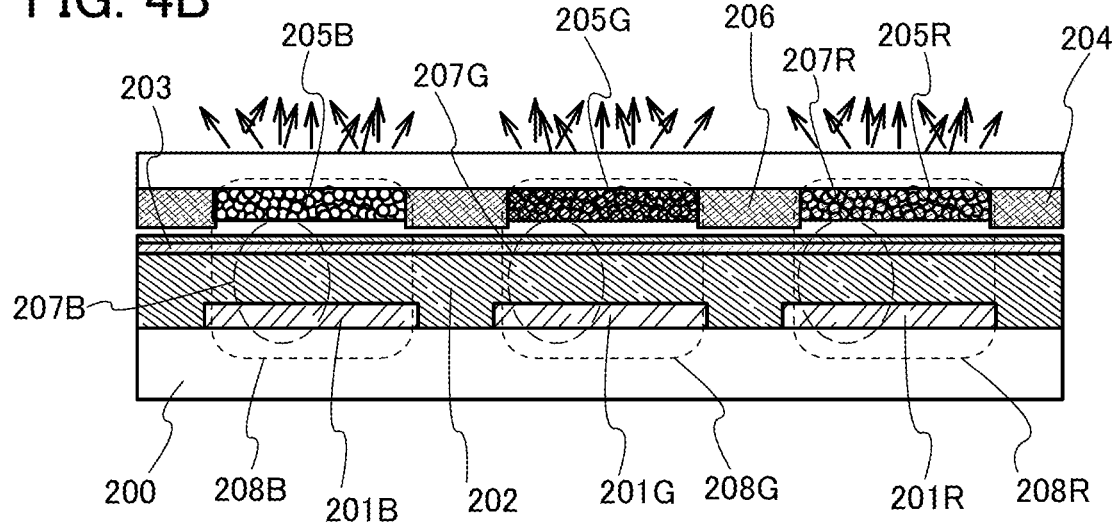
Figure 4C:
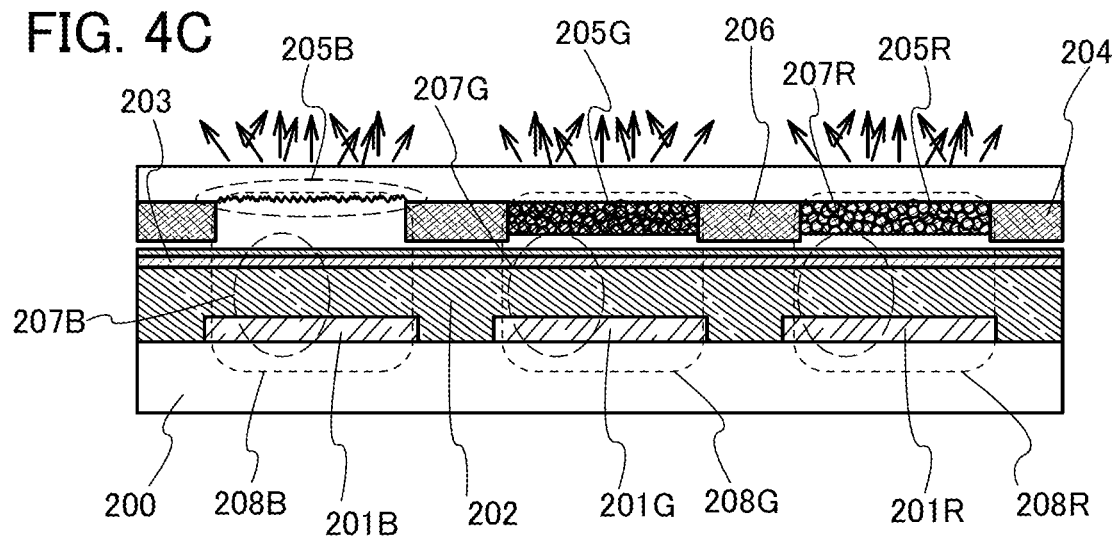

FIGS. 4A to 4C illustrate a structure in which a structure 205B having a function of scattering light emitted from the first light-emitting device 207B is provided in the first pixel 208B. The structure 205B having a function of scattering light emitted from the first light-emitting device 207B may be a layer including a first substance that scatters light emitted from the first light-emitting device, as illustrated in FIGS. 4A and 4B or may have a structure body which scatters light emitted from the light-emitting device, as illustrated in FIG. 4C.

Figure 5A:
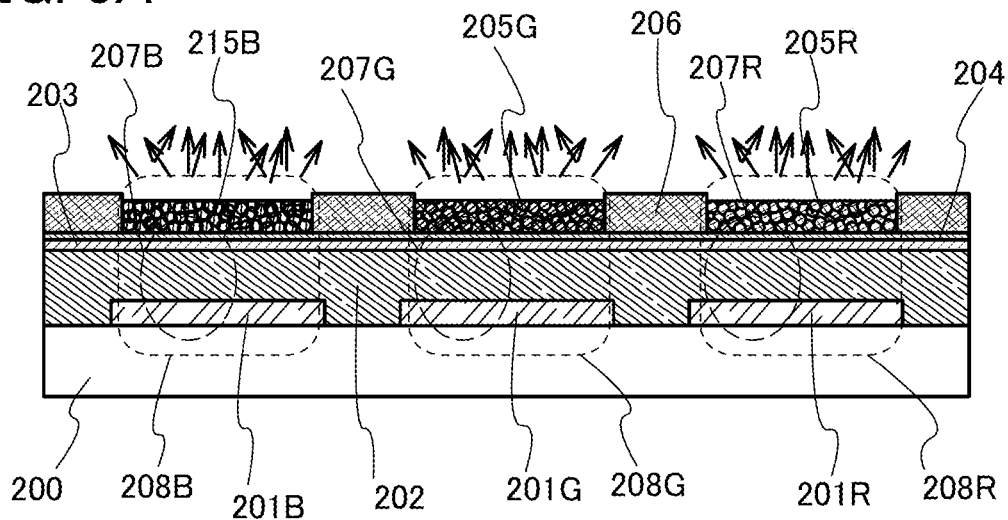
FIGS. 5A to 5C are conceptual diagrams of light-emitting apparatuses.
Figure 5B:
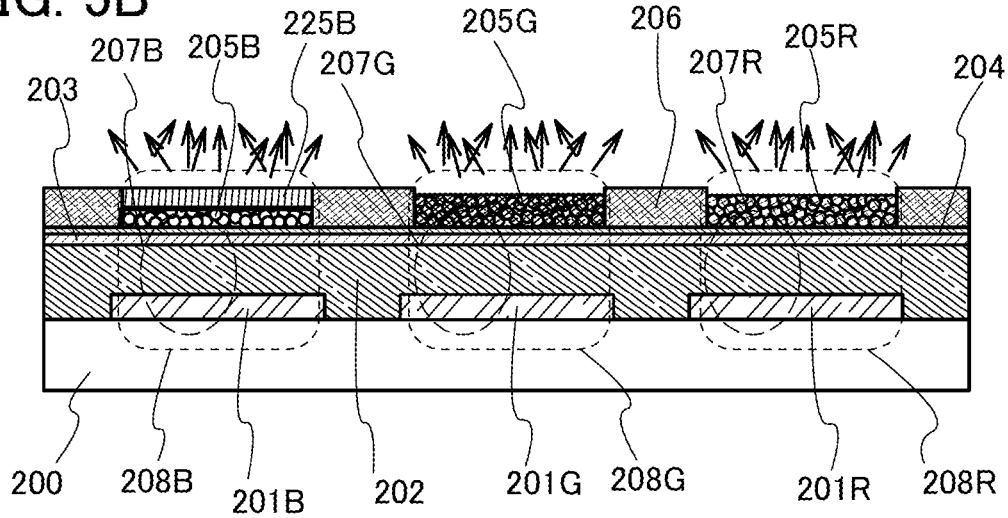
Figure 5C:
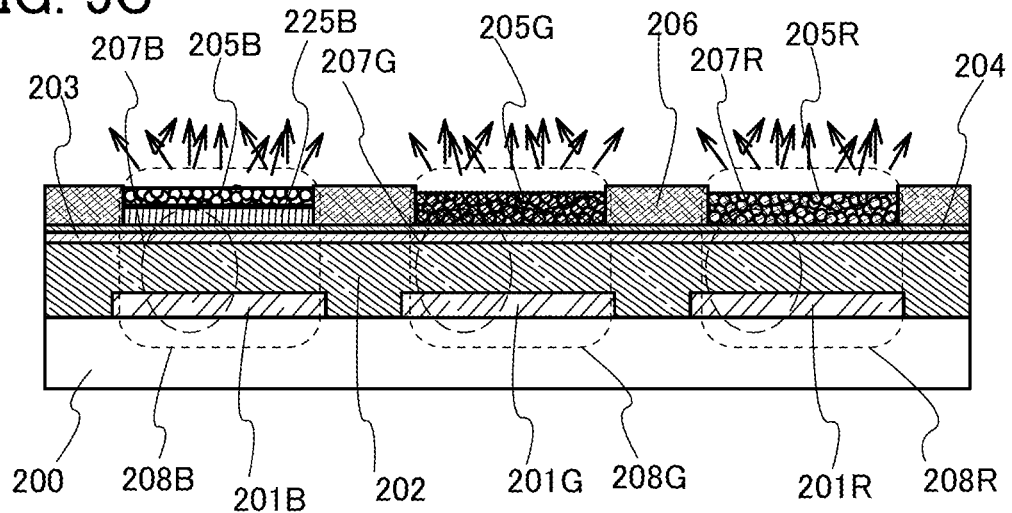

FIGS. 5A to 5C illustrate modification examples. FIG. 5A illustrates a state including a layer also serving as a blue color filter (a color filter 215B) instead of the structure 205B having a function of scattering light illustrated in FIG. 4A. FIGS. 5B and 5C illustrate states each including the structure 205B having a function of scattering light and the blue color filter 215B. Note that the blue color filter 215B may be in contact with the structure 205B having a function of scattering light, as illustrated in FIGS. 5B and 5C, or may be formed on another structure body such as a sealing substrate. Thus, the light-emitting apparatus has improved color purity while scattering light having directivity. Furthermore, reflection of external light can also be suppressed, leading to preferable display.

Light emitted from the first pixel 208B can be light with low directivity because light emitted from the first light-emitting device 207B passes through the structure 205B. This relieves a difference in light distribution characteristics depending on colors, and leads to a light-emitting apparatus with a high display quality.

Figure 6A:
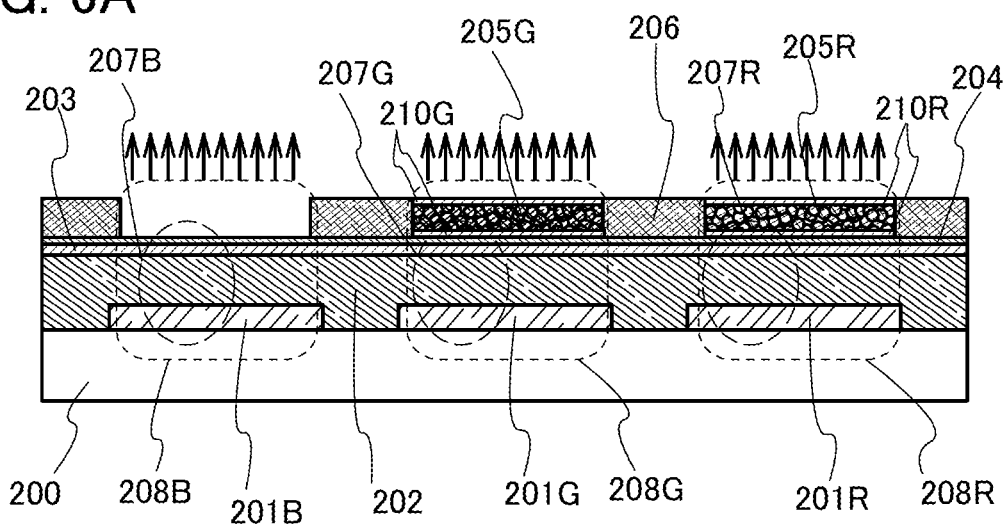
FIGS. 6A and 6B are conceptual diagrams of a passive matrix light-emitting apparatuses.
Figure 6B:
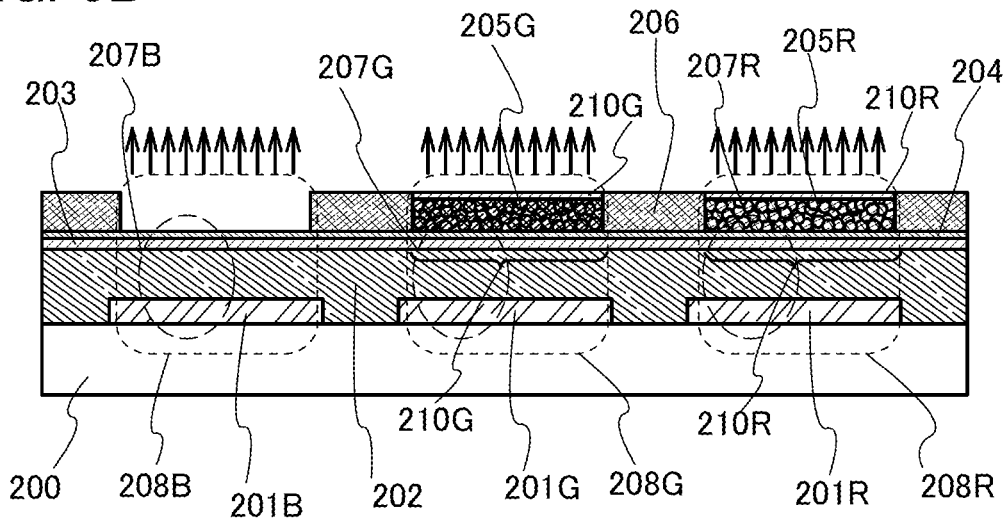

In light-emitting apparatuses of one embodiment of the present invention illustrated in FIGS. 6A and 6B, a means 210G and a means 210R for imparting the directivity to light emitted from the first color conversion layer are provided. There is no limitation on the means for imparting directivity to light emitted from the first color conversion layer. For example, a microcavity structure may be formed by forming a transflective layer such that a color conversion layer is interposed. Note that FIG. 6A illustrates a state in which transflective layers are formed below and above a color conversion layer, and FIG. 6B illustrates a state in which the transflective layer of the color conversion layer, which is on the light-emitting device side, is also used as a second electrode (transflective electrode) of the light-emitting device.

Light from the second pixel 208G and light from the third pixel 208R can be light with high directivity by providing the means 210G and 210R for imparting directivity to light passing through the color conversion layer. This relieves a difference in light distribution characteristics depending on colors, and leads to a light-emitting apparatus with a high display quality.

Embodiment 2

In this embodiment, an organic compound having a hole-transport property which can be used for the hole-injection layer 111 and the hole-transport layer 112 in the light-emitting device 207 in Embodiment 1 is described.

Among organic compounds that have a carrier-transport property and can be used for an organic EL device, 1,1-bis-(4-bis(4-methyl-phenyl)-amino-phenyl)-cyclohexane (abbreviation: TAPC), which is a material with a low refractive index, is known. The use of such a material with a low refractive index for the EL layer enables a light-emitting device to have high external quantum efficiency; therefore, with TAPC, high external quantum efficiency of a light-emitting device can be expected.

In general, a high carrier-transport property and a low refractive index have a trade-off relationship. This is because the carrier-transport property of an organic compound largely depend on an unsaturated bond, and an organic compound having many unsaturated bonds tends to have a high refractive index. TAPC has both a carrier-transport property and a low refractive index in an exquisite balance; however, in a compound including 1,1-disubstituted cyclohexane such as TAPC, two bulky substituents are bonded to a carbon atom of cyclohexane, which causes larger steric repulsion and unstability of the molecule itself, leading to disadvantage in reliability. In addition, TAPC has a skeleton structure including cyclohexane and simple benzene rings, and thus has a low glass transition temperature (Tg) and a heat resistance problem.

One of the possible methods for obtaining a hole-transport material with high heat resistance and high reliability is introducing an unsaturated hydrocarbon group, particularly a cyclic unsaturated hydrocarbon group, into a molecule. Meanwhile, in order to obtain a material with a low refractive index, a substituent with low molecular refraction is preferably introduced into the molecule. Examples of the substituent include a saturated hydrocarbon group and a cyclic saturated hydrocarbon group.

A material used as a carrier-transport material for an organic EL device preferably has a skeleton with a high carrier-transport property, and an aromatic amine skeleton is particularly preferable because of its high hole-transport property. For a higher carrier-transport property, two amine skeletons can be introduced as another method. However, as in the above-described TAPC, the diamine structure sometimes adversely affects the reliability depending on the substituents arranged around the amine skeletons.

As a compound that overcomes the trade-off and has a carrier-transport property, a low refractive index, and high reliability, the present inventors have found a monoamine compound in which the proportion of carbon atoms each forming a bond by the sp$^3$ hybrid orbitals forming a saturated hydrocarbon group is within a certain range. In particular, the monoamine compound has high reliability equivalent to those of conventional materials for a hole-injection layer with a normal refractive index. Furthermore, the monoamine compound can have more favorable characteristics when the number or position of the substituents containing the carbon atoms each forming a bond by the sp$^3$ hybrid orbitals is adjusted.

Thus, the organic compound of one embodiment of the present invention is a monoamine compound, in which a first aromatic ring, a second aromatic ring, and a third aromatic ring are directly bonded to the nitrogen atom of the amine and which is a material for a hole-transport layer and a hole-injection layer of an organic EL device. A layer including the monoamine compound has a refractive index higher than or equal to 1.5 and lower than or equal to 1.75. In the monoamine compound, the proportion of carbon atoms each forming a bond by the sp$^3$ hybrid orbitals to the total number of carbon atoms in the molecule is preferably higher than or equal to 23% and lower than or equal to 55%.

A substituent including carbon atoms each forming a bond by the sp$^3$ hybrid orbitals is what is called a saturated hydrocarbon group or a cyclic saturated hydrocarbon group, and thus has low molecular refraction. Thus, the monoamine compound, in which the proportion of the carbon atoms each forming a bond by the sp$^3$ hybrid orbitals to the total number of the carbon atoms in the molecule is higher than or equal to 23% and lower than or equal to 55%, can be used as a material for a hole-transport layer and a hole-injection layer with a low refractive index.

Furthermore, it is preferable that the integral value of signals at lower than 4 ppm exceed the integral value of signals at 4 ppm or higher in the results of $^1$H-NMR measurement conducted on the monoamine compound. The signals at lower than 4 ppm represent chain or cyclic saturated hydrocarbon groups, and the integral value of the signals exceeding the integral value of the signals at 4 ppm or higher indicates that there are more hydrogen atoms constituting saturated hydrocarbon than those constituting unsaturated groups. Thus, the proportion of the carbon atoms each forming a bond only by the sp$^3$ hybrid orbitals in the molecule can be estimated. Here, carbon in the unsaturated hydrocarbon group has a smaller number of bonds for hydrogen; for example, the number of bonds for hydrogen is greatly different between benzene ($C_6H_6$) and cyclohexane ($C_6H_{12}$). Considering the difference, the integral value of the signals at lower than 4 ppm exceeding the integral value of the signals at 4 ppm or higher obtained in the $^1$H-NMR measurement indicates that approximately one-third of carbon atoms in the molecule exist in the saturated hydrocarbon group. As a result, the monoamine compound is an organic compound with a low refractive index and thus can be suitably used as a material for a hole-transport layer and a hole-injection layer.

In addition, the monoamine compound preferably has at least one fluorene skeleton. The monoamine compound having a fluorene skeleton can have a high hole-transport property, and thus enables a light-emitting device including the monoamine compound as a material for a hole-transport layer and/or a hole-injection layer to have low driving voltage. The fluorene skeleton corresponds to any of the first to third aromatic rings. Furthermore, it is preferable that the fluorene skeleton be directly bonded to the nitrogen atom of the amine, because this contributes to a shallower HOMO level of the molecule and easier hole transfer.

In the case where the monoamine compound is deposited by evaporation, the molecular weight is preferably greater than or equal to 400 and less than or equal to 1000.

The above-described monoamine compound will be described in more detail.

The monoamine compound is a triarylamine derivative in which the first aromatic ring, the second aromatic ring, and the third aromatic ring are bonded to the nitrogen atom of the amine. These first to third aromatic rings are bonded to the nitrogen atom of amine.

The first aromatic ring and the second aromatic ring each include one to three benzene rings. In addition, it is preferable that the first aromatic ring and the second aromatic ring be each a hydrocarbon ring.

In the case where the first aromatic ring or the second aromatic ring includes two or three benzene rings, the two or three benzene rings are preferably bonded to each other to form a substituent. In other words, the first aromatic ring and the second aromatic ring are preferably a phenyl group, a biphenyl group, a terphenyl group, or a naphthylphenyl group.

One or both of the first and second aromatic rings include one or more hydrocarbon groups having 1 to 12 carbon atoms each forming a bond only by the $sp^3$ hybrid orbitals.

Note that in the monoamine compound, the hydrocarbon group(s) having 1 to 12 carbon atoms each forming a bond only by the $sp^3$ hybrid orbitals is/are bonded to one or both of the first and second aromatic rings. The total number of the carbon atoms in the hydrocarbon group(s) bonded to one aromatic ring is greater than or equal to 6, and the total number of the carbon atoms in the hydrocarbon groups bonded to the first and second aromatic rings is greater than or equal to 8, preferably greater than or equal to 12. When the hydrocarbon group with low molecular refraction is bonded in the above manner, the monoamine compound can be an organic compound with a low refractive index.

Furthermore, the total number of the carbon atoms in the hydrocarbon groups in the first and second aromatic rings is preferably 36 or less, further preferably 30 or less so that the carrier-transport property is maintained high. As described above, a larger number of π electrons due to unsaturated bonds of carbon atoms are advantageous in carrier transportation.

As the hydrocarbon group having 1 to 12 carbon atoms each forming a bond only by the $sp^3$ hybrid orbitals, an alkyl group having 3 to 8 carbon atoms or a cycloalkyl group having 6 to 12 carbon atoms is preferable. Specifically, it is possible to use a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a heptyl group, an octyl group, a cyclohexyl group, a 4-methylcyclohexyl group, a cycloheptyl group, a cyclooctyl group, a cyclononyl group, a cyclodecyl group, a decahydronaphthyl group, a cycloundecyl group, a cyclododecyl group, and the like. It is particularly preferable to use a t-butyl group, a cyclohexyl group, or a cyclododecyl group.

The third aromatic ring is a substituted or unsubstituted monocyclic condensed ring or a substituted or unsubstituted bicyclic or tricyclic condensed ring. Since the refractive index tends to increase with an increase in the number of the condensed rings, using an aromatic group with a small number of condensed rings enables the refractive index to be maintained low. Similarly, an increase in the number of the condensed rings leads to absorption and emission of light in the visible region that are to be observed, and thus using an aromatic group with a small number of condensed rings can reduce the influence of the absorption and emission of light.

Note that the third aromatic ring preferably has 6 to 13 carbon atoms to maintain the low refractive index. Specific examples of the aromatic group that can be used as the third aromatic group include a benzene ring, a naphthalene ring, a fluorene ring, and an acenaphthylene ring. In particular, the third aromatic ring preferably includes a fluorene ring and further preferably is a fluorene ring, in which case the hole-transport property can be favorable.

The monoamine compound having the above-described structure is an organic compound with a hole-transport property and a low refractive index, and thus can be suitably used as a material for a hole-transport layer or a hole-injection layer of an organic EL device. Furthermore, an organic EL device using the material for a hole-transport layer or a hole-injection layer has a hole-transport layer or a hole-injection layer with a low refractive index, and thus can be a light-emitting device having high emission efficiency, i.e., high external quantum efficiency, high current efficiency, and a high blue index. Furthermore, since the organic EL device uses the monoamine compound as the material for a hole-transport layer or a hole-injection layer and the number of aromatic groups bonded to the saturated hydrocarbon ring is limited, the steric repulsion can be reduced to improve the stability of the molecule, so that the organic EL device can be a light-emitting device having a long lifetime It is particularly preferable that the monoamine compound be an organic compound represented by the following general formula (G1).

[Chemical Formula 4]

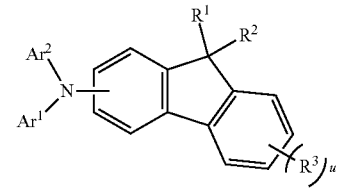

(G1)

Note that in the general formula (G1), $Ar^1$ and $Ar^2$ each independently represent a substituent with a benzene ring or a substituent in which two or three benzene rings are bonded to each other. Specific examples of $Ar^1$ and $Ar^2$ include a phenyl group, a biphenyl group, a terphenyl group, and a naphthylphenyl group. A phenyl group is particularly preferable to lower the refractive index and maintain the carrier-transport property of the nitrogen atom.

Note that one or both of $Ar^1$ and $Ar^2$ have one or more hydrocarbon groups each having 1 to 12 carbon atoms each forming a bond only by the $sp^3$ hybrid orbitals. The total number of the carbon atoms in the hydrocarbon groups is greater than or equal to 8, and the total number of the carbon atoms included in the hydrocarbon group(s) bonded to at least one of $A^1$ and $Ar^2$ is greater than or equal to 6. As the hydrocarbon group having 1 to 12 carbon atoms each forming a bond only by the $sp^3$ hybrid orbitals, an alkyl group having 3 to 8 carbon atoms or a cycloalkyl group having 6 to 12 carbon atoms is preferable. Specifically, it is possible to use a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a heptyl group, an octyl group, a cyclohexyl group, a 4-methylcyclohexyl group, a cycloheptyl group, a cyclooctyl group, a cyclononyl group, a cyclodecyl group, a decahydronaphthyl group, a cycloundecyl group, a cyclododecyl group, and the like. It is particularly preferable to use a t-butyl group, a cyclohexyl group, or a cyclododecyl group.

Note that in the case where a plurality of straight-chain alkyl groups each having one or two carbon atoms are bonded to $Ar^1$ or $Ar^2$ as the hydrocarbon groups, the straight-chain alkyl groups may be bonded to each other to form a ring.

In the above general formula (G1), $R^1$ and $R^2$ each independently represent an alkyl group having 1 to 4 carbon atoms. Note that $R^1$ and $R^2$ may be bonded to each other to form a ring. $R^3$ represents an alkyl group having 1 to 4 carbon atoms, and u is an integer of 0 to 4.

The organic compound of one embodiment of the present invention can also be represented by the following general formulae (G2) to (G4).

[Chemical Formula 5]

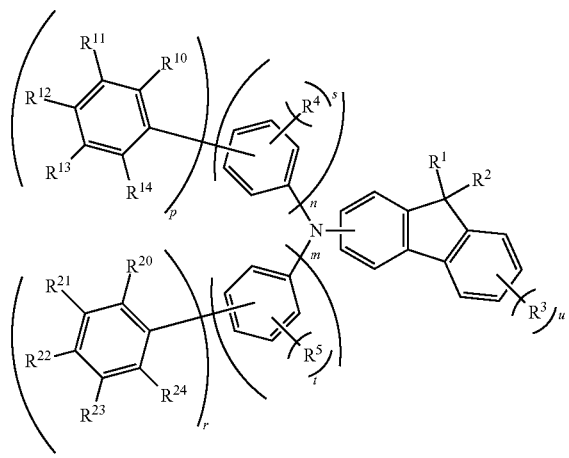

(G2)

Note that in the general formula (G2), n, m, p, and r each independently represent 1 or 2 and s, t, and u each independently represent an integer of 0 to 4. In addition, n+p and m+r are each independently 2 or 3. It is preferable that s, t, and u be each independently 0.

In the general formula (G2), $R^1$, $R^2$, and $R^3$ each independently represent an alkyl group having 1 to 4 carbon atoms, and $R^4$ and $R^5$ each independently represent hydrogen or a hydrocarbon group having 1 to 3 carbon atoms. Examples of the hydrocarbon group having 1 to 3 carbon atoms include a methyl group, an ethyl group, and a propyl group. Examples of the hydrocarbon group having 1 to 4 carbon atoms include a butyl group in addition to the above groups.

Furthermore, $R^{10}$ to $R^{14}$ and $R^{20}$ to $R^{24}$ each independently represent hydrogen or a hydrocarbon group having 1 to 12 carbon atoms each forming a bond only by the sp$^3$ hybrid orbitals. As the hydrocarbon group having 1 to 12 carbon atoms each forming a bond only by the sp$^3$ hybrid orbitals, an alkyl group having 3 to 8 carbon atoms or a cycloalkyl group having 6 to 12 carbon atoms is preferable. Specifically, it is possible to use a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a heptyl group, an octyl group, a cyclohexyl group, a 4-methylcyclohexyl group, a cycloheptyl group, a cyclooctyl group, a cyclononyl group, a cyclodecyl group, a decahydronaphthyl group, a cycloundecyl group, a cyclododecyl group, and the like. It is particularly preferable to use a t-butyl group, a cyclohexyl group, or a cyclododecyl group.

Note that the total number of the carbon atoms in $R^{10}$ to $R^{14}$ and $R^{20}$ to $R^{24}$ is greater than or equal to 8, and the total number of the carbon atoms in at least either $R^{10}$ to $R^{14}$ or $R^{20}$ to $R^{24}$ is greater than or equal to 6.

In the general formula (G2), in the case where n is 2, the kind and number of substituents and the position of bonds in one phenylene group may be the same as or different from those of the other phenylene group. In the case where m is 2, the kind and number of substituents and the position of bonds in one phenylene group may be the same as or different from those of the other phenylene group. In the case where p is 2, the kind and number of substituents and the position of bonds in one phenyl group may be the same as or different from those of the other phenyl group. In the case where r is 2, the kind and number of substituents and the position of bonds in one phenylene group may be the same as or different from those of the other phenylene group.

Furthermore, in the case where s is an integer of 2 to 4, $R^4$s may be the same or different. In the case where t is an integer of 2 to 4, $R^5$s may be the same or different. In the case where u is an integer of 2 to 4, $R^3$s may be the same or different. Note that $R^1$ and $R^2$ may be bonded to each other to form a ring, and adjacent groups among $R^4$, $R^5$, $R^{10}$ to $R^{14}$, and $R^{20}$ to $R^{24}$ may be bonded to each other to form a ring.

[Chemical Formula 6]

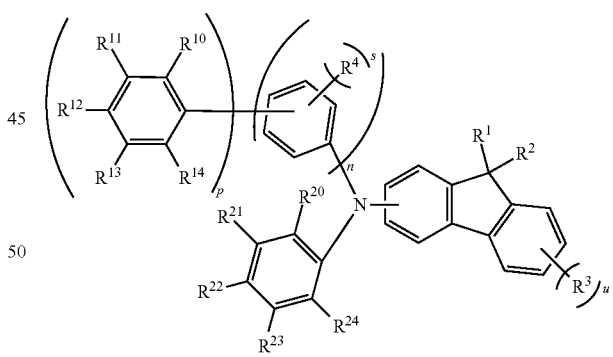

(G3)

In the general formula (G3), $R^1$, $R^2$, and $R^3$ each independently represent an alkyl group having 1 to 4 carbon atoms, and $R^4$ represents hydrogen or a hydrocarbon group having 1 to 3 carbon atoms. Examples of the hydrocarbon group having 1 to 3 carbon atoms include a methyl group, an ethyl group, and a propyl group. Examples of the hydrocarbon group having 1 to 4 carbon atoms include a butyl group in addition to the above groups.

Note that n and p each independently represent 1 or 2, and s and u each independently represent an integer of 0 to 4. Note that n+p is 2 or 3. Note that s and u are each independently 0.

$R^{10}$ to $R^{14}$ and $R^{20}$ to $R^{24}$ each independently represent hydrogen or a hydrocarbon group having 1 to 12 carbon atoms each forming a bond only by the sp³ hybrid orbitals. As the hydrocarbon group having 1 to 12 carbon atoms each forming a bond only by the sp³ hybrid orbitals, an alkyl group having 3 to 8 carbon atoms or a cycloalkyl group having 6 to 12 carbon atoms is preferable. Specifically, it is possible to use a propyl group, a butyl group, a pentyl group, a hexyl group, an octyl group, a cyclohexyl group, a cycloheptyl group, a cyclooctyl group, a cyclononyl group, a cyclodecyl group, a cycloundecyl group, a cyclododecyl group, and the like. It is particularly preferable to use a t-butyl group, a cyclohexyl group, or a cyclododecyl group.

Note that the total number of the carbon atoms in $R^{10}$ to $R^{14}$ and $R^{20}$ to $R^{24}$ is greater than or equal to 8, and the total number of the carbon atoms in at least either $R^{10}$ to $R^{14}$ or $R^{20}$ to $R^{24}$ is greater than or equal to 6.

Note that in the case where n is 2, the kind and number of substituents and the position of bonds in one phenylene group may be the same as or different from those of the other phenylene group. In the case where p is 2, the kind and number of substituents and the position of bonds in one phenyl group may be the same as or different from those of the other phenyl group. Furthermore, in the case where s is an integer of 2 to 4, $R^4$s may be the same or different. In the case where u is an integer of 2 to 4, $R^3$s may be the same or different. Note that $R^1$ and $R^2$ may be bonded to each other to form a ring, and adjacent groups among $R^4$, $R^{10}$ to $R^{14}$, and $R^{20}$ to $R^{24}$ may be bonded to each other to form a ring.

[Chemical Formula 7]

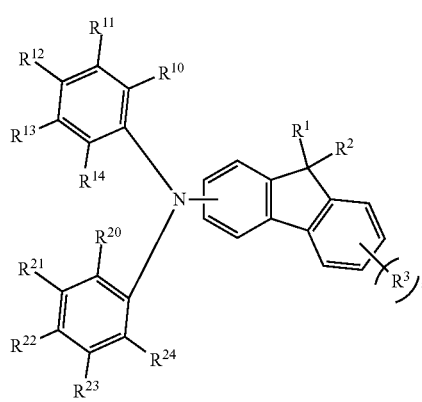

(G4)

In the general formula (G4), u is an integer of 0 to 4. Note that u is preferably 0.

Furthermore, $R^{10}$ to $R^{14}$ and $R^{20}$ to $R^{24}$ each independently represent hydrogen or a hydrocarbon group having 1 to 12 carbon atoms each forming a bond only by the sp³ hybrid orbitals. As the hydrocarbon group having 1 to 12 carbon atoms each forming a bond only by the sp³ hybrid orbitals, an alkyl group having 3 to 8 carbon atoms or a cycloalkyl group having 6 to 12 carbon atoms is preferable. Specifically, it is possible to use a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a heptyl group, an octyl group, a cyclohexyl group, a 4-methylcyclohexyl group, a cycloheptyl group, a cyclooctyl group, a cyclononyl group, a cyclodecyl group, a decahydronaphthyl group, a cycloundecyl group, a cyclododecyl group, and the like. It is particularly preferable to use a t-butyl group, a cyclohexyl group, or a cyclododecyl group.

Note that the total number of the carbon atoms in $R^{10}$ to $R^{14}$ and $R^{20}$ to $R^{24}$ is greater than or equal to 8, and the total number of the carbon atoms in at least either $R^{10}$ to $R^{14}$ or $R^{20}$ to $R^{24}$ is greater than or equal to 6.

In addition, $R^1$, $R^2$, and $R^3$ each independently represent an alkyl group having 1 to 4 carbon atoms. Note that in the case where u is an integer of 2 to 4, $R^3$s may be the same or different. Note that $R^1$ and $R^2$ may be bonded to each other to form a ring, and adjacent groups among $R^{10}$ to $R^{14}$ and $R^{20}$ to $R^{24}$ may be bonded to each other to form a ring.

In the general formulae (G2) to (G4), it is preferable that $R^{10}$ to $R^{14}$ and $R^{20}$ to $R^{24}$ be each any of hydrogen, a tert-butyl group, and a cyclohexyl group to lower the refractive index. In addition, in the general formulae (G2) to (G4), at least three of $R^{10}$ to $R^{14}$ and at least three of $R^{20}$ to $R^{24}$ are preferably hydrogen not to lower the carrier-transport property.

Furthermore, it is preferable that $R^{10}$, $R^{11}$, $R^{13}$, $R^{14}$, $R^{20}$, $R^{21}$, $R^{23}$, and $R^{24}$ be each hydrogen and $R^{12}$ and $R^{22}$ be each a cyclohexyl group.

It is also preferable that $R^{10}$, $R^{12}$, $R^{14}$, $R^{20}$, $R^{21}$, $R^{23}$, and $R^{24}$ be each hydrogen, $R^{11}$ and $R^{13}$ be each a tert-butyl group, and $R^{22}$ be a cyclohexyl group.

It is also preferable that $R^{10}$, $R^{12}$, $R^{14}$, $R^{20}$, $R^{22}$, and $R^{24}$ be each hydrogen, and $R^{11}$, $R^{13}$, R, and $R^{23}$ be each a tert-butyl group.

The organic compound of one embodiment of the present invention with the above-described structure has a hole-transport property and a low refractive index, and thus can be effectively used for the hole-transport layer 112. Furthermore, a mixed film of the organic compound of one embodiment of the present invention and an acceptor substance can be used as the hole-injection layer 111. Furthermore, an organic EL device using the organic compound has a hole-transport layer or a hole-injection layer with a low refractive index, and thus can be a light-emitting device having high emission efficiency, i.e., high external quantum efficiency, high current efficiency, and a high blue index. Furthermore, the organic EL device uses the monoamine compound as the organic compound, so that the organic EL device can be a light-emitting device having a long lifetime.

In addition, the above organic compound can be used as a host material. Furthermore, the hole-transport material and an electron-transport material may be deposited by co-evaporation so that an exciplex is formed of the electron-transport material and the hole-transport material. The exciplex having an appropriate emission wavelength allows efficient energy transfer to the light-emitting material, achieving a light-emitting device with a high efficiency and a long lifetime.

Next, an example of a synthesis method of the above-described monoamine compound is described. Note that the following method is just an example of a synthesis method of the present invention, and the synthesis method is not limited thereto.

[Chemical Formula 8]

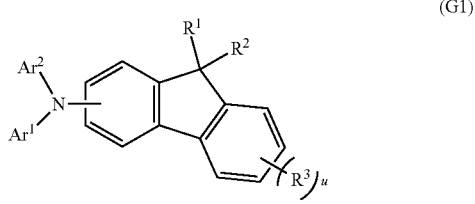

(G1)

As shown in the following synthesis scheme, 9,9-disubsituted-9H-fluorenylamine A and organic halides (X1) and (X2) are coupled using a metal catalyst, a metal, or a metal compound in the presence of a base, so that the organic compound represented by the general formula (G1) can be obtained.

[Chemical Formula 9]

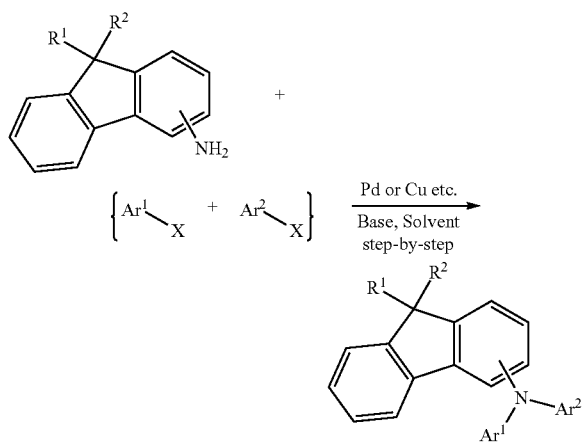

In the above synthesis scheme, $Ar^1$ and $Ar^2$ each independently represent a substituent with a substituted or unsubstituted benzene ring or a substituent in which two or three benzene rings are bonded to each other. Note that one or both of $Ar^1$ and $Ar^2$ have one or more hydrocarbon group(s) having 1 to 12 carbon atoms each forming a bond only by the $sp^3$ hybrid orbitals, the total number of the carbon atoms included in the hydrocarbon group(s) bonded to $Ar^1$ and $Ar^2$ is greater than or equal to 8, and the total number of the carbon atoms included in the hydrocarbon group(s) bonded to at least one of $Ar^1$ and $Ar^2$ is greater than or equal to 6. Note that in the case where a plurality of straight-chain alkyl groups each having one or two carbon atoms are bonded to $Ar^1$ or $Ar^2$ as the hydrocarbon groups, the straight-chain alkyl groups may be bonded to each other to form a ring. In addition, in the general formula (G1), $R^1$ and $R^2$ each independently represent an alkyl group having 1 to 4 carbon atoms. Note that $R^1$ and $R^2$ may be bonded to each other to form a ring. $R^3$ represents an alkyl group having 1 to 4 carbon atoms and u is an integer of 0 to 4. Furthermore, X represents either a halogen element or a triflate group.

In the case where the above synthesis reaction is performed using a Buchwald-Hartwig reaction, X represents a halogen element or a triflate group. As the halogen element, iodine, bromine, or chlorine is preferable. In this reaction, a palladium catalyst including a palladium complex or a palladium compound such as bis(dibenzylideneacetone)palladium(0) or allylpalladium(II) chloride dimer and a ligand that coordinates to the palladium complex or the palladium compound, such as tri(tert-butyl)phosphine, di-tert-butyl(1-methyl-2,2-diphenylcyclopropyl)phosphine, or tricyclohexylphosphine, is used. As the base, an organic base such as sodium tert-butoxide, an inorganic base such as cesium carbonate, and the like can be used. In the case where a solvent is used, toluene, xylene, 1,3,5-trimethylbenzene (mesitylene), or the like can be used. Furthermore, when the reaction temperature is set higher than or equal to 120° C., the reaction between the aryl group including a halogen element (e.g., chlorine) with a small periodic number and an amine proceeds in a short time in a high yield; thus, it is preferable to use xylene or 1,3,5-trimethylbenzene having high heat resistance.

When the above synthesis is performed by the Ullmann reaction, X represents a halogen element. As the halogen element, iodine, bromine, or chlorine is preferable. As a catalyst, copper or a copper compound is used. Note that copper(I) iodide or copper(II) acetate is preferably used. Examples of the base include an inorganic base such as potassium carbonate. As a solvent, 1,3-dimethyl-3,4,5,6-tetrahydro-2(1H)-pyrimidinone (DMPU), N-methyl-2-pyrrolidone (NMP), toluene, xylene, 1,3,5-trimethylbenzene, or the like. In the Ullmann reaction, when the reaction temperature is 100° C. or higher, an objective substance can be obtained in a shorter time in a higher yield; therefore, it is preferable to use DMPU, NMP, or 1,3,5-trimethylbenzene each having a high boiling point. In addition, since the reaction temperature is further preferably 150° C. or higher, DMPU is more preferably used.

In the above manner, the organic compound represented by the general formula (G1) can be synthesized.

Embodiment 3

In this embodiment, a display device including the light-emitting apparatus described in Embodiment 1 will be described.

Figure 7A:
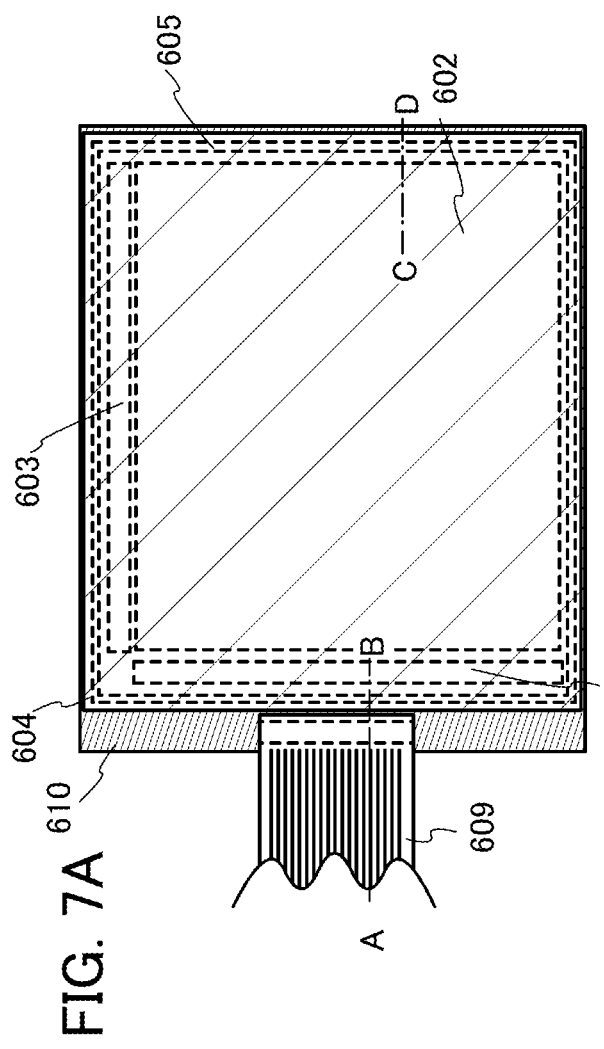
FIGS. 7A and 7B are conceptual diagrams of an active matrix light-emitting apparatus.
Figure 7B:
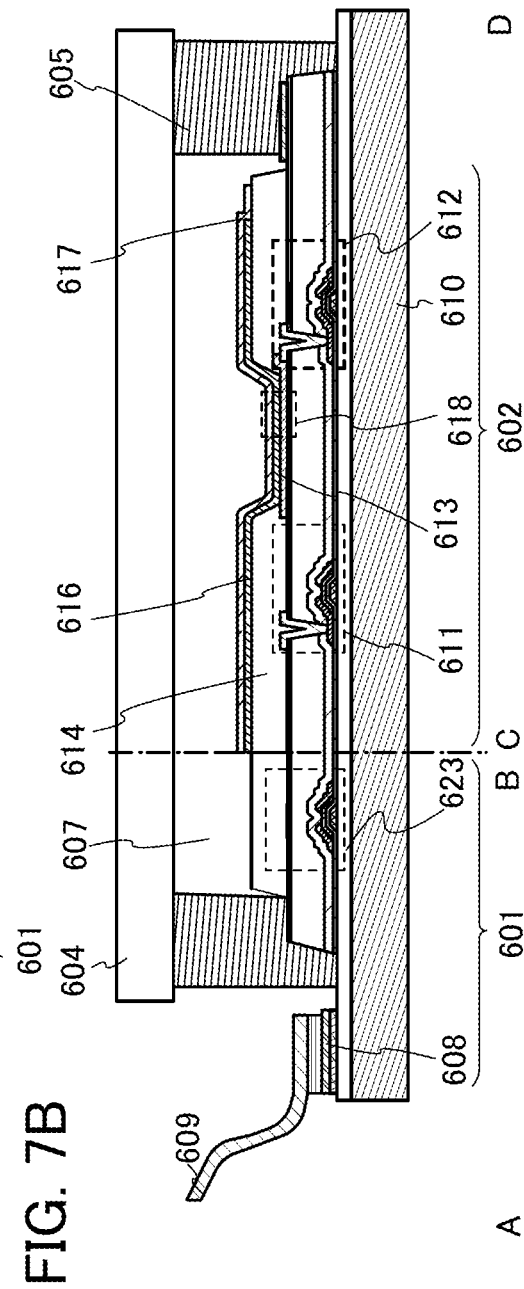

In this embodiment, the display device manufactured using the light-emitting apparatus described in Embodiment 1 is described with reference to FIGS. 7A and 7B. Note that FIG. 7A is a top view of the display device and FIG. 7B is a cross-sectional view taken along the lines A-B and C-D in FIG. 7A. This display device includes a driver circuit portion (source line driver circuit) 601, a pixel portion 602, and a driver circuit portion (gate line driver circuit) 603, which are to control the light emission of a light-emitting apparatus and illustrated with dotted lines. A reference numeral 604 denotes a sealing substrate; 605, a sealing material; and 607, a space surrounded by the sealing material 605.

A lead wiring 608 is a wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in the present specification includes, in its category, not only the light-emitting apparatus itself but also the light-emitting apparatus provided with the FPC or the PWB.

Next, a cross-sectional structure is described with reference to FIG. 7B. The driver circuit portions and the pixel portion are formed over an element substrate 610. Here, the source line driver circuit 601, which is a driver circuit portion, and one pixel in the pixel portion 602 are illustrated.

The element substrate 610 may be a substrate containing glass, quartz, an organic resin, a metal, an alloy, or a semiconductor or a plastic substrate formed of fiber reinforced plastic (FRP), polyvinyl fluoride (PVF), polyester, or acrylic.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case degradation of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably includes at least indium (In) or zinc (Zn). Further preferably, the oxide semiconductor includes an oxide represented by an In-M-Zn-based oxide (M represents a metal such as Al, Ti, Ga, Ge, Y, Zr, Sn, La, Ce, or Hf).

An oxide semiconductor that can be used in one embodiment of the present invention is described below.

An oxide semiconductor (metal oxide) is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer including indium and oxygen (hereinafter an In layer) and a layer including the element M, zinc, and oxygen (hereinafter an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, A) layer.

The CAAC-OS is an oxide semiconductor with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of an oxide semiconductor. This means that the CAAC-OS is an oxide semiconductor having small amounts of impurities and defects (e.g., oxygen vacancies (also referred to as Vo)). Thus, an oxide semiconductor including the CAAC-OS is physically stable. Accordingly, the oxide semiconductor including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an indium-gallium-zinc oxide (hereinafter IGZO) that is an oxide semiconductor containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

A cloud-aligned composite OS (CAC-OS) may be used as an oxide semiconductor other than the above.

A CAC-OS has a conducting function in part of the material and has an insulating function in another part of the material; as a whole, the CAC-OS has a function of a semiconductor. Note that in the case where the CAC-OS is used in an active layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS. In the CAC-OS, separation of the functions can maximize each function.

Furthermore, the CAC-OS includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS includes components having different bandgaps. For example, the CAC-OS includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS can also be referred to as a matrix composite or a metal matrix composite.

The use of the above-described oxide semiconductor materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics or the like of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the line driver circuit portion 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside the substrate.

The pixel portion 602 includes a plurality of pixels including a switching FET 611, a current controlling FET 612, and an anode 613 electrically connected to a drain of the current controlling FET 612. One embodiment of the present invention is not limited to the structure. The pixel portion 602 may include three or more FETs and a capacitor in combination.

Note that to cover an end portion of the anode 613, an insulator 614 is formed. Here, the insulator 614 can be formed using positive photosensitive acrylic here.

In order to improve the coverage with an EL layer or the like which is formed later, the insulator 614 is formed to have a curved surface with curvature at its upper or lower end portion. For example, in the case where positive photosensitive acrylic is used as a material of the insulator 614, only the upper end portion of the insulator 614 preferably has a curved surface with a curvature radius (0.2 µm to 3 µm). As the insulator 614, either a negative photosensitive resin or a positive photosensitive resin can be used.

An EL layer 616 and a cathode 617 are formed over the anode 613. Here, as a material used for the anode 613, a material having a high work function is desirably used. For example, a single-layer film of an ITO film, an indium tin oxide film including silicon, an indium oxide film including zinc oxide at 2 wt % to 20 wt %, a titanium nitride film, a chromium film, a tungsten film, a Zn film, a Pt film, or the like, a stack of a titanium nitride film and a film including aluminum as its main component, a stack of three layers of a titanium nitride film, a film including aluminum as its main component, and a titanium nitride film, or the like can be used. The stacked-layer structure enables low wiring resistance and favorable ohmic contact, and can function as an anode.

The EL layer 616 is formed by any of a variety of methods such as an evaporation method using an evaporation mask, an ink-jet method, and a spin coating method. The EL layer 616 has the structure described in Embodiment 1. As another material included in the EL layer 616, a low molecular compound or a high molecular compound (including an oligomer or a dendrimer) may be used.

As a material used for the cathode 617, which is formed over the EL layer 616, a material having a low work function (e.g., Al, Mg, Li, and Ca, or an alloy or a compound thereof, such as MgAg, MgIn, or AlLi) is preferably used. In the case where light generated in the EL layer 616 is transmitted through the cathode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the cathode 617.

Note that the light-emitting device is formed with the anode 613, the EL layer 616, and the cathode 617.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case degradation due to influence of moisture can be suppressed.

An epoxy-based resin or glass frit is preferably used for the sealing material 605. It is desirable that such a material not be permeable to moisture or oxygen as much as possible. As the sealing substrate 604, a glass substrate, a quartz substrate, or a plastic substrate formed of fiber reinforced plastic (FRP), polyvinyl fluoride (PVF), polyester, or acrylic can be used.

Although not illustrated in FIGS. 7A and 7B, a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on a surface with a complex uneven shape or upper, side, and lower surfaces of a touch panel.

The light-emitting apparatus in this embodiment is manufactured using the light-emitting apparatus described in Embodiment 1 and thus a display device having favorable characteristic can be obtained. Specifically, since the light-emitting apparatus described in Embodiment 1 has a long lifetime, the display apparatus can have high reliability. Since the display device using the light-emitting apparatus described in Embodiment 1 has high emission efficiency and thus the display apparatus can achieve low power consumption.

Figure 8A:
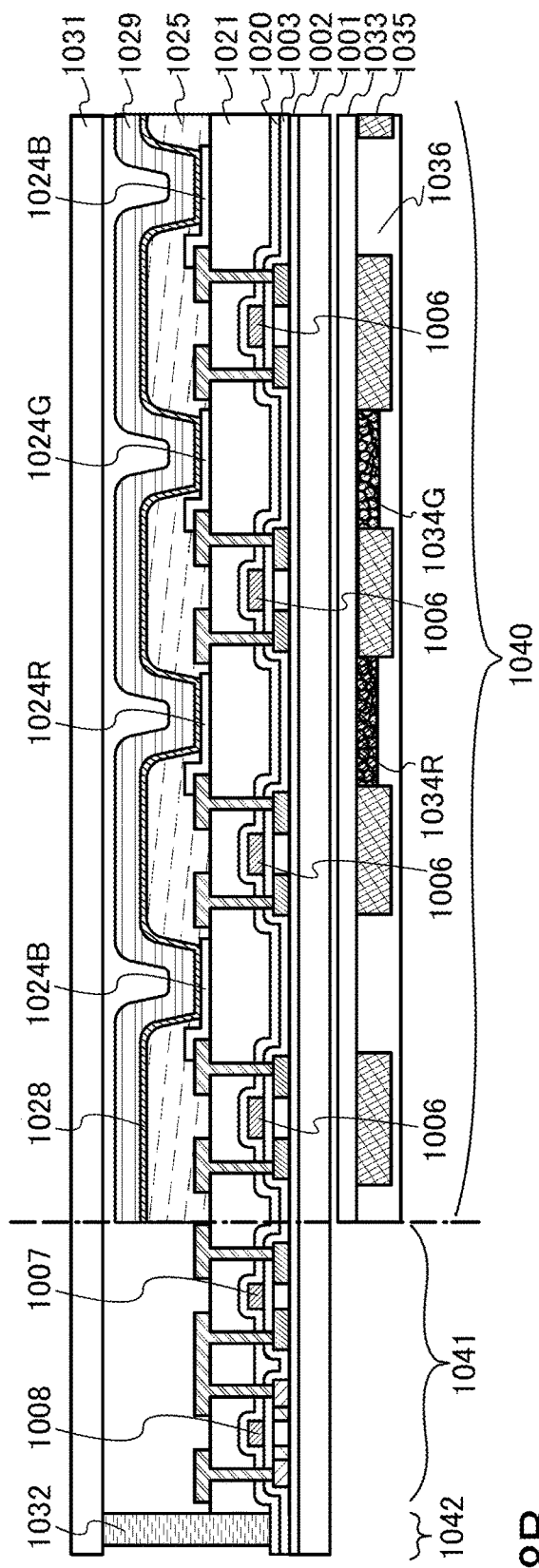
FIGS. 8A and 8B are conceptual diagrams of an active matrix light-emitting apparatuses.
Figure 8B:
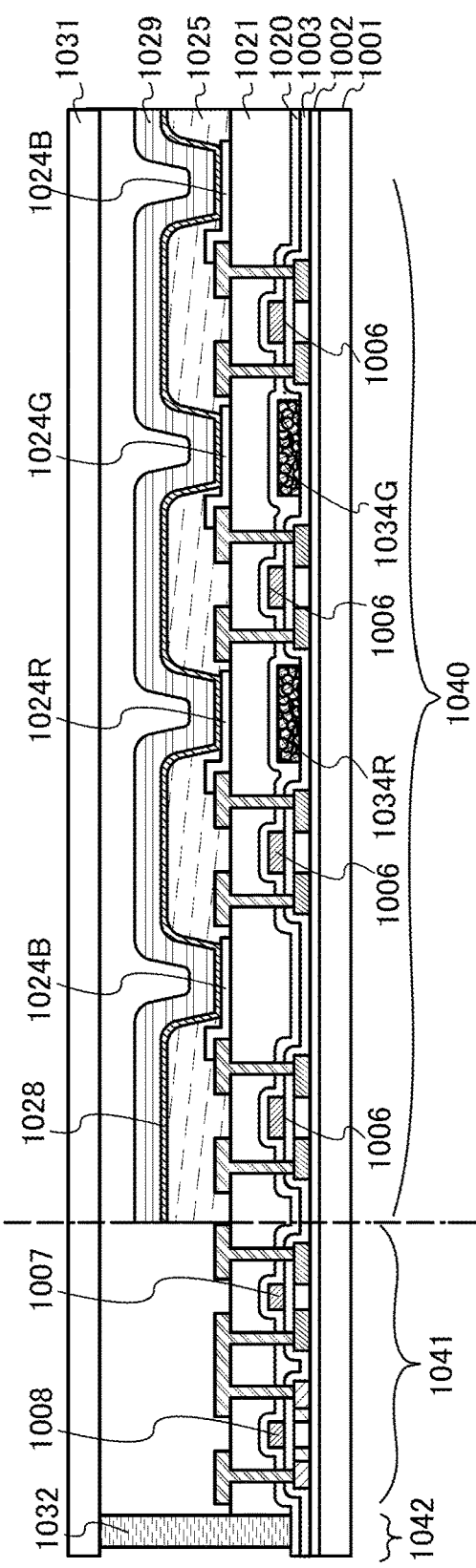

FIGS. 8A and 8B each illustrate an example of a light-emitting apparatus in which full color display is achieved by formation of light-emitting devices exhibiting blue light emission and with the use of color conversion layers. FIG. 8A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024R, 1024G, and 1024B of the light-emitting devices, a partition 1025, an EL layer 1028, a cathode 1029 of the light-emitting devices, a sealing substrate 1031, a sealing material 1032, and the like.

In FIG. 8A, the color conversion layers (a red color conversion layer 1034R and a green color conversion layer 1034G) are provided on a transparent base material 1033. A black matrix 1035 may be additionally provided. The transparent base material 1033 provided with the color conversion layers and the black matrix is aligned and fixed to the substrate 1001. Note that the color conversion layers and the black matrix 1035 may be covered with an overcoat layer 1036.

FIG. 8B illustrates an example in which the color conversion layers (the red color conversion layer 1034R and the green color conversion layer 1034G) are provided between the gate insulating film 1003 and the first interlayer insulating film 1020. As in the structure, the coloring layers may be provided between the substrate 1001 and the sealing substrate 1031.

Figure 9:
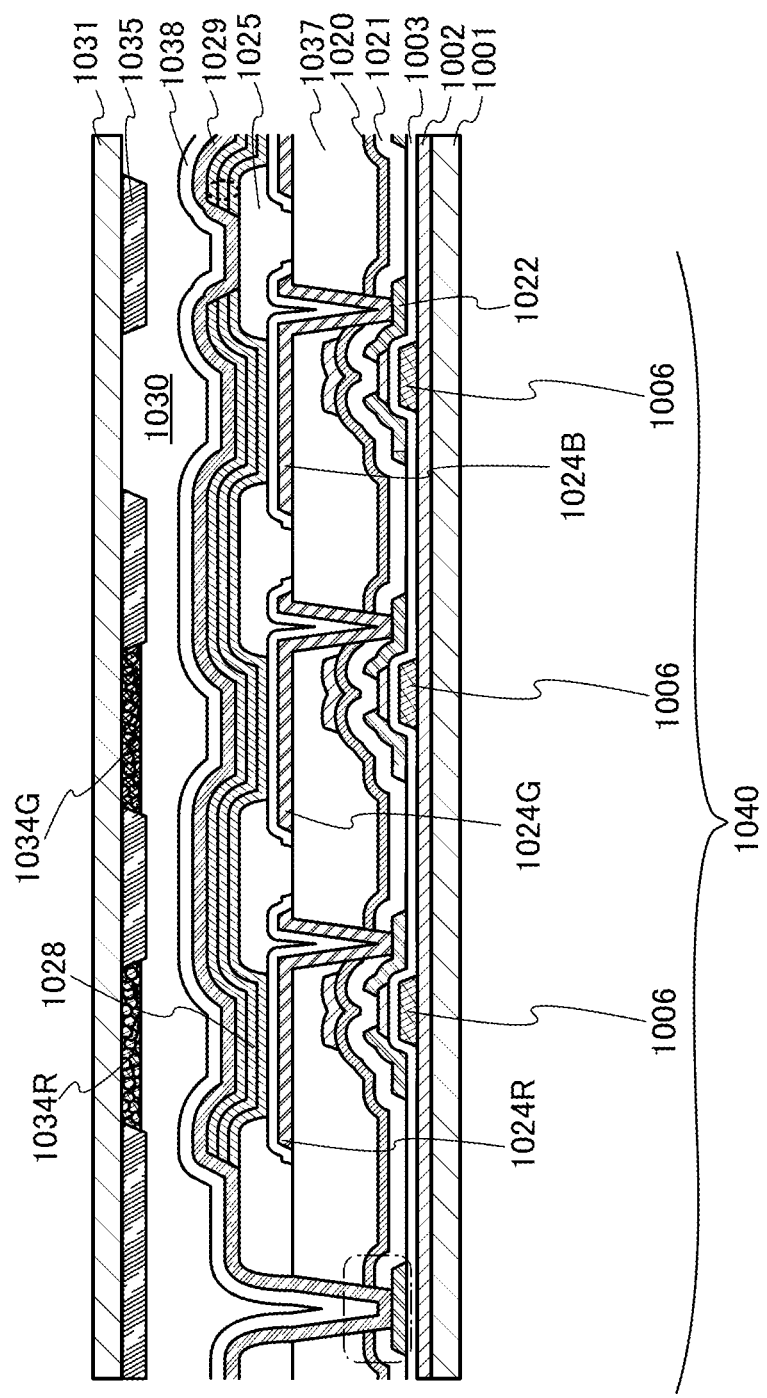
FIG. 9 is a conceptual diagram of an active matrix light-emitting apparatus.

The above-described light-emitting apparatus is a light-emitting apparatus having a structure in which light is extracted from the substrate 1001 side where FETs are formed (a bottom emission structure), but may be a light-emitting apparatus having a structure in which light is extracted from the sealing substrate 1031 side (a top emission structure). FIG. 9 is a cross-sectional view of a light-emitting apparatus having a top emission structure. In this case, a substrate that does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The first electrodes 1024R, 1024G, and 1024B of the light-emitting devices each serve as an apparatus anode here, but may each serve as a cathode. In the case of a light-emitting apparatus having a top emission structure as illustrated in FIG. 9, the first electrodes are preferably reflective electrodes. The EL layer 1028 has a device structure with which blue light emission can be obtained.

In the case of a top emission structure as illustrated in FIG. 9, sealing can be performed with the sealing substrate 1031 on which the color conversion layers (the red color conversion layer 1034R and the green color conversion layer 1034G) are provided. The sealing substrate 1031 may be provided with the black matrix 1035 that is positioned between pixels. The color conversion layers (the red color conversion layer 1034R and the green color conversion layer 1034G) and the black matrix may be covered with the overcoat layer. Note that a light-transmitting substrate is used as the sealing substrate 1031. The color conversion layers (the red color conversion layer 1034R and the green color conversion layer 1034G) may be provided directly on the cathode 1029 (or on a protection film provided over the cathode 1029).

The insulating layer 1038 serves as a protective layer that prevents impurities from diffusing into the light-emitting devices. As a material of the insulating layer 1038, an oxide, a nitride, a fluoride, a sulfide, a ternary compound, a metal, a polymer, or the like can be used. For example, aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be used. Silicon nitride, silicon oxide, silicon nitride oxide, or the like is preferably used. Note that the insulating layer 1038 is not necessarily formed.

A space 1030 may be filled with a resin. The refractive index of the resin is preferably 1.4 to 2.0, more preferably 1.7 to 1.9. A layer with a relatively high refractive index between the transparent electrode and the color conversion layer can reduce losses of light due to the thin film mode, so that the light-emitting devices can have higher efficiency.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided, a charge generation layer is provided between the EL layers, and each EL layer includes a plurality of light-emitting layers or a single light-emitting layer.

In the light-emitting apparatus having a top emission structure, a microcavity structure can be favorably employed. A light-emitting device with a microcavity structure is formed with the use of a reflective electrode as the anode and a transflective electrode as the cathode. The light-emitting device with a microcavity structure includes at least an EL layer between the reflective electrode and the transflective electrode, which includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the light-emitting device, by changing thicknesses of the transparent conductive film, the composite material, the carrier-transport material, and the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or larger and λ is a wavelength of color to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided, a charge generation layer is provided between the EL layers, and each EL layer includes a plurality of light-emitting layers or a single light-emitting layer.

Embodiment 4

In this embodiment, examples of electronic devices each including the light-emitting apparatus of one embodiment of the present invention will be described. The light-emitting apparatus of one embodiment of the present invention has low power consumption and high reliability. As a result, the electronic devices described in this embodiment can each have low power consumption and high reliability.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

Figure 10A:
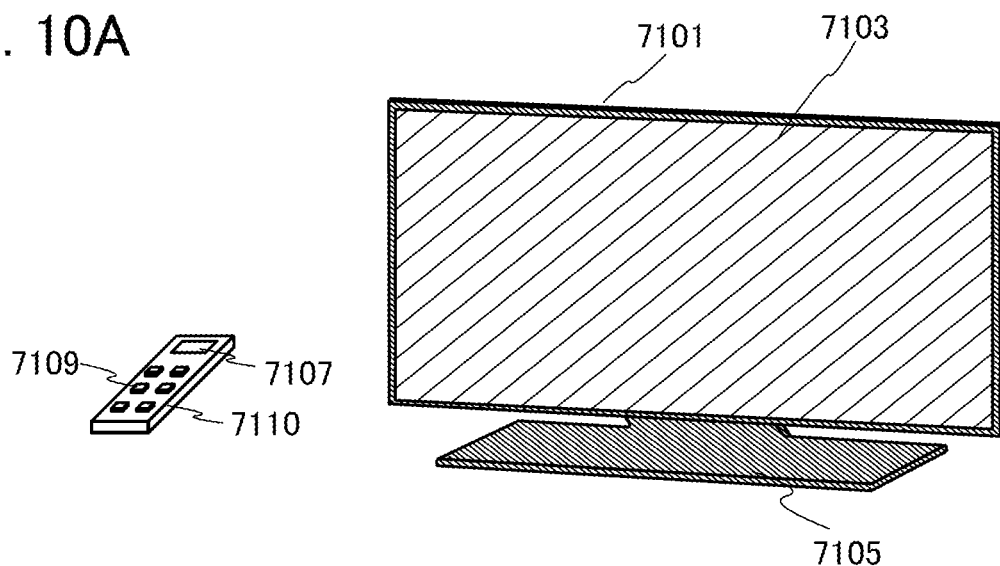
Figure 10A:
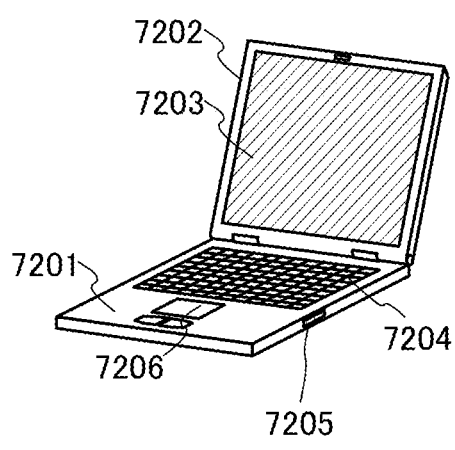
Figure 10A:
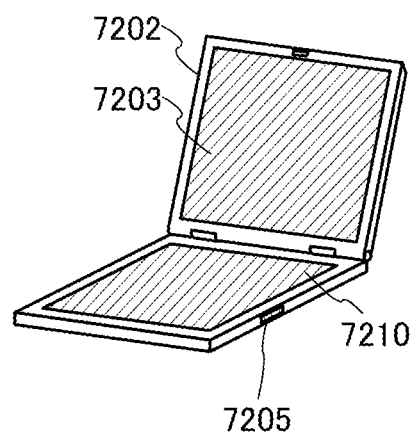

FIG. 10A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting devices are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 10B1 illustrates a computer, which includes a main body 7201, a housing 7202, a display portion 7203, a keyboard 7204, an external connection port 7205, a pointing device 7206, and the like. Note that this computer is manufactured using the light-emitting devices and arranged in a matrix in the display portion 7203. The computer illustrated in FIG. 10B1 may have a structure illustrated in FIG. 10B2. A computer illustrated in FIG. 10B2 is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 10C:
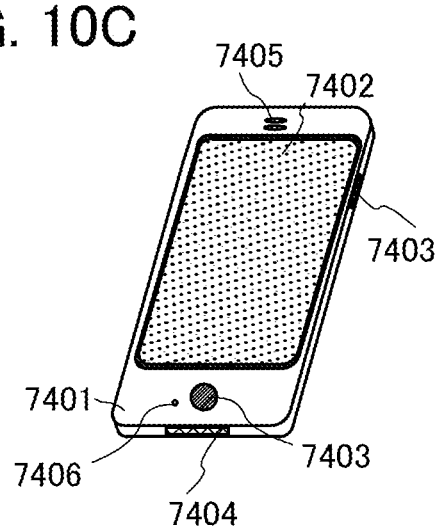

FIG. 10C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 including the light-emitting apparatuses described in Embodiment 1 and arranged in a matrix.

When the display portion 7402 of the portable terminal illustrated in FIG. 10C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting information such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Note that the structure described in this embodiment can be combined with any of the structures described in Embodiments 1 to 3 as appropriate.

As described above, the application range of the light-emitting apparatus of one embodiment of the present invention is wide so that this light-emitting apparatus can be applied to electronic devices in a variety of fields. By using the light-emitting apparatus of one embodiment of the present invention, an electronic device with low power consumption can be obtained.

Figure 11A:
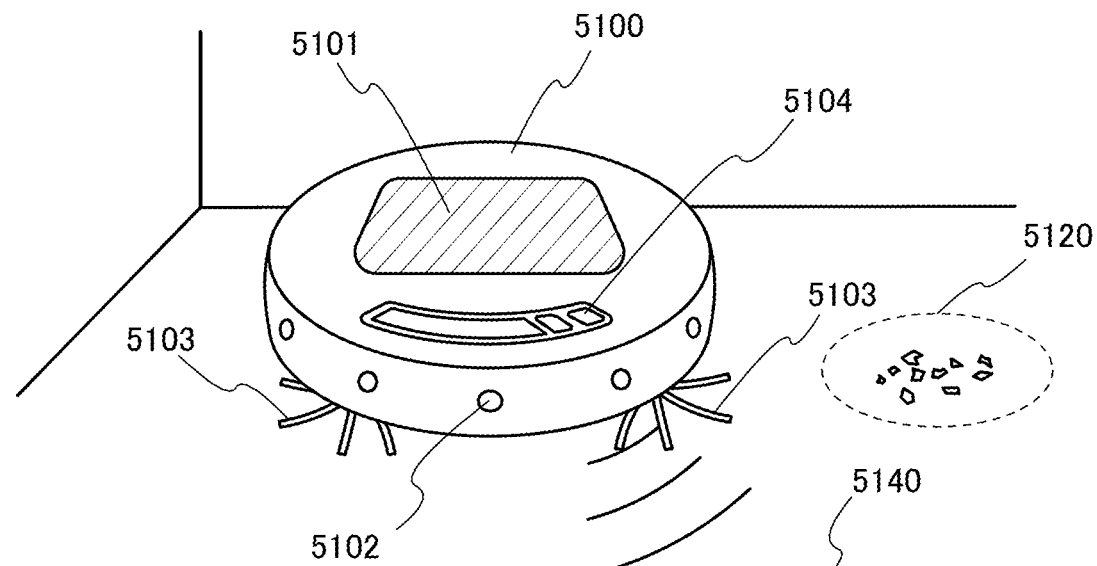
FIGS. 11A to 11C illustrate electronic devices

FIG. 11A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 11B:
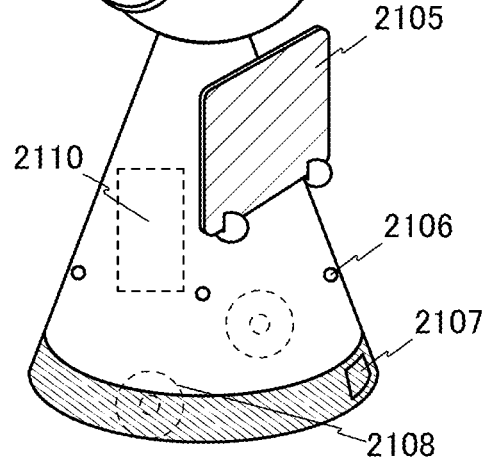

A robot 2100 illustrated in FIG. 11B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 11C:
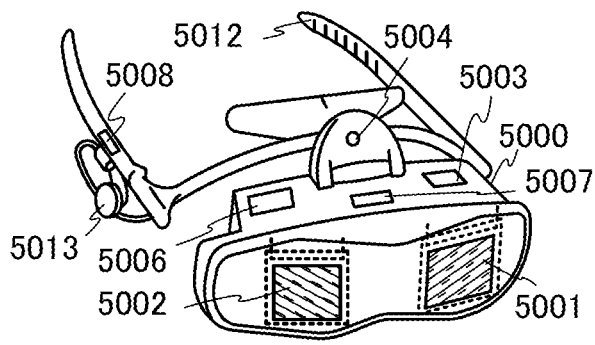

FIG. 11C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 12:
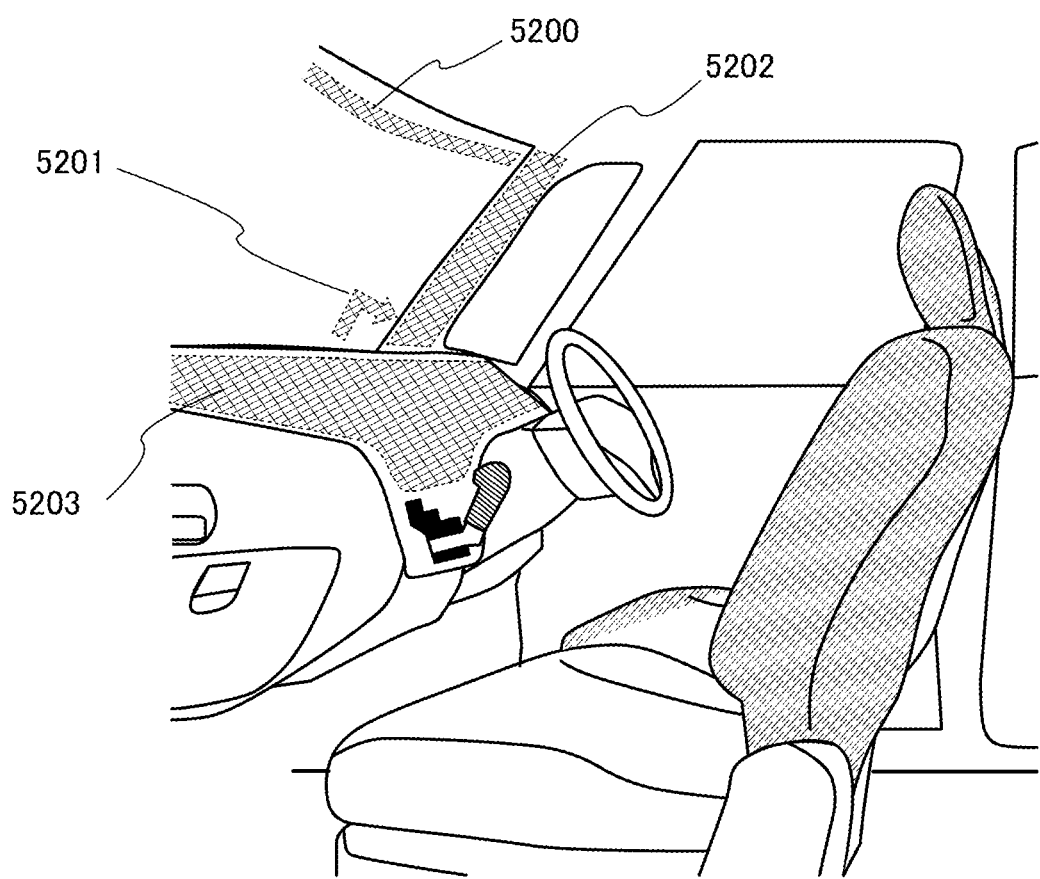
FIG. 12 illustrates in-vehicle display devices and lighting devices.

The light-emitting apparatus of one embodiment of the present invention can also be used for an automobile windshield or an automobile dashboard. FIG. 12 illustrates one mode in which the light-emitting apparatuses of one embodiment of the present invention are used for an automobile windshield and an automobile dashboard. Display regions 5200 to 5203 each include the light-emitting apparatus of one embodiment of the present invention.

The display regions 5200 and 5201 are display devices which are provided in the automobile windshield and in which the light-emitting apparatuses of one embodiment of the present invention are incorporated. The light-emitting devices can each be formed into what is called a see-through display device, through which the opposite side can be seen, by including an anode and a cathode formed of electrodes having a light-transmitting property. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

A display device incorporating the light-emitting apparatus of one embodiment of the present invention is provided in the display region 5202 in a pillar portion. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Images that compensate for the areas which a driver cannot see enable the driver to ensure safety easily and comfortably.

The display region 5203 can also provide a variety of kinds of information such as navigation data, speed, and the number of revolutions. The content or layout of the display can be changed freely by a user as appropriate. Note that such information can also be displayed on the display regions 5200 to 5203. The display regions 5200 to 5203 can also be used as lighting devices.

Figure 13A:
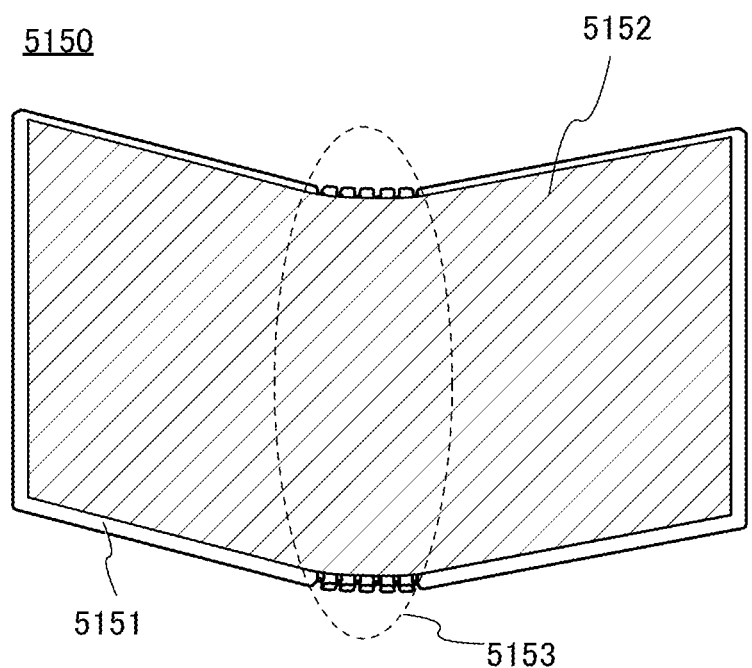
FIGS. 13A and 13B illustrate an electronic device.
Figure 13B:
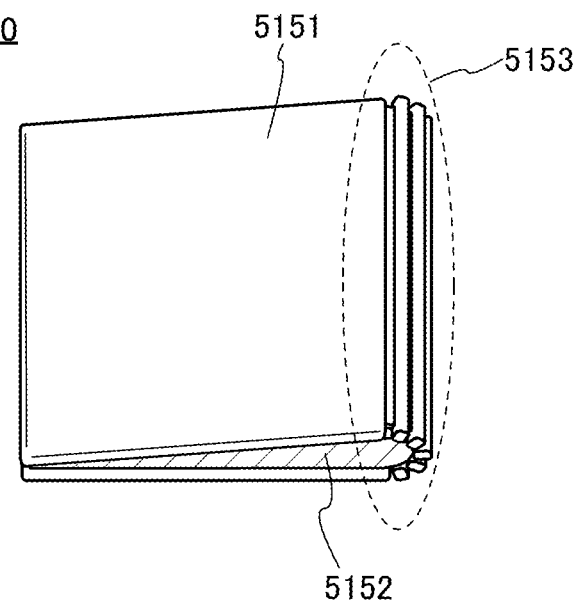

FIGS. 13A and 13B illustrate a foldable portable information terminal 5150. The foldable portable information terminal 5150 includes a housing 5151, a display region 5152, and a bend portion 5153. FIG. 13A illustrates the portable information terminal 5150 that is opened. FIG. 13B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 14A:
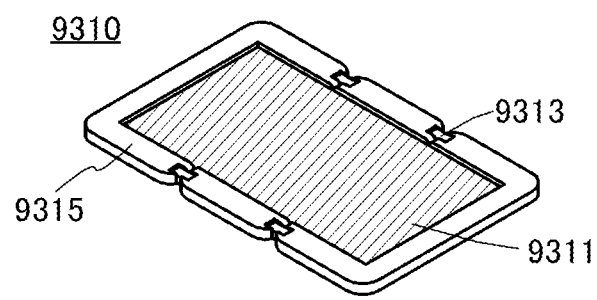
FIGS. 14A to 14C illustrate an electronic device.
Figure 14B:
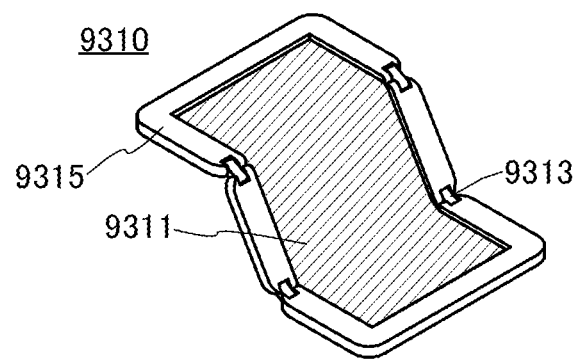
Figure 14C:
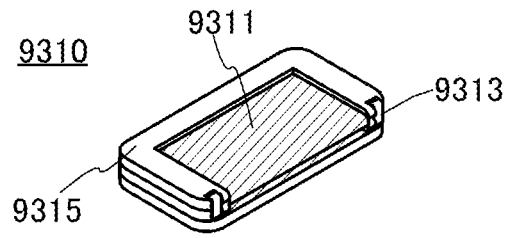
Figure 15:
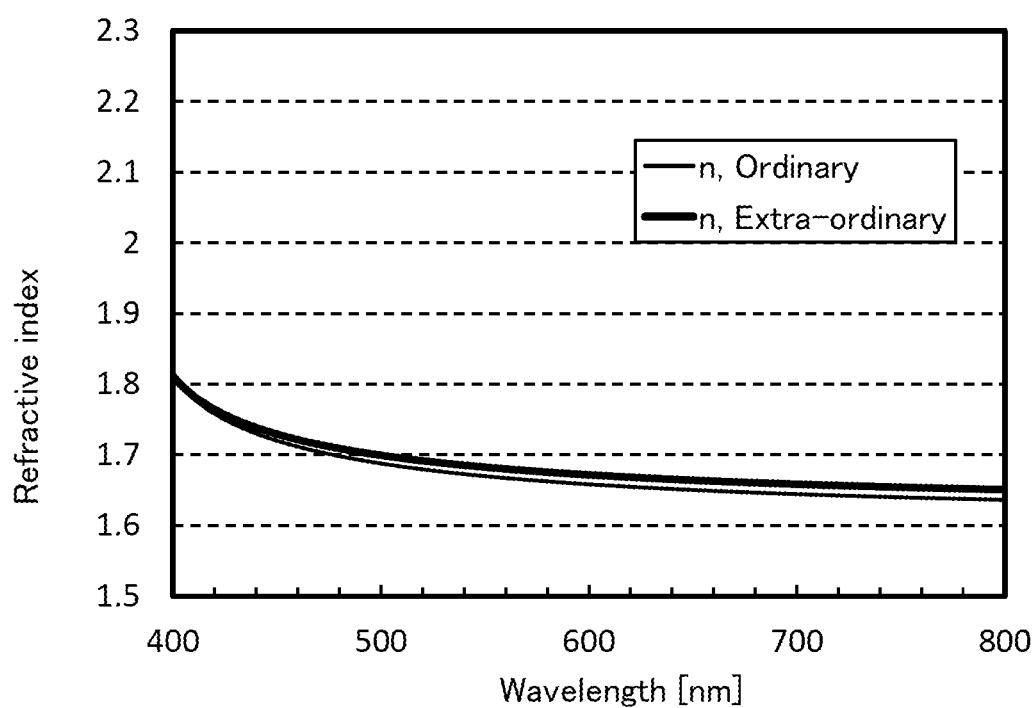
FIG. 15 shows measurement data of the refractive index of dchPAF.
Figure 16:
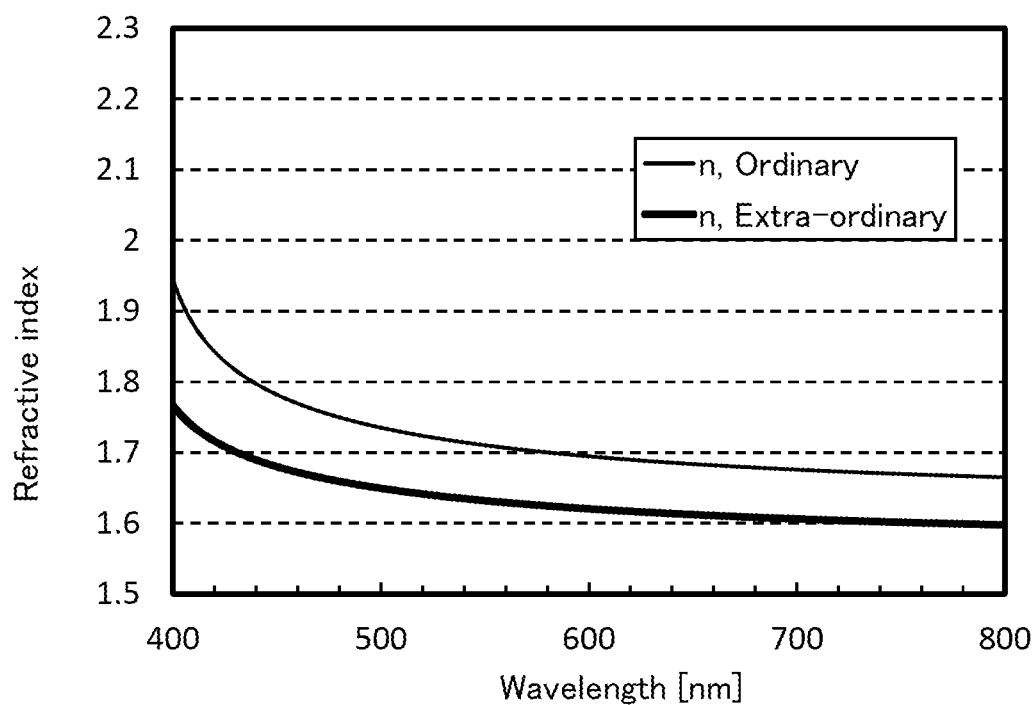
FIG. 16 shows measurement data of the refractive index of chBichPAF.
Figure 17:
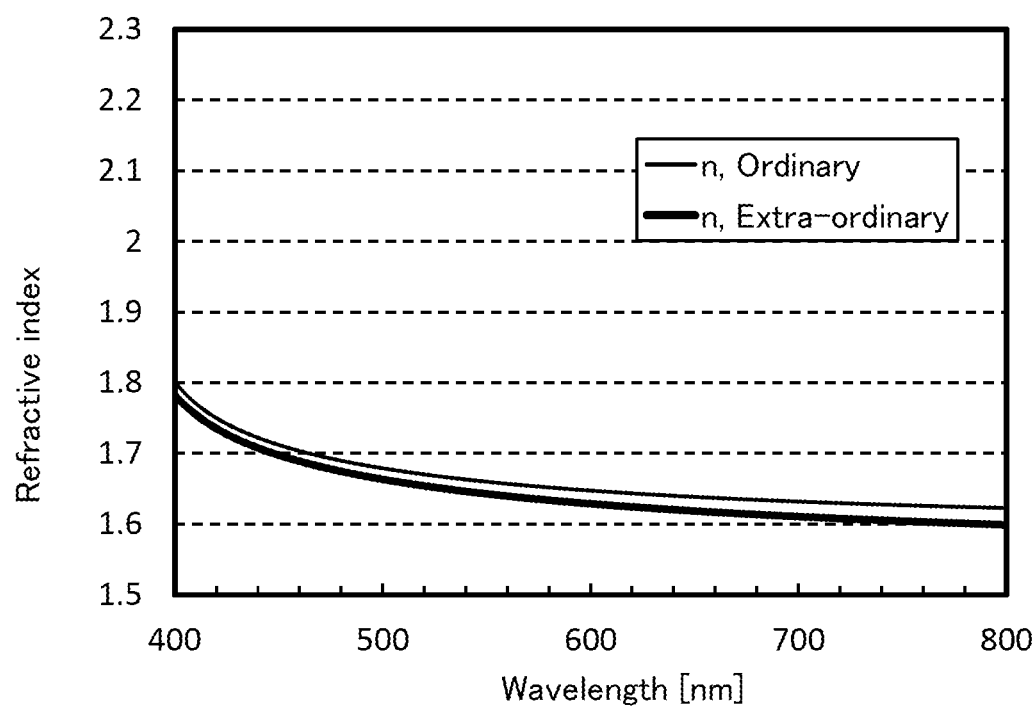
FIG. 17 shows measurement data of the refractive index of dchPASchF.
Figure 18:
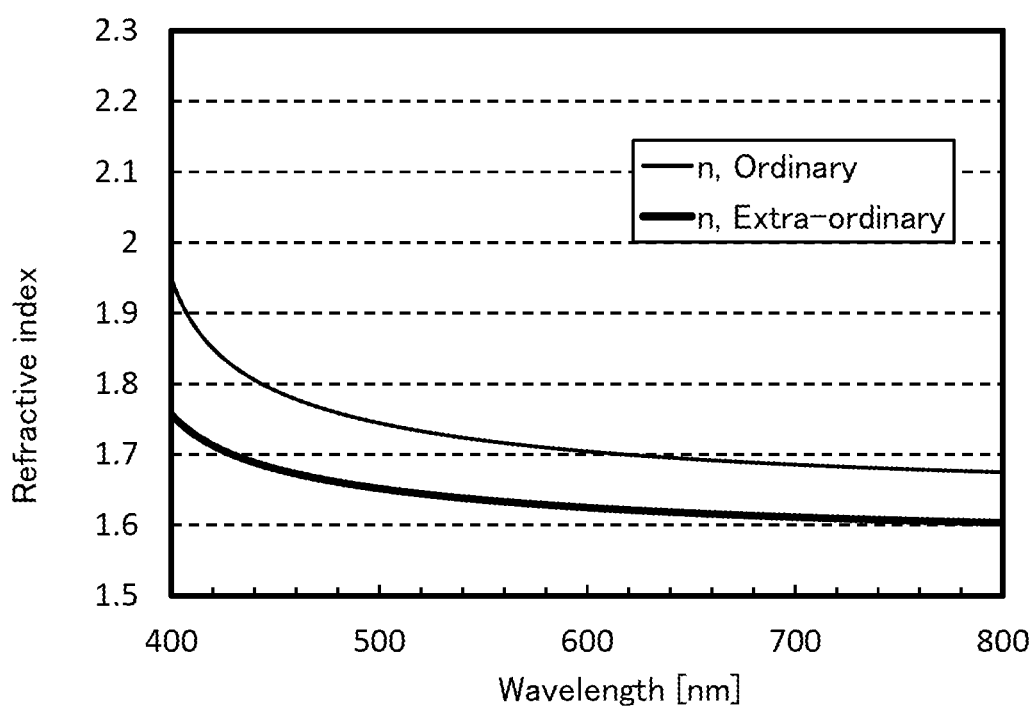
FIG. 18 shows measurement data of the refractive index of chBichPASchF.
Figure 19:
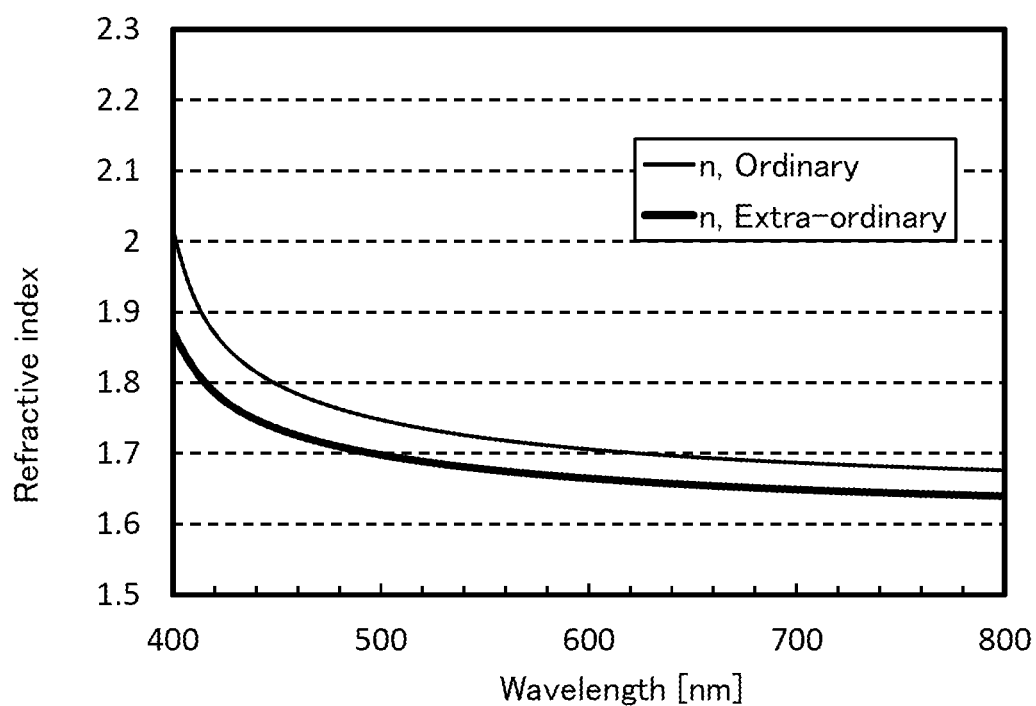
FIG. 19 shows measurement data of the refractive index of SchFB1chP.
Figure 20:
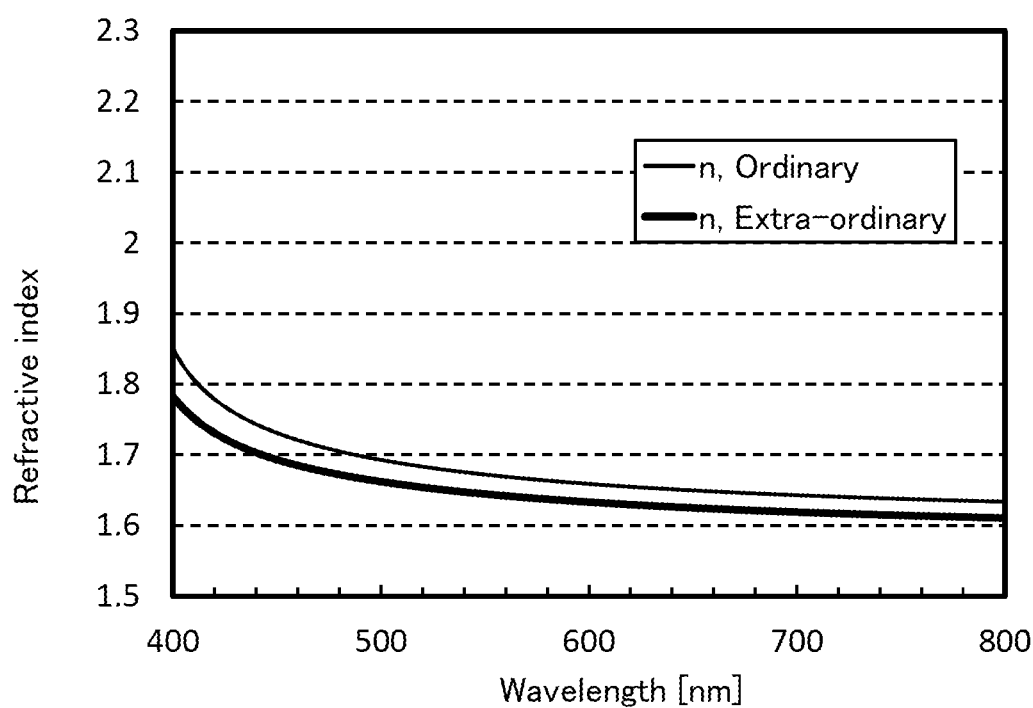
FIG. 20 shows measurement data of the refractive index of mmtBuBichPAF.
Figure 21:
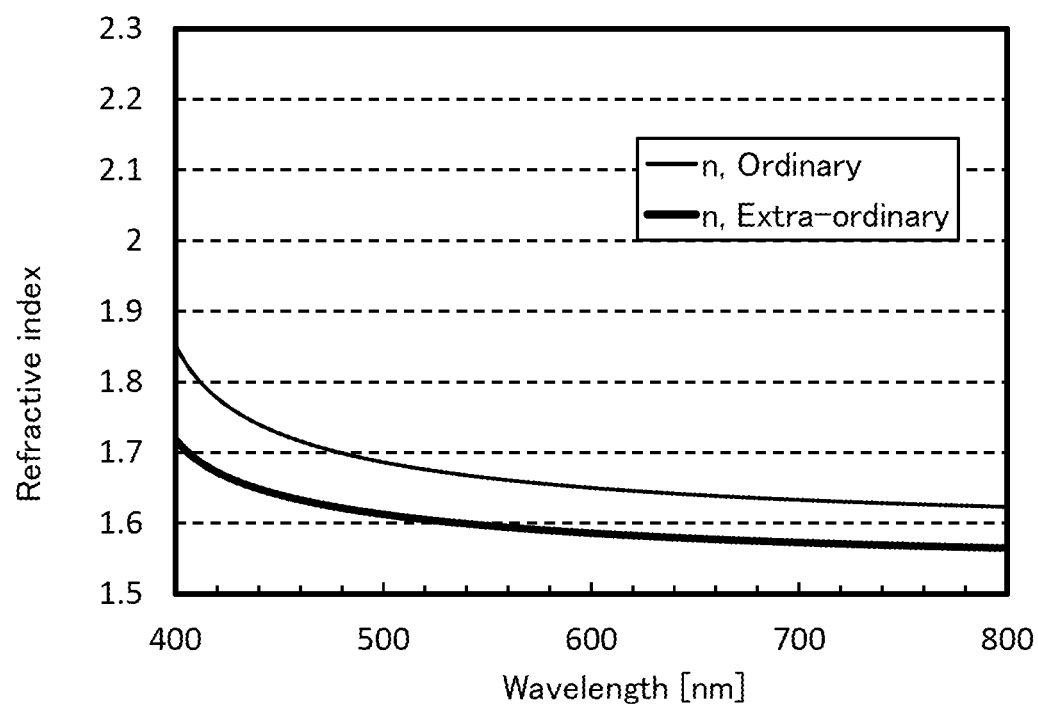
FIG. 21 shows measurement data of the refractive index of dmmtBuBiAF.
Figure 22:
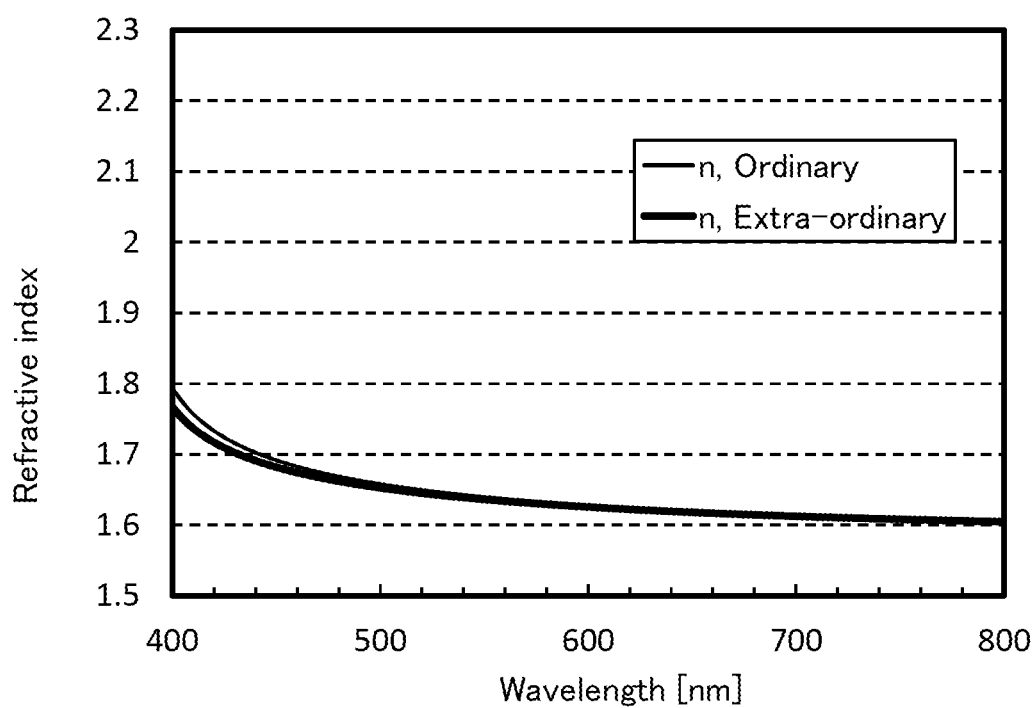
FIG. 22 shows measurement data of the refractive index of mmtBuBimmtBuPAF.
Figure 23:
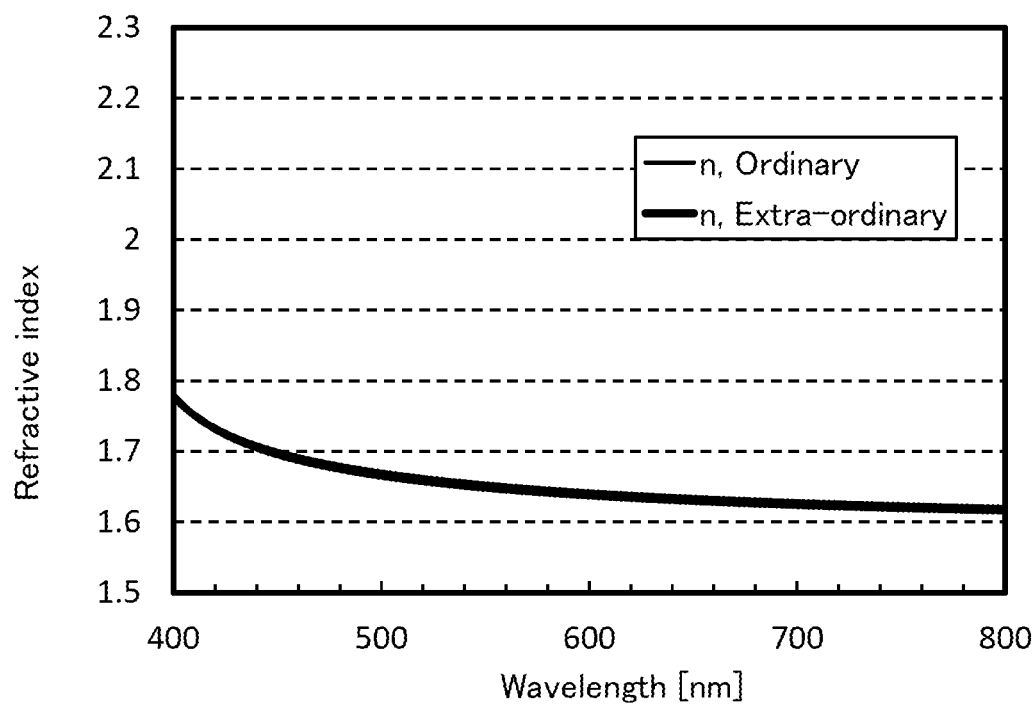
FIG. 23 shows measurement data of the refractive index of dchPAPrF.
Figure 24:
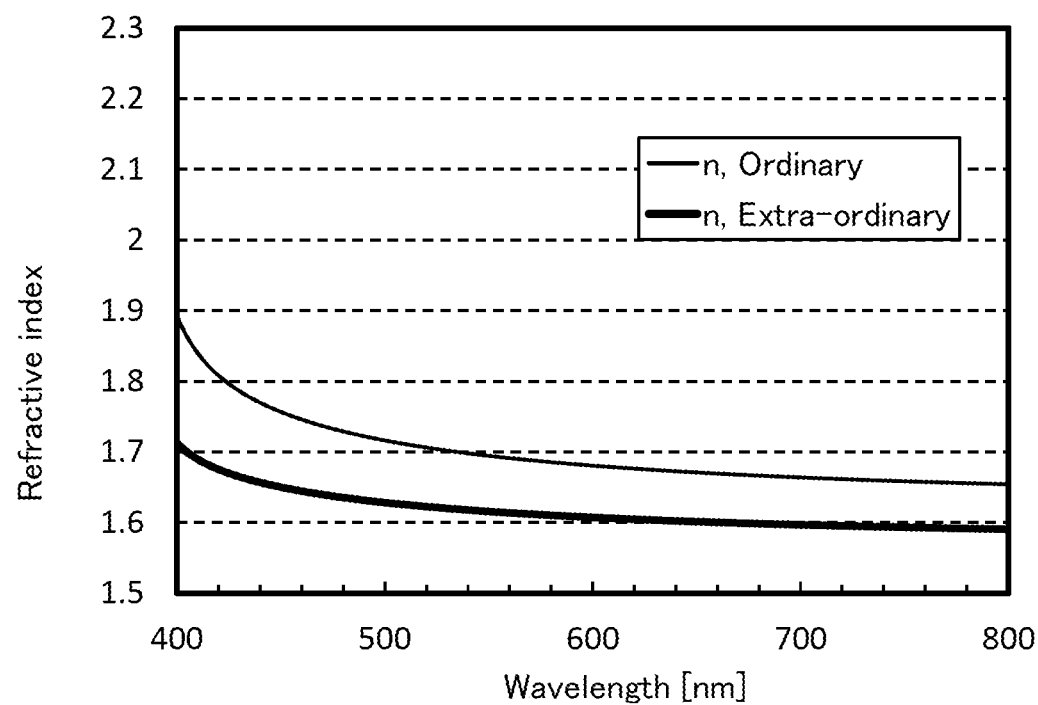
FIG. 24 shows measurement data of the refractive index of mmchBichPAF.
Figure 25:
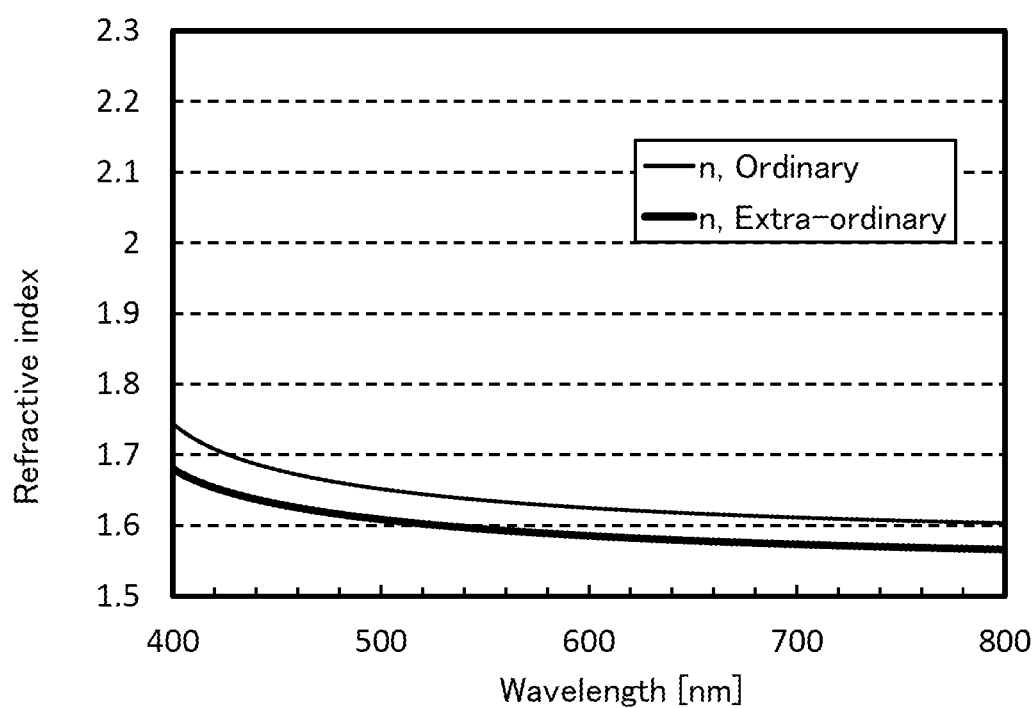
FIG. 25 shows measurement data of the refractive index of mmtBumTPchPAF.
Figure 26:
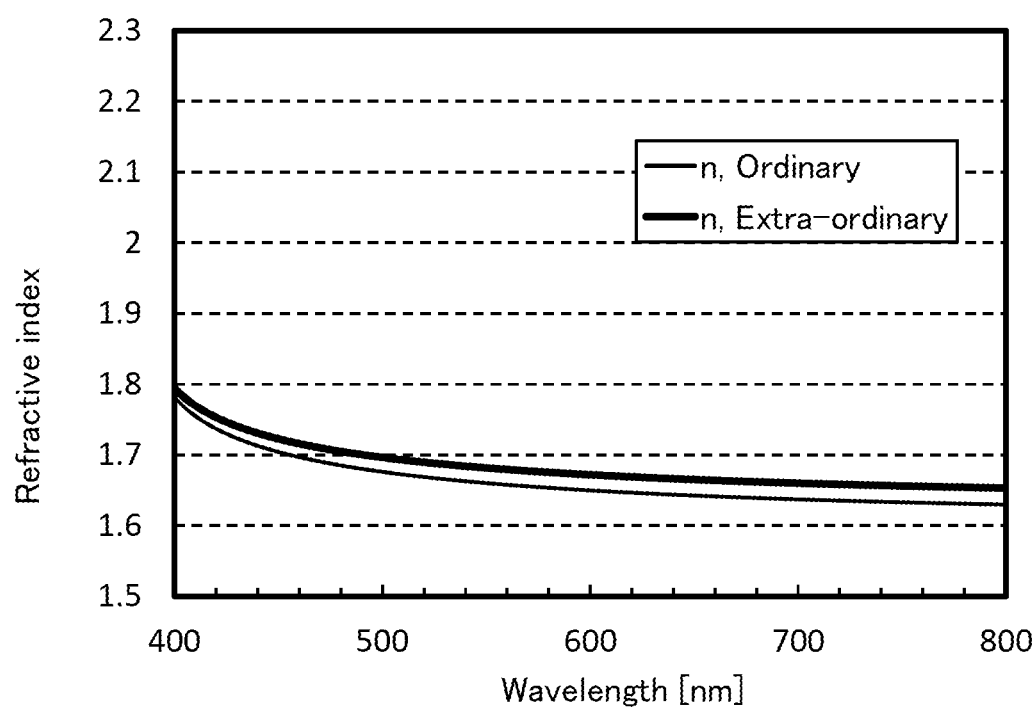
FIG. 26 shows measurement data of the refractive index of CdoPchPAF.

FIGS. 14A to 14C illustrate a foldable portable information terminal 9310. FIG. 14A illustrates the portable information terminal 9310 that is opened. FIG. 14B illustrates the portable information terminal 9310 that is being opened or being folded. FIG. 14C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Example 1

Synthesis Example

In this example, a method of synthesizing the hole-transport material with a low refractive index described in Embodiment 2 is described.

First, a method of synthesizing N,N'-bis(4-cyclohexylphenyl)-9,9,-dimethyl-9H-fluoren-2-amine (abbreviation: dchPAF) is described in detail. A structure of dchPAF is shown below.

[Chemical Formula 10]

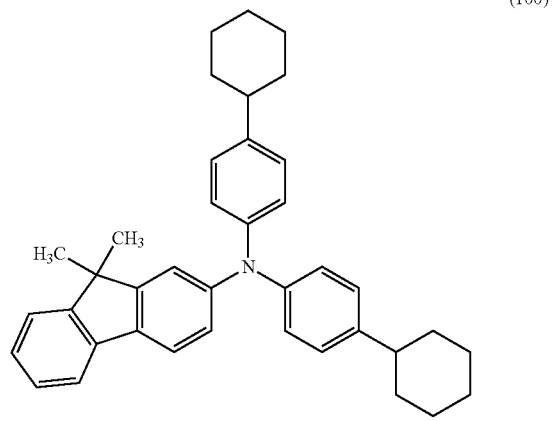

(100)

Step 1: Synthesis of N,N-bis(4-cyclohexylphenyl)-9,9,-dimethyl-9H-fluoren-2-amine (abbreviation: dchPAF)

In a three-neck flask were put 10.6 g (51 mmol) of 9,9-dimethyl-9H-fluoren-2-amine, 18.2 g (76 mmol) of 4-cyclohexyl-1-bromobenzene, 21.9 g (228 mmol) of sodium-tert-butoxide, and 255 mL of xylene. This mixture was degassed under reduced pressure, and then the air in the flask was replaced with nitrogen. The mixture was stirred while being heated to approximately 50° C. Then, 370 mg (1.0 mmol) of allylpalladium(II) chloride dimer (abbreviation: [(Allyl)PdCl]$_2$) and 1660 mg (4.0 mmol) of di-tert-butyl(1-methyl-2,2-diphenylcyclopropyl)phosphine (abbreviation: cBRIDP (registered trademark)) were added, and the mixture was heated at 120° C. for approximately 5 hours. After that, the temperature of the flask was lowered to approximately 60° C., and approximately 4 mL of water was added to the mixture, so that a solid was precipitated. The precipitated solid was separated by filtration. The filtrate was concentrated, and the obtained solution was purified by silica gel column chromatography. The obtained solution was concentrated to give a concentrated toluene solution. The toluene solution was dropped into ethanol for reprecipitation. The precipitate was collected by filtration at approximately 10° C. and the obtained solid was dried at approximately 80° C. under reduced pressure, whereby 10.1 g of a target white solid was obtained in a yield of 40%. The synthesis scheme of dchPAF in Step 1 is shown below.

[Chemical Formula 11]

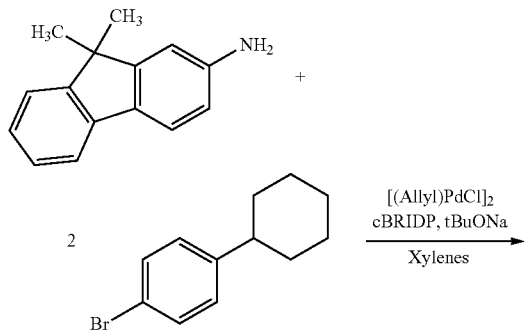

Analysis results by nuclear magnetic resonance spectroscopy ($^1$H-NMR) of the white solid obtained in Step 1 are shown below. The results show that dchPAF was synthesized in this synthesis example.

$^1$H-NMR. δ (CDCl$_3$): 7.60 (d, 1H, J=7.5 Hz), 7.53 (d, 1H, J=8.0 Hz), 7.37 (d, 2H, J=7.5 Hz), 7.29 (td, 1H, J=7.5 Hz, 1.0 Hz), 7.23 (td, 1H, J=7.5 Hz, 1.0 Hz), 7.19 (d, 1H, J=1.5 Hz), 7.06 (m, 8H), 6.97 (dd, 1H, J=8.0 Hz, 1.5 Hz), 2.41-2.51 (brm, 2H), 1.79-1.95 (m, 8H), 1.70-1.77 (m, 2H), 1.33-1.45 (brm, 14H), 1.19-1.30 (brm, 2H).

Similarly, the organic compounds represented by Structural Formulae (101) to (111) were synthesized.

[Chemical Formulae 12]

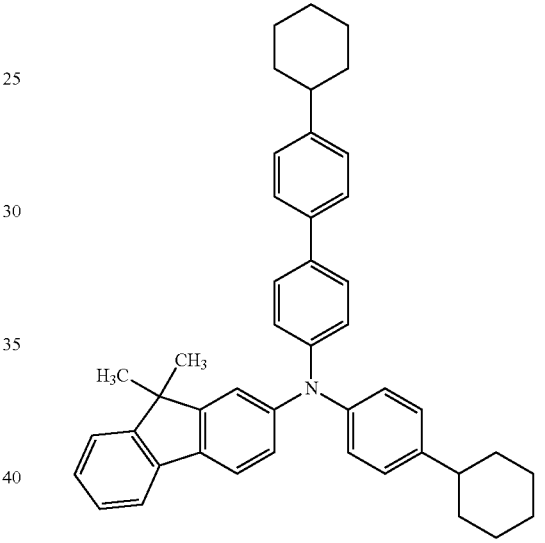

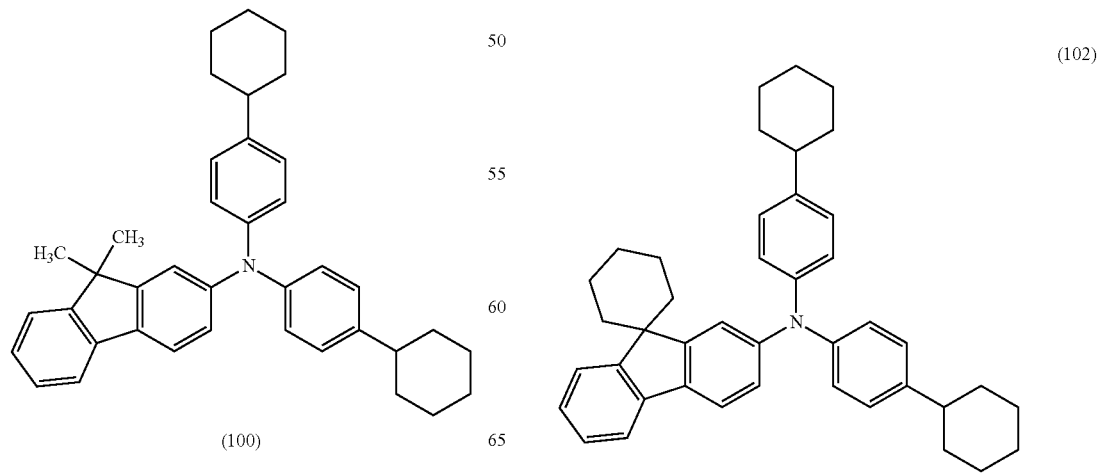

(103) 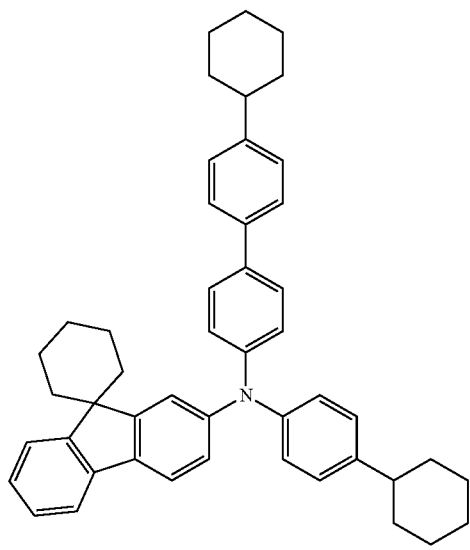
(104) 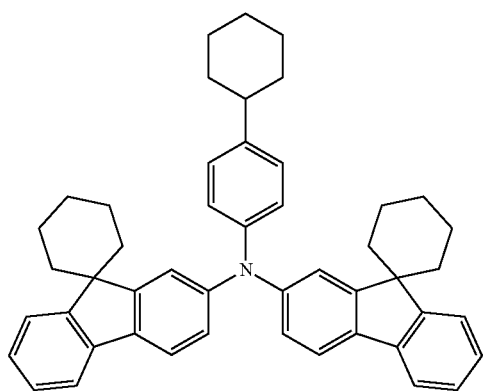
(105) 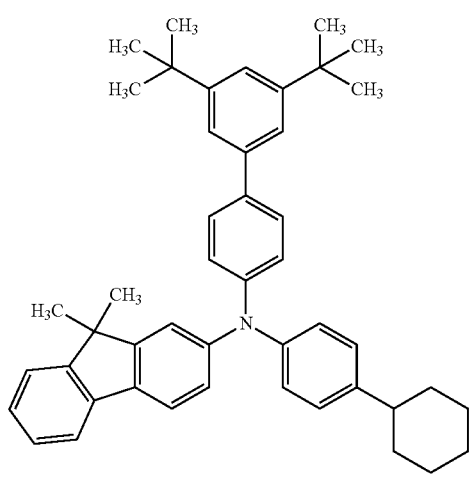
(106) 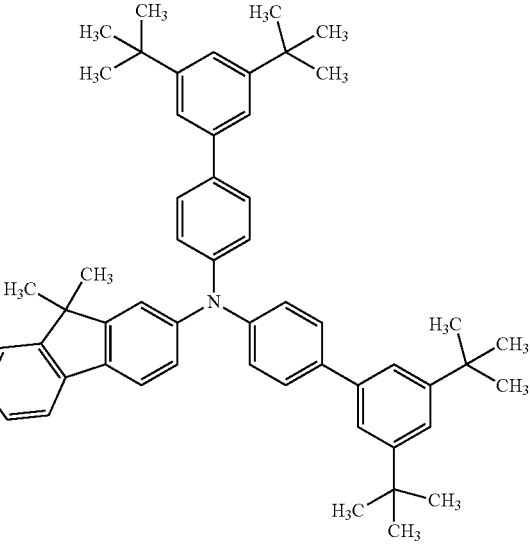
(107) 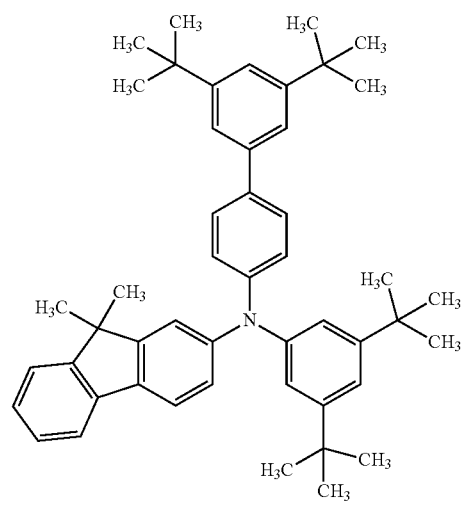
[Chemical Formulae 13]
(108) 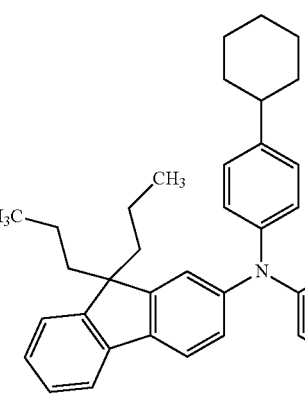

-continued

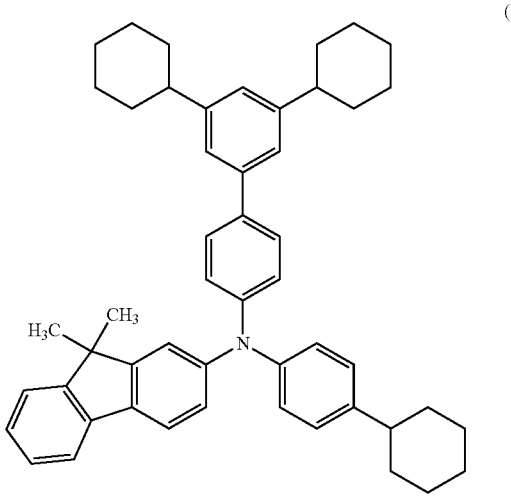

(109)

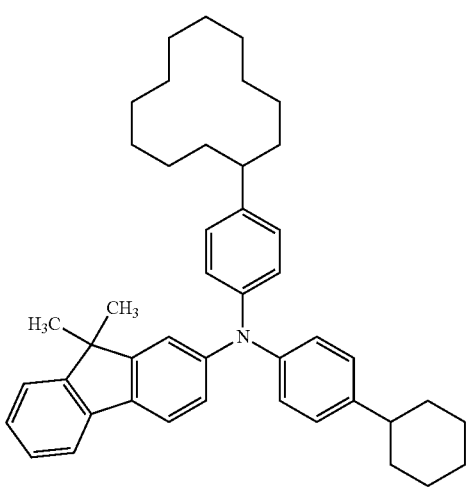

(110)

(111)

Analysis results by nuclear magnetic resonance spectroscopy ($^1$H-NMR) of the above organic compound are shown below.

Structural Formula (101): N-[(4'-cyclohexyl)-1,1'-biphenyl-4yl]-N-(4-cyclohexylphenyl)-9,9-dimethyl-9H-fluoren-2-amine (abbreviation: chBichPAF)

$^1$H-NMR. δ (CDCl$_3$): 7.63 (d, 1H, J=7.5 Hz), 7.57 (d, 1H, J=7.5 Hz), 7.51 (d, 2H, J=8.0 Hz), 7.46 (d, 2H, J=7.5 Hz), 7.38 (d, 1H, J=7.5 Hz), 7.30 (td, 1H, J=7.0 Hz, 1.5 Hz), 7.20-7.28 (m, 6H), 7.01-7.18 (m, 7H), 2.43-2.57 (brm, 2H), 1.81-1.96 (m, 8H), 1.71-1.79 (brm, 2H), 1.34-1.50 (brm, 14H), 1.20-1.32 (brm, 2H).

Structural Formula (102): N,N'-bis(4-cyclohexylphenyl)-N-(spiro[cyclohexane-1,9'-[9H]fluoren]-2'yl)amine (abbreviation: dchPASchF)

$^1$H-NMR. δ (CDCl$_3$):7.63 (d, 1H, J=7.5 Hz), 7.57 (d, 1H, J=7.5 Hz), 7.51 (d, 2H, J=8.0 Hz), 7.46 (d, 2H, J=7.5 Hz), 7.38 (d, 1H, J=7.5 Hz), 7.30 (td, 1H, J=7.0 Hz, 1.5 Hz), 7.20-7.28 (m, 6H), 7.01-7.18 (m, 7H), 2.43-2.57 (brm, 2H), 1.81-1.96 (m, 8H), 1.71-1.79 (brm, 2H), 1.34-1.50 (brm, 14H), 1.20-1.32 (brm, 2H).

Structural Formula (103): N-[(4'-cyclohexyl)-1,1'-biphenyl-4-yl]-N-(4-cyclohexylphenyl)-N-(spiro[cyclohexane-1,9'-[9H]fluoren]-2'-yl)amine (abbreviation: chBichPASchF)

$^1$H-NMR. δ (CDCl$_3$): 7.65 (d, 2H, J=8.0 Hz), 7.58 (d, 1H, J=8.0 Hz), 7.51 (d, 2H, J=8.5 Hz), 7.46 (m, 2H), 7.39 (d, 1H, 1.5 Hz), 7.32 (t, 1H, J=8.0 Hz), 7.21-7.38 (m, 3H), 7.14-7.18 (m, 2H), 7.08-7.14 (m, 4H), 7.06 (dd, 1H, J=8.0 Hz, 1.5 Hz), 2.43-2.57 (brm, 2H), 1.80-1.97 (m, 10H), 1.64-1.80 (m, 9H), 1.56-1.64 (m, 1H), 1.34-1.53 (m, 8H), 1.20-1.32 (brm, 2H)

Structural Formula (104): N-(4-cyclohexylphenyl)-bis(spiro[cyclohexane-1,9'-[9H]fluoren]-2'-yl)amine (abbreviation: SchFB1chP)

$^1$H-NMR. δ (CDCl$_3$): 7.64 (t, 4H, J=8.0 Hz), 7.59 (d, 2H, J=8.5 Hz), 7.39 (brs, 2H), 7.33 (t, 2H, J=7.5 Hz), 7.20-7.25 (m, 2H), 7.12 (brs, 4H), 7.08 (d, 2H, J=8.0 Hz), 2.44-2.52 (brm, 1H), 1.63-1.97 (m, 23H), 1.50-1.61 (m, 2H), 1.34-1.48 (m, 4H), 1.20-1.32 (brm, 1H).

Structural Formula (105): N-[(3',5'-ditertiarybutyl)-1,1'-biphenyl-4-yl]-N-(4-cyclohexylphenyl)-9,9-dimethyl-9H-fluoren-2-amine (abbreviation: mmt-BuBichPAF)

$^1$H-NMR. δ (CDCl$_3$): 7.63 (d, 1H, J=7.5 Hz), 7.57 (d, 1H, J=8.0 Hz), 7.44-7.49 (m, 2H), 7.37-7.42 (m, 4H), 7.31 (td, 1H, J=7.5 Hz, 2.0 Hz), 7.23-7.27 (m, 2H), 7.15-7.19 (m, 2H), 7.08-7.14 (m, 4H), 7.05 (dd, 1H, J=8.0 Hz, 2.0 Hz), 2.43-2.53 (brm, 1H), 1.81-1.96 (m, 4H), 1.75 (d, 1H, J=12.5 Hz), 1.32-1.48 (m, 28H), 1.20-1.31 (brm, 1H).

Structural Formula (106): N,N-bis(3',5'-ditertiarybutyl-1,1'-biphenyl-4-yl)-9,9,-dimethyl-9H-fluoren-2-amine (abbreviation: dmmtBuBiAF)

$^1$H-NMR. δ (CDCl$_3$): 7.66 (d, 1H, J=7.5 Hz), 7.62 (d, 1H, J=8.0 Hz), 7.51 (d, 4H, J=8.5 Hz), 7.38-7.44 (m, 7H), 7.26-7.35 (m, 3H), 7.20-7.25 (m, 4H), 7.13 (dd, 1H, J=8.0 Hz, 1.5 Hz), 1.45 (s, 6H), 1.39 (s, 36H).

Structural Formula (107): N-(3,5-ditertiarybutylphenyl)-N-(3',5',-ditertiarybutyl-1,1'-biphenyl-4-yl)-9,9,-dimethyl-9H-fluoren-2-amine (abbreviation: mmtBuBimmtBuPAF)

$^1$H-NMR. δ (CDCl$_3$): 7.64 (d, 1H, J=7.5 Hz), 7.57 (d, 1H, J=8.0 Hz), 7.48 (d, 2H, J=8.0 Hz), 7.43 (m, 2H), 7.39 (m, 2H), 7.31 (td, 1H, J=6.0 Hz, 1.5 Hz), 7.15-7.25 (m, 4H), 6.97-7.02 (m, 4H), 1.42 (s, 6H), 1.38 (s, 18H), 1.25 (s, 18H).

Structural Formula (108): N,N'-bis(4-cyclohexylphenyl)-9,9-dipropyl-9H-fluoren-2-amine (abbreviation: dchPAPrF)

$^1$H-NMR. δ (CDCl$_3$): 7.58 (m, 1H), 7.51 (d, 1H, J=8.0 Hz), 7.28 (t, 2H, J=7.5 Hz), 7.19-7.24 (m, 1H), 7.11 (d, 1H, J=1.5 Hz), 7.00-7.19 (m, 8H), 6.97 (dd, 1H, J=8.0 Hz, 1.5 Hz), 2.40-2.50 (brm, 2H), 1.70-1.94 (m, 14H), 1.33-1.46 (m, 8H), 1.18-1.30 (brm, 2H), 0.60-0.78 (m, 10H).

Structural Formula (109): N-[(3',5'-dicyclohexyl)-1,1'-biphenyl-4-yl]-N-(4-cyclohexylphenyl)-9,9-dimethyl-9H-fluoren-2-amine (abbreviation: mmchBichPAF)

$^1$H-NMR. δ (CDCl$_3$): 7.63 (d, 1H, J=7.5 Hz), 7.57 (d, 1H, J=8.5 Hz), 7.46 (d, 2H, J=8.5 Hz), 7.39 (d, 1H, J=7.5 Hz), 7.31 (td, 1H, J=7.5 Hz, 1.5 Hz), 7.21-7.28 (m, 4H), 7.07-7.18 (m, 6H), 7.02-7.06 (m, 1H), 7.01 (s, 1H), 2.44-2.57 (brm, 3H), 1.89-1.96 (m, 6H), 1.81-1.88 (m, 6H), 1.71-1.78 (m, 3H), 1.34-1.53 (m, 18H), 1.20-1.32 (m, 3H).

Structural Formula (110): N-(3,3",5,5"-tetra-t-butyl-1,1': 3',1"-terphenyl-5'-yl)-N-(4-cyclohexylphenyl)-9,9-dimethyl-9H-fluoren-2-amine (abbreviation: mmtBumTPchPAF)

$^1$H-NMR (300 MHz, CDCl$_3$): δ=7.63 (d, J=6.6 Hz, 1H), 7.58 (d, J=8.1 Hz, 1H), 7.42-7.37 (m, 4H), 7.36-7.09 (m, 14H), 2.55-2.39 (m, 1H), 1.98-1.20 (m, 51H).

Structural Formula (111): N-(4-cyclododecylphenyl)-N-(4-cyclohexylphenyl)-9,9-dimethyl-9H-fluoren-2-amine (abbreviation: CdoPchPAF)

$^1$H-NMR (300 MHz, CDCl$_3$): δ=7.61 (d, J=6.6 Hz, 1H), 7.53 (d, J=8.1 Hz, 1H), 7.37 (d, J=7.5 Hz, 1H), 7.33-7.17 (m, 3H), 7.12-6.95 (m, 9H), 2.77-2.66 (m, 1H), 2.52-2.39 (m, 1H), 1.96-1.26 (m, 37H).

FIG. 15 to FIG. 26 show the results of measuring the refractive indexes of the above twelve materials with the use of a spectroscopic ellipsometer (M-2000U, produced by J. A. Woollam Japan Corp.). FIG. 15, FIG. 16, FIG. 17, FIG. 18, FIG. 19, FIG. 20, FIG. 21, FIG. 22, FIG. 23, FIG. 24, FIG. 25, and FIG. 26 show data of the measured refractive indexes of dchPAF, chBichPAF, dchPASchF, chBichPASchF, SchFB1chP, mmtBuBichPAF, dmmtBuBiAF, mmtBuBimmtBuPAF, dchPAPrF, mmchBichPAF, mmtBumTPchPAF, and CdoPchPAF, respectively. For the measurement, a film having a thickness of approximately 50 nm, which was formed over a quartz substrate by a vacuum evaporation method with a material of each layer, was used. Note that a refractive index of an ordinary ray, n, Ordinary, and a refractive index of an extraordinary ray, n, Extra-ordinary are shown in FIG. 15 to FIG. 26.

As described above, these organic compounds are confirmed to be the materials with a low refractive index.

Example 2

This example shows the calculation results of the simulation of the amount of light reaching a color conversion layer in a light-emitting apparatus 1 of one embodiment of the present invention in which the refractive index of a hole-transport layer is low and the amount of light reaching a color conversion layer in a comparative light-emitting apparatus 1 in which the refractive index of a hole-transport layer is normal.

Figure 27:
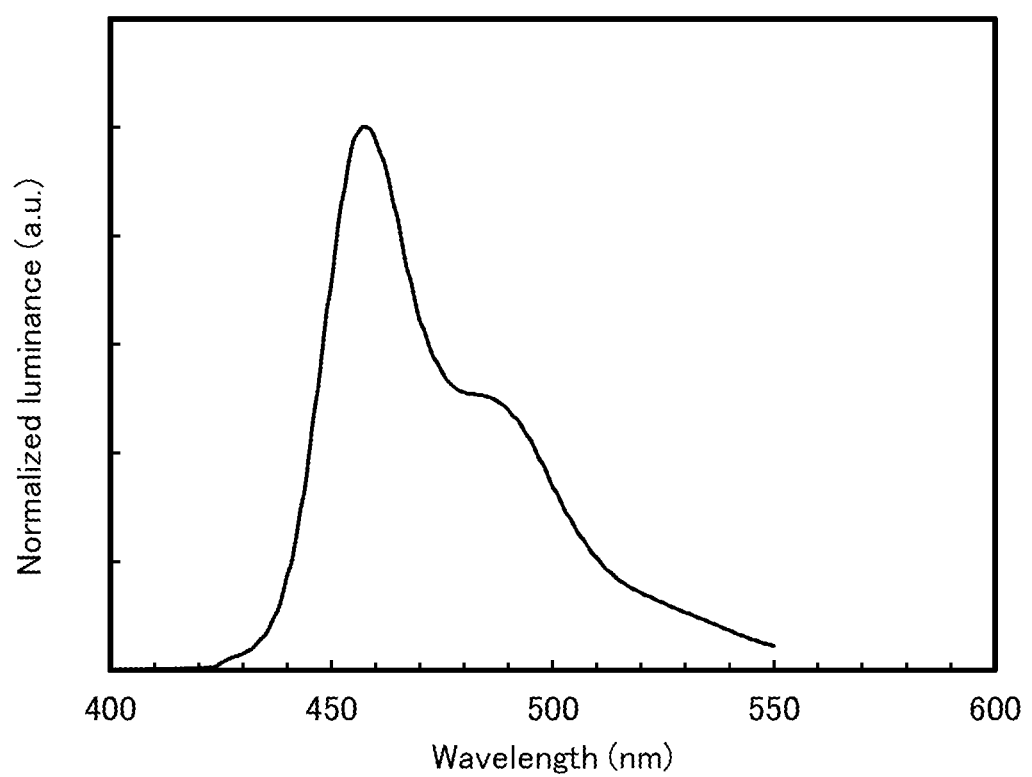
FIG. 27 shows an emission spectrum used for calculation.

The calculation was performed using an organic device simulator (semiconducting emissive thin film optics simulator, setfos: Cybernet Systems Co., Ltd.). A light-emitting region was fixed to the center of a light-emitting layer. As the refractive indexes of materials of the organic layers, the low refractive index and the normal refractive index were assumed to be 1.6 and 1.9, respectively. It is assumed that there is no wavelength dispersion. The thickness of each layer was optimized so that the blue index (BI) can be the maximum when the refractive index of the color conversion layer was 1. Note that light emission was made to have a spectrum shown in FIG. 27. The light-emitting device has a top emission structure in which light is extracted from the cathode side. The thickness of the hole-transport layer was adjusted such that the total optical path length between the reflective electrode on the anode side and the cathode was an integer multiple of λ/2. It is assumed that a QD was used for the color conversion layer and quenching due to the Purcell effect was taken into consideration for the calculation. The following table shows the stacked structures of the light-emitting apparatuses used for the calculation.

TABLE 1

| Device structure | Light-emitting apparatus 1 | | Comparative light-emitting apparatus 1 | |
|---|---|---|---|---|
| | Reflective index | Thickness (nm) | Reflective index | Thickness (nm) |
| Color conversion layer | Sweep | 1000 | Sweep | 1000 |
| Cap layer | 1.9 | 66.2 | 1.9 | 67.2 |
| Cathode (Ag:Mg) | * | 15 | * | 15 |
| Electron-transport layer | 1.9 | 35.9 | 1.9 | 37 |
| Light-emitting layer | 1.9 | 25 | 1.9 | 25 |
| Hole-transport layer | 1.6 | 150.4 | 1.9 | 124.5 |
| Transparent electrode (ITSO) | * | 10 | * | 10 |
| Anode (Ag) | * | 100 | * | 100 |

Note that the physical property values of the materials were used as the refractive indexes and extinction coefficients of Ag, ITSO, and Ag:Mg.

Figure 28:
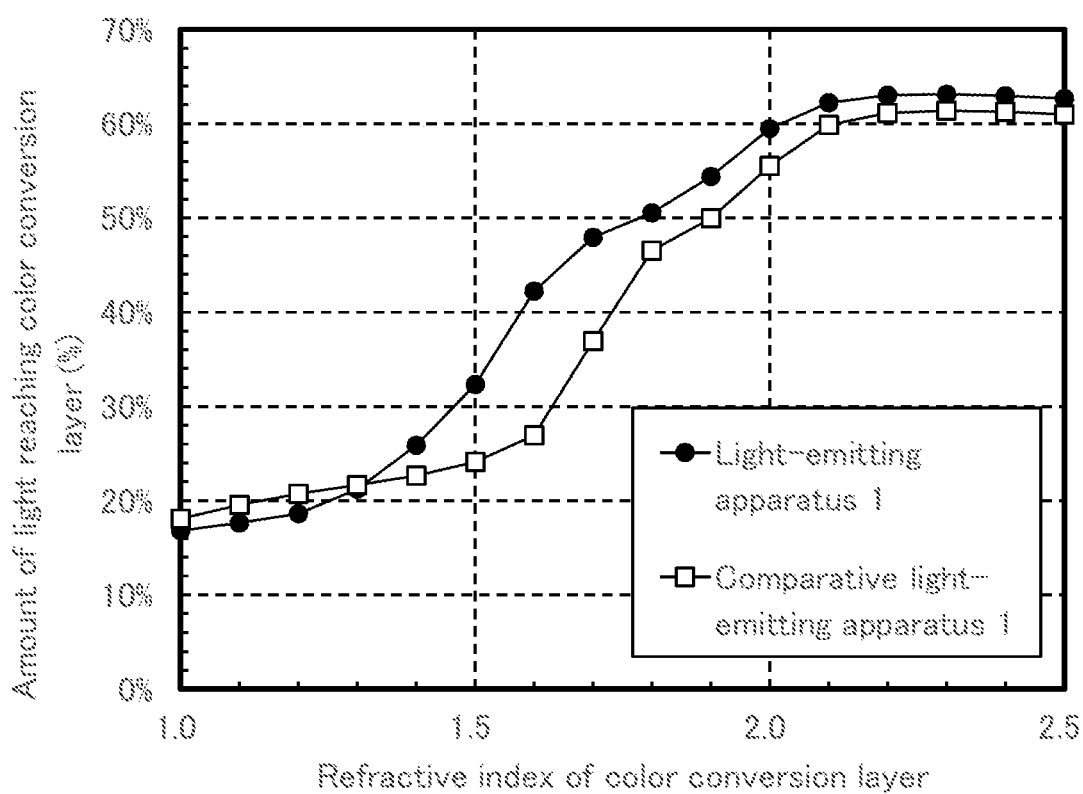
FIG. 28 shows calculation results of the relationship between the refractive index of a color conversion layer (a QD layer) and the amount of light reaching the color conversion layer.

Under the above conditions, a change in the amount of light reaching the color conversion layer while the refractive index of the color conversion layer was changed was calculated. The amount of light that entered the conversion layer was calculated from the total of the light extraction efficiency and guide mode in the color conversion layer in the device structure where no light is absorbed by the color conversion layer. FIG. 28 shows the results.

It is found from FIG. 28 that a reduction in the refractive index of the hole-transport layer increases the amount of light reaching the color conversion layer while the refractive index of the color conversion layer is within the practical range. The increase in the amount of light reaching the color conversion layer means an increase in excitation light reaching the color conversion layer, and more QDs can be excited.

This reference example shows a comparison between a light-emitting device that includes the low refractive index material described in the above embodiments and a light-emitting device that does not include the material. Structural formulae of organic compounds used in this reference example are shown below.

[Chemical Formulae 14]

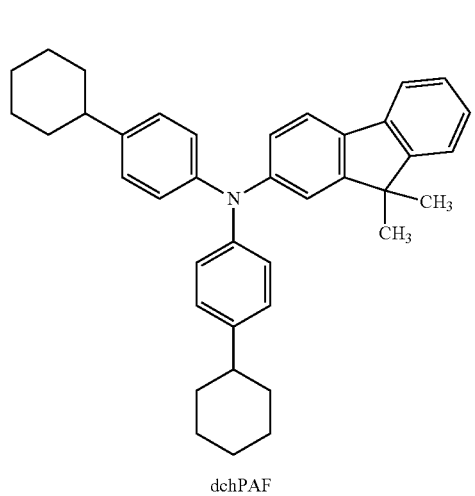

(i) dchPAF

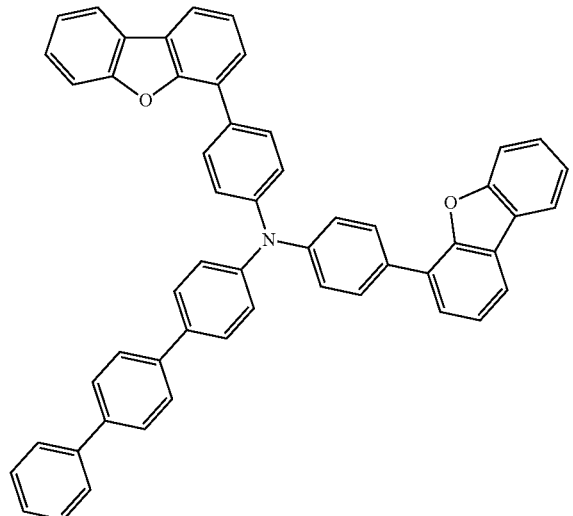

(ii) DBfBBITP

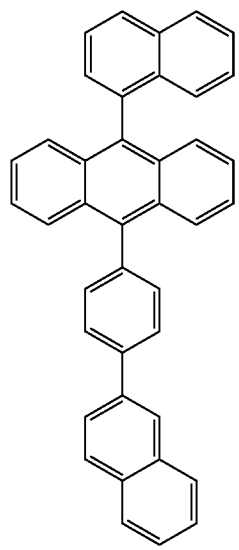

(iii) αN-βNPAnth (iv)
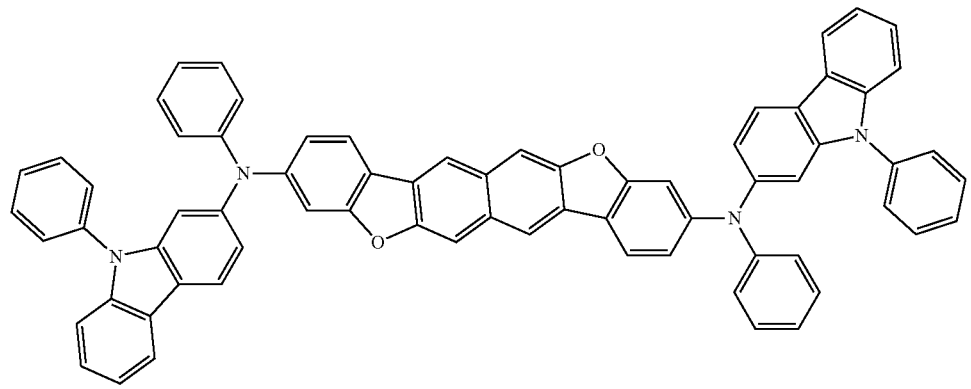
3,010PCA2Nbf(IV)-02
(v)
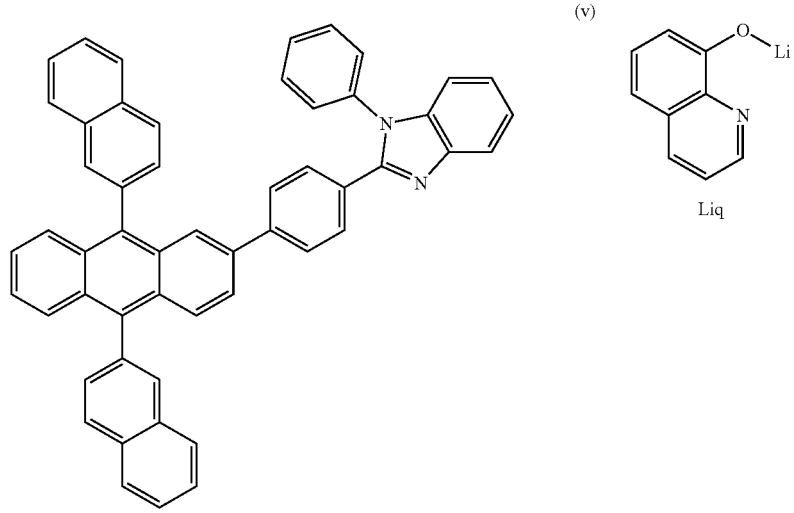
ZADN
(vi)
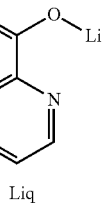
Liq
(vii)
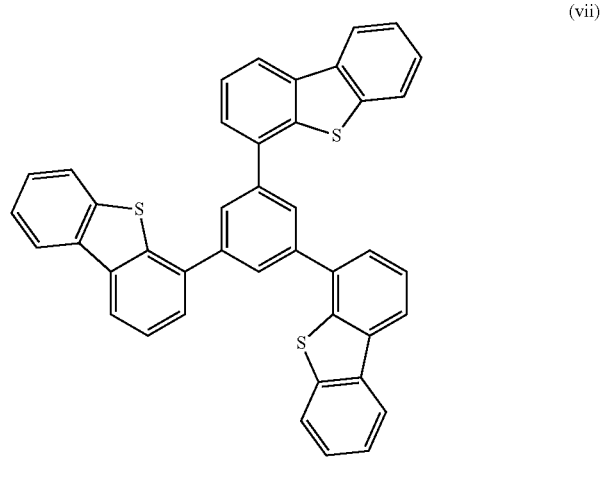
DBT3P-II
(viii)
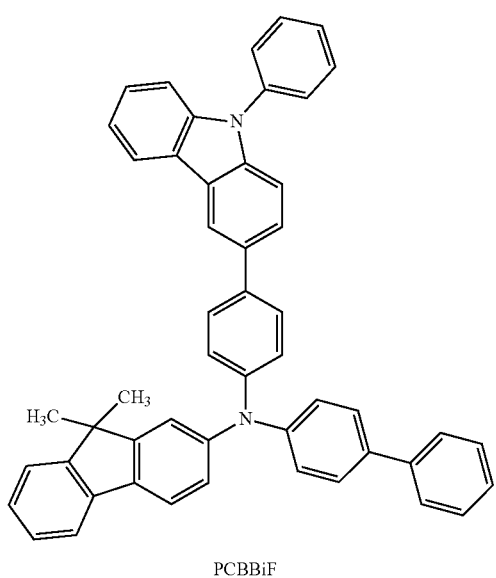
PCBBiF << Fabrication Method of Light-Emitting Device 1 >>

First, a film of silver (Ag) was formed as a reflective electrode over a glass substrate to a thickness of 100 nm by a sputtering method, and then, indium tin oxide containing silicon oxide (ITSO) was formed as a transparent electrode to a thickness of 10 nm by a sputtering method, whereby the first electrode 101 was formed. The electrode area was 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation apparatus such that the surface on which the first electrode 101 was formed faced downward. Then, N,N'-bis(4-cyclohexylphenyl)-9,9,-dimethyl-9H-fluoren-2-amine (abbreviation: dchPAF) represented by Structural Formula (i) and an electron acceptor material (OCHD-001) were deposited to a thickness of 10 nm by co-evaporation over the first electrode 101 using a resistance-heating method such that the weight ratio of dchPAF to OCHD-001 was 1:0.05, whereby the hole-injection layer 111 was formed.

Over the hole-injection layer 111, dchPAF was deposited by evaporation to a thickness of 125 nm to form the hole-transport layer 112.

Subsequently, over the hole-injection layer 112, N,N'-bis[4-(dibenzofuran-4-yl)phenyl]-4-amino-p-terphenyl (abbreviation: DBfBB1TP) represented by Structural Formula (ii) was deposited to a thickness of 10 nm by evaporation, whereby an electron-blocking layer was formed.

Then, 9-(1-naphthyl)-10-[4-(2-naphthyl)phenyl]anthracene (abbreviation: αN-βNPAnth) represented by Structural Formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) were deposited to a thickness of 25 nm by co-evaporation such that the weight ratio of αN-βNPAnth to 3,10PCA2Nbf(IV)-02 was 1:0.015, whereby the light-emitting layer 113 was formed.

Then, 2-{4-[9,10-di(2-naphthyl)-2-anthryl]phenyl}-1-phenyl-1H-benzoimidazole (abbreviation: ZADN) represented by Structural Formula (v) and 8-quinolinolato-lithium (abbreviation: Liq) represented by Structural Formula (vi) was deposited to a thickness of 30 nm by co-evaporation such that the weight ratio of ZADN to Liq was 1:1, whereby the electron-transport layer 114 was formed.

After the electron-transport layer 114 was formed, LiF was deposited to a thickness of 1 nm by evaporation to form the electron-injection layer 115, and lastly silver (Ag) and magnesium (Mg) were deposited to a thickness of 15 nm by co-evaporation such that the volume ratio of Ag to Mg was 10:1 to form the second electrode 102, whereby the light-emitting device 1 was fabricated. The second electrode 102 is a transflective electrode having a function of reflecting light and a function of transmitting light; thus, this light-emitting device is a top emission device in which light is extracted through the second electrode 102. Over the second electrode 102, 1,3,5-tri(dibenzothiophen-4-yl)-benzene (abbreviation: DBT3P-II) represented by Structural Formula (vii) was deposited to a thickness of 70 nm by evaporation so that extraction efficiency can be improved.

<< Fabrication Method of Light-Emitting Device 2 >>

The light-emitting device 2 was fabricated in a manner similar to that for the light-emitting device 1 except that dchPAF used in the hole-injection layer and the hole-transport layer was replaced with N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (viii) and the thickness of the hole-transport layer was 110 nm.

The device structures of the light-emitting devices 1 and 2 are listed in the following table.

TABLE 2

|  |  | Light-emitting device 1 | Light-emitting device 2 |
|---|---|---|---|
| Electron-injection layer | 1 nm | Liq | |
| Electron-transport layer | 30 nm | ZADN:Liq (1:1) | |
| Light-emitting layer | 25 nm | αN-βNP Anth:3,10PCA2Nbf(IV)-02 (1:0.015) | |
| Electron-blocking layer | 10 nm | DBfBB1TP | |
| Hole-transport layer | *1 | dchPAF | PCBBIF |
| Hole-injection layer | 10 nm | dchPAF:ALD-MP001Q (1:0.05) | PCBBiFALD-MP001Q (1.0.05) |

*1 Light-emitting device 1: 125 nm, Light-emitting device 2: 110 nm

Figure 35:
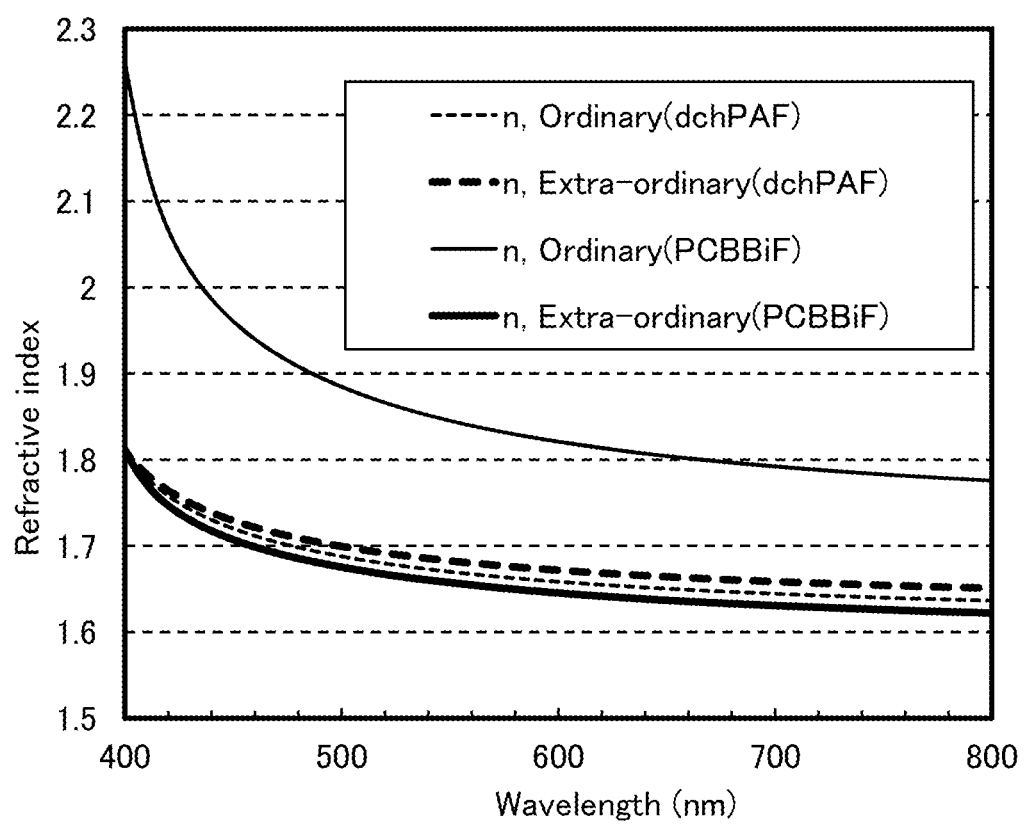
FIG. 35 shows the refractive indexes of dchPAF and PCBBiF.

Note that dchPAF has a refractive index lower than or equal to 1.75 for 467-nm wavelength light and the other organic compounds have a refractive index higher than 1.75 for 467-nm wavelength light. FIG. 35 shows the results of measuring the refractive indexes of dchPAF and PCBBiF.

In the case where the material has an anisotropy, the ordinary refractive index and the extraordinary refractive index are different from each other in some cases. When a thin film to be measured is in such a state, anisotropy analysis can be performed to separately calculate the ordinary refractive index and the extraordinary refractive index. In this specification, when the measured material has both the ordinary refractive index and the extraordinary refractive index, the ordinary refractive index is used as an indicator.

The light-emitting devices were sealed using a glass substrate in a glove box containing a nitrogen atmosphere so as not to be exposed to the air. Specifically, a UV curable sealing material was applied to surround the elements, only the UV curable sealing material was irradiated with UV while the light-emitting devices were prevented from being irradiated with the UV, and heat treatment was performed at 80° C. under an atmospheric pressure for one hour. Then, the initial characteristics of the light-emitting devices were measured.

Figure 29:
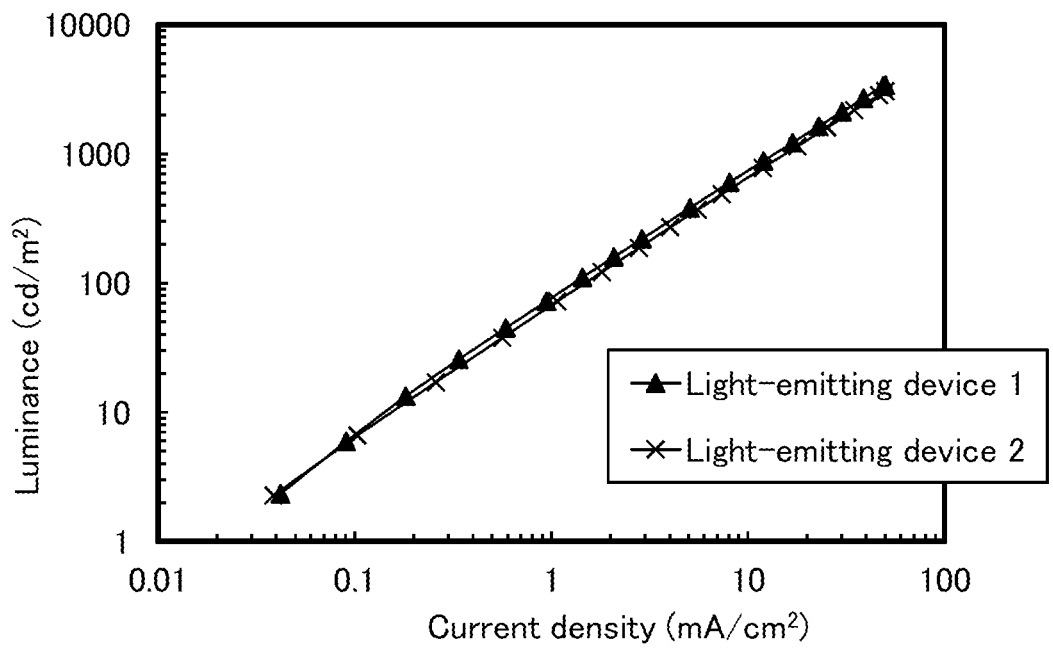
FIG. 29 shows the luminance-current density characteristics of light-emitting devices 1 and 2.
Figure 30:
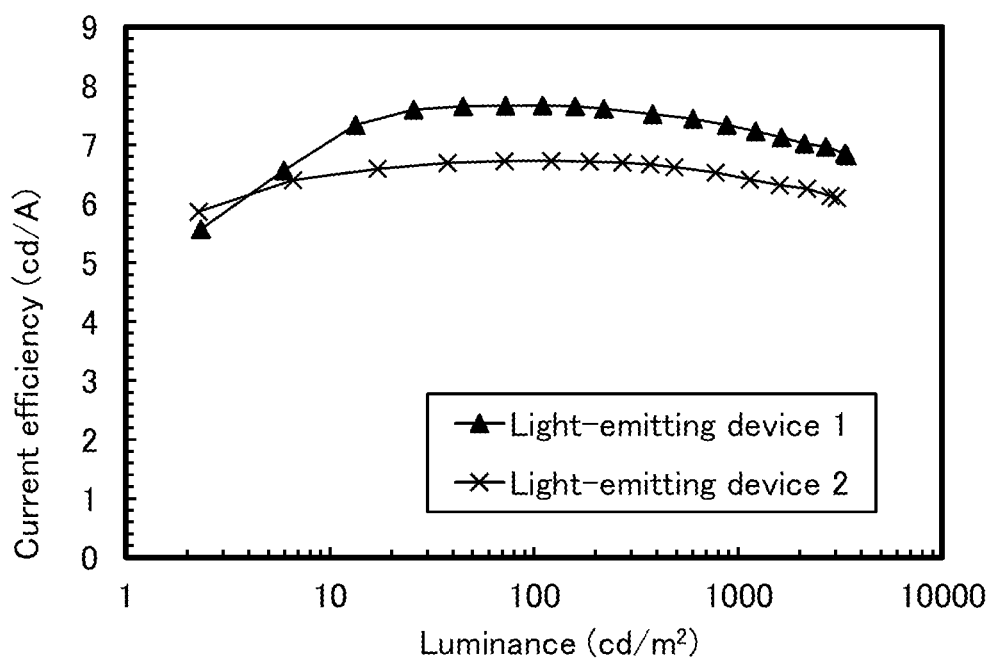
FIG. 30 shows the current efficiency-luminance characteristics of the light-emitting devices 1 and 2.
Figure 31:
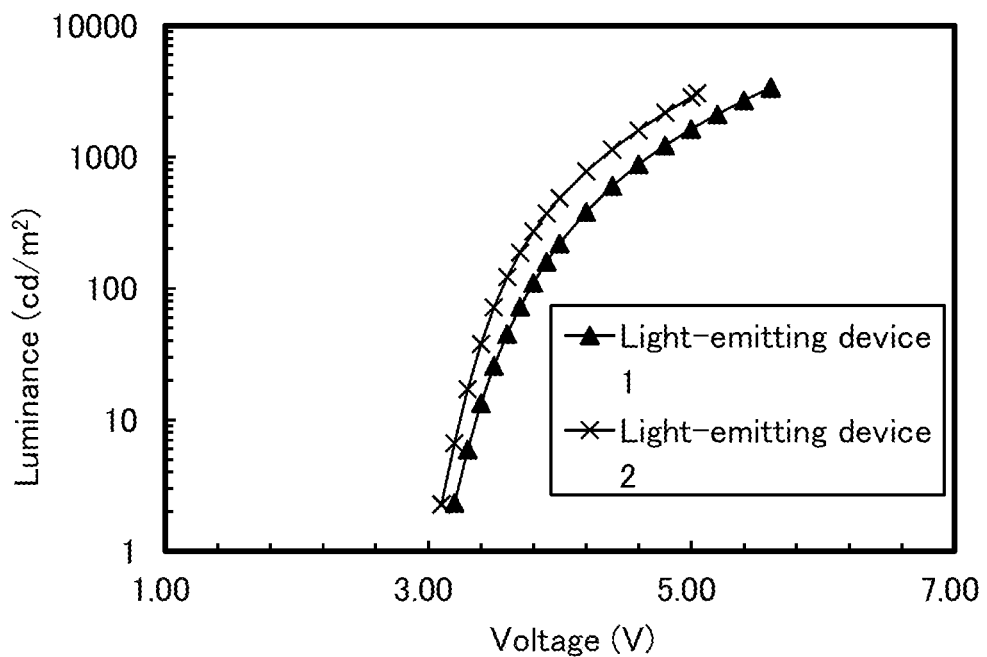
FIG. 31 shows the luminance-voltage characteristics of the light-emitting devices 1 and 2.
Figure 32:
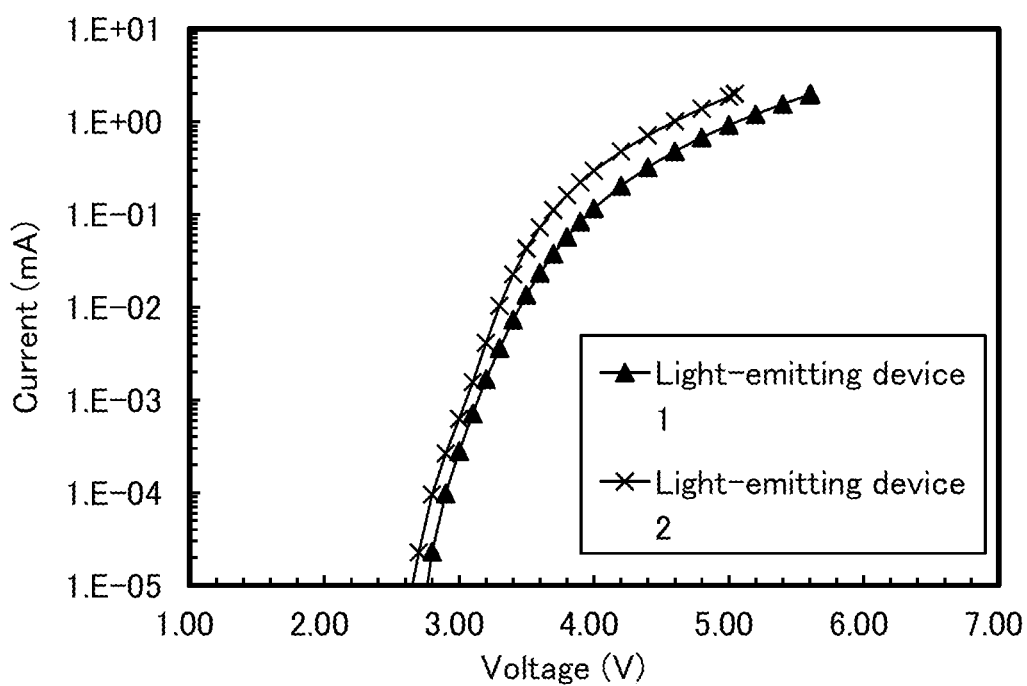
FIG. 32 shows the current-voltage characteristics of the light-emitting devices 1 and 2.
Figure 33:
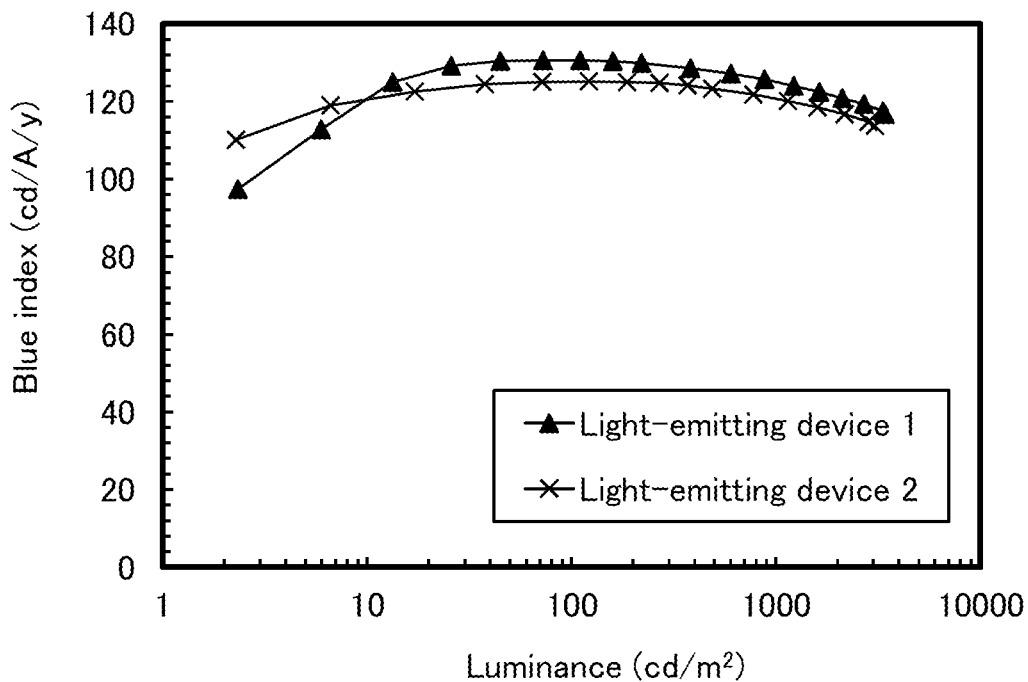
FIG. 33 shows the blue index-luminance characteristics of the light-emitting devices 1 and 2.
Figure 34:
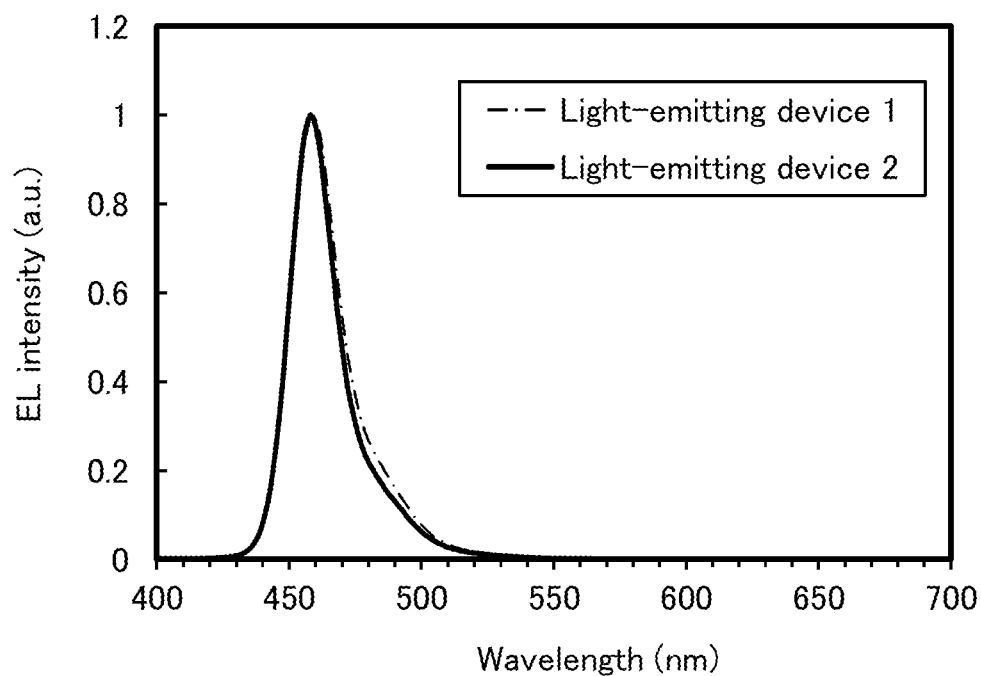
FIG. 34 shows the emission spectra of the light-emitting devices 1 and 2.

FIG. 29 shows the luminance-current density characteristics of the light-emitting devices 1 and 2. FIG. 30 shows the current efficiency-luminance characteristics thereof. FIG. 31 shows the luminance-voltage characteristics thereof. FIG. 32 shows the current-voltage characteristics thereof. FIG. 33 shows the blue index-luminance characteristics thereof. FIG. 34 shows the emission spectra thereof. Table 3 shows the main characteristics of the light-emitting devices 1 and 2 at a luminance of about 1000 cd/m². Luminance, CIE chromaticity, and emission spectra were measured at normal temperature with a spectroradiometer (SR-UL1R manufactured by TOPCON TECHNOHOUSE CORPORATION).

TABLE 3

|  | Voltage (V) | Current (mA) | Current density (mA/cm$^2$) | Chromaticity (x, y) | Current efficiency (cd/A) | BI (cd/A/y) |
| --- | --- | --- | --- | --- | --- | --- |
| Light-emitting device 1 | 4.6 | 0.48 | 12.0 | (0.138, 0.058) | 7.3 | 126 |
| Light-emitting device 2 | 4.4 | 0.71 | 17.8 | (0.140, 0.053) | 6.4 | 120 |

FIGS. 29 to 34 and Table 3 show that the light-emitting device 1 including the material with a refractive index lower than or equal to 1.75 in the blue light-emitting region has higher current efficiency and a more favorable blue index than the light-emitting device 2. By combining such a light-emitting device with a color conversion layer, a light-emitting apparatus with high efficiency can be obtained.

This application is based on Japanese Patent Application Serial No. 2019-203031 filed with Japan Patent Office on Nov. 8, 2019, the entire contents of which are hereby incorporated by reference.

What is claimed is:

1. A light-emitting apparatus comprising:
a first light-emitting device;
a second light-emitting device; and
a third light-emitting device,
wherein each of the first light-emitting device, the second light-emitting device and the third light-emitting device comprises a first electrode, a light-emitting layer over the first electrode, a first layer over the light-emitting layer, and a second electrode over the first layer,
wherein the first light-emitting device further comprises:
a first color conversion layer over the second electrode; and
a first coloring layer over the first color conversion layer,
wherein the second light-emitting device further comprises:
a second color conversion layer over the second electrode; and
a second coloring layer over the second color conversion layer,
wherein the third light-emitting device further comprises:
a third coloring layer over the second electrode,
wherein a light emitted from the light-emitting layer is incident on the third coloring layer without color conversion in the third light-emitting device,
wherein the second electrode has a light-transmitting property, and
wherein the first layer comprises a first material with a refractive index lower than or equal to 1.75 at 467 nm.

2. The light-emitting apparatus according to claim 1, wherein the third coloring layer has a structure to scatter light.

3. The light-emitting apparatus according to claim 1, wherein a light emitted from the third light-emitting device is blue.

4. The light-emitting apparatus according to claim 1, wherein the first layer is in contact with the second electrode.

5. The light-emitting apparatus according to claim 1, wherein the first material is a mixed material of a first organic compound and an inorganic compound,
wherein the first organic compound has an electron-transport property, and
wherein the inorganic compound is one of a fluoride of an alkali metal and a fluoride of an alkaline earth metal.

6. The light-emitting apparatus according to claim 5,
wherein the inorganic compound is an alkali metal fluoride, and
wherein a concentration of the inorganic compound in the first material is higher than or equal to 50 vol % and lower than 95 vol %.

7. The light-emitting apparatus according to claim 5, wherein a concentration of the inorganic compound in the first material is higher than or equal to 20 vol %.

8. The light-emitting apparatus according to claim 1,
wherein each of the first color conversion layer and the second color conversion layer comprises a first substance capable of emission by absorbing light, and
wherein the first substance is a quantum dot.

9. The light-emitting apparatus according to claim 1, wherein a light emitted from the first light-emitting device is red.

10. An electronic device comprising the light-emitting apparatus according to claim 1.

11. A lighting device comprising the light-emitting apparatus according to claim 1.

12. A light-emitting apparatus comprising:
a first light-emitting device;
a second light-emitting device; and
a third light-emitting device,
wherein each of the first light-emitting device, the second light-emitting device and the third light-emitting device comprises a first electrode, a first light-emitting layer over the first electrode, a charge-generation layer over the first light-emitting layer, a second light-emitting layer over the charge-generation layer, a first layer over the second light-emitting layer, and a second electrode over the first layer,
wherein the first light-emitting device further comprises:
a first color conversion layer over the second electrode; and
a first coloring layer over the first color conversion layer,
wherein the second light-emitting device further comprises:
a second color conversion layer over the second electrode; and
a second coloring layer over the second color conversion layer,
wherein the third light-emitting device further comprises:
a third coloring layer over the second electrode,
wherein a light emitted from the first light-emitting layer is incident on the third coloring layer without color conversion in the third light-emitting device,
wherein the second electrode has a light-transmitting property, and
wherein the first layer comprises a first material with a refractive index lower than or equal to 1.75 at 467 nm.

13. The light-emitting apparatus according to claim 12, wherein the third coloring layer has a structure to scatter light.

14. The light-emitting apparatus according to claim 12, wherein a light emitted from the third light-emitting device is blue.

15. The light-emitting apparatus according to claim 12, wherein the first layer is in contact with the second electrode.

16. The light-emitting apparatus according to claim 12,
wherein the first material is a mixed material of a first organic compound and an inorganic compound,
wherein the first organic compound has an electron-transport property, and
wherein the inorganic compound is one of a fluoride of an alkali metal and a fluoride of an alkaline earth metal.

17. The light-emitting apparatus according to claim 12,
wherein each of the first color conversion layer and the second color conversion layer comprises a first substance capable of emission by absorbing light, and
wherein the first substance is a quantum dot.

18. The light-emitting apparatus according to claim 12, wherein a light emitted from the first light-emitting device is red.

19. An electronic device comprising the light-emitting apparatus according to claim 12.

20. A lighting device comprising the light-emitting apparatus according to claim 12.

* * * * *